US008594605B2

(12) United States Patent
Katsube et al.

(10) Patent No.: US 8,594,605 B2
(45) Date of Patent: Nov. 26, 2013

(54) SEMICONDUCTOR INTEGRATED CIRCUIT AND OPERATION METHOD OF THE SAME

(75) Inventors: Yusaku Katsube, Yokohama (JP); Kosuke Tsuiji, Kanagawa (JP); Yutaka Igarashi, Yokohama (JP); Akio Yamamoto, Hiratsuka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/357,664

(22) Filed: Jan. 25, 2012

(65) Prior Publication Data
US 2012/0194265 A1 Aug. 2, 2012

(30) Foreign Application Priority Data
Jan. 28, 2011 (JP) ................................ 2011-016386

(51) Int. Cl.
*H04B 1/10* (2006.01)
*H04K 3/00* (2006.01)

(52) U.S. Cl.
USPC ............................ 455/307; 455/333; 327/552

(58) Field of Classification Search
USPC .................. 455/307, 333, 339; 327/552–553
See application file for complete search history.

(56) References Cited

U.S. PATENT DOCUMENTS 4,438,417 A * 3/1984 Yamashita et al. ............ 333/193
7,446,600 B2 11/2008 Kosai

FOREIGN PATENT DOCUMENTS

JP 2007-281604 A 10/2007

OTHER PUBLICATIONS

M. Konfal et al, "CMOS Analog Baseband Channel Filter for Direct a Conversion WCDMA Receiver", Proceedings 5th International Conference on ASIC, 2003, vol. 1, Oct. 21-24, 2003, pp. 577-580.
Kousai et al, "A 19.7MHz, Fifth-Order Active-RC Chebyshev LPF for Draft IEEE802.11n With Automatic Quality-Factor Tuning Scheme", IEEE Journal of Solid-State Circuits, vol. 42, No. 11, Nov. 2007, pp. 2326-2337.

* cited by examiner

*Primary Examiner* — Lee Nguyen
(74) *Attorney, Agent, or Firm* — Mattingly & Malur, PC

(57) ABSTRACT

The present invention is directed to accurately set a frequency characteristic of a filter integrated in a semiconductor integrated circuit. A semiconductor integrated circuit includes a filter circuit, a cutoff frequency calibration circuit, and a Q-factor calibration circuit. The cutoff frequency calibration circuit adjusts cutoff frequency of the filter circuit to a desired value by adjusting capacitance components of the filter circuit. After adjustment of the cutoff frequency of the filter circuit by the cutoff frequency calibration circuit, the Q-factor calibration circuit adjusts the Q factor of the filter circuit to a desired value by adjusting a resistance component of the filter circuit.

18 Claims, 21 Drawing Sheets

| Qcode | Q [dB] | SWR37 | SWR36 | SWR35 | SWR34 | SWR33 | SWR32 | SWR31 | R3 [Ohm] |
|---|---|---|---|---|---|---|---|---|---|
| 0 | 8 | 0 | 0 | 0 | 0 | 0 | 0 | 1 | 12559 |
| 1 | 9 | 0 | 0 | 0 | 0 | 0 | 1 | 0 | 14092 |
| 2 | 10 | 0 | 0 | 0 | 0 | 1 | 0 | 0 | 15811 |
| 3 | 11 | 0 | 0 | 0 | 1 | 0 | 0 | 0 | 17741 |
| 4 | 12 | 0 | 0 | 1 | 0 | 0 | 0 | 0 | 19905 |
| 5 | 13 | 0 | 1 | 0 | 0 | 0 | 0 | 0 | 22334 |
| 6 | 14 | 1 | 0 | 0 | 0 | 0 | 0 | 0 | 25059 |
| 7 | 15 | 0 | 0 | 0 | 0 | 0 | 0 | 0 | 28117 |

FIG. 9
| NAME OF RESISTOR | RESISTANCE VALUE [Ohm] |
|---|---|
| R31 | 12559 |
| R32 | 1533 |
| R33 | 1719 |
| R34 | 1930 |
| R35 | 2164 |
| R36 | 2429 |
| R37 | 2725 |
| R38 | 3058 |
FIG. 10
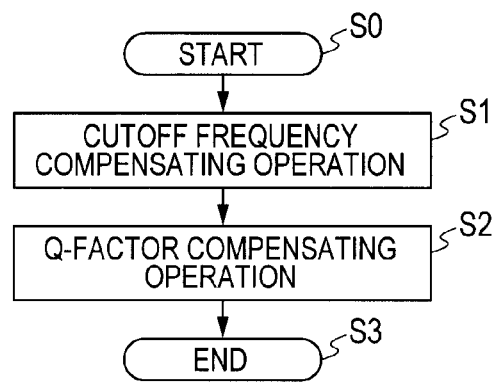
FIG. 11
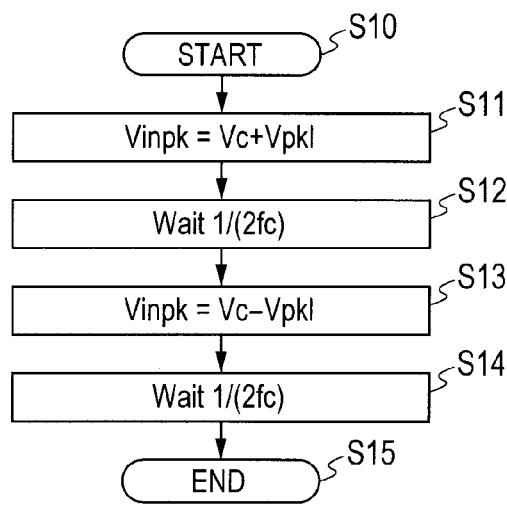

SEMICONDUCTOR INTEGRATED CIRCUIT AND OPERATION METHOD OF THE SAME

CROSS-REFERENCE TO RELATED APPLICATIONS

The disclosure of Japanese Patent Application No. 2011-16386 filed on Jan. 28, 2011 including the specification, drawings and abstract is incorporated herein by reference in its entirety.

BACKGROUND

The present invention relates to a semiconductor integrated circuit and an operation method of the same and, more particularly, relates to a technique useful to accurately set a frequency characteristic of a built-in filter.

In wireless mobile communication of a cellular phone or the like, it is expected that growth of sound service will slow down in future but, on the other hand, the mobile communication market will shift in future to multimedia service simultaneously providing images, sound, and data to support advanced bidirectional applications. Accordingly, a broadband mobile data network having a high average throughput enabling a wireless packet data access of a peak rate exceeding 384 kbps is being required.

Therefore, the wireless mobile communication shifts to the third generation which is more effective than the 2.5 generation between the second and third generation. The user peak data rate in the third generation is increased to 384 kbps in EDGE (Enhanced Data Rate for GSM Evolution) and 2 Mbps in cdma2000 and WCDMA. In downlink coupling of HSDPA (High Speed Downlink Packet Access) introduced in the WCDMA of the third generation, the high modulation level of 16 QAM is used and user peak data rate of 14.4 Mbps is theoretically possible. QAM stands for Quadrature Amplitude Modulation.

As the third-generation wireless network spreads, it is becoming more important to reduce cost and power consumption of a third-generation mobile cell terminal. The direct conversion receiver architecture is a popular system solution in an integrated platform of a third-generation mobile cell terminal properly using silicon process, circuit design technique, and architecture implementation.

A direct conversion receiver needs a channel selection filter configured by a low-pass filter in order to suppress a disturbing signal out of a channel. Non-patent document 1 describes that a direct conversion receiver does not need an image removing filter, and the channel selection filter is a low-pass filter which can be formed on a chip so that it is preferable to make a wireless transceiver at a high integration level. In the direct conversion receiver, a WCDMA reception signal is amplified by a low-noise amplifier. After that, the amplified signal is supplied to an I-signal mixer and a Q-signal mixer configuring a quadrature downconversion mixer, and an I local signal and a Q local signal having a phase difference of 90 degrees are supplied to the I-signal mixer and the Q-signal mixer. An I baseband signal generated from the I-signal mixer is supplied to a first channel selection filter and a first amplifier, and a Q baseband signal generated from the Q-signal mixer is supplied to a second channel selection filter and a second amplifier.

In the non-patent document 1, it is described that in a direct conversion WCDMA receiver, a baseband signal from an RF front end has to be filtered by a low-pass filter having a bandwidth of 2 MHz. To obtain an accurate filter characteristic such as a smallest bandpass ripple, an accurate value of apart is necessary. Since a frequency parameter of an active filter is set by an RC product, accurate values of the resistance and capacitance have to be realized. Therefore, a filter has to be electronically tunable, and an automatic tuning system is designed on a chip as a total filter system. That is, an RC active filter designed as the baseband channel selection filter of a direct conversion WCDMA receiver is controlled by an on-chip tuning circuit, and a parameter deviation is compensated so that the cutoff frequency is maintained at a design value.

The filter time constant is changed by using a binary weight 5-bit capacitance matrix, and a switch is realized by an NMOS transistor operating in a linear region. The frequency response is tuned by device layout of a resistor or a capacitor in a programmable array. The value of the array is designed by a digital code generated by an on-chip calibration circuit.

The frequency of each of integrators of a fifth-order Chebyshev low-pass filter is tuned by tuning the time constant of the integrator. A parallel-capacitance array topology including a single fixed element and N pieces of binary weight switching elements is employed.

Patent document 1 discloses a filter adjustment circuit for adjusting performance index (Q factor: Quality factor) of an active filter. An active filter includes an amplifier, an input resistor, a feedback resistor, and a feedback capacitor. The adjustment circuit includes a reference frequency generation circuit, a phase comparator, a reference voltage generation circuit, an amplitude comparator, and a control circuit. The reference frequency generation circuit generates a first signal having a filter cutoff frequency and a second signal having a phase different from that of the first signal, supplies the first signal to one of input terminals of the phase comparator, and supplies the second signal to the input terminal of the active filter. Since a third signal as a filter output signal of the active filter is supplied to the other input terminal of the phase comparator, the phase comparator compares the phase of the first signal and the phase of the third signal and determines whether the frequencies are the same or not. The third signal as a filter output signal of the active filter is supplied to one of input terminals of the amplitude comparator, and the reference voltage indicative of a predetermined amplitude value for specifying the Q factor generated from the reference voltage generation circuit is supplied to the other input terminal of the amplitude comparator. Consequently, the amplitude comparator compares the amplitude value of the third signal and the reference voltage and outputs the comparison result. The phase comparison result of the phase comparator and the amplitude comparison result of the amplitude comparator are supplied to the control circuit. The control circuit controls the feedback capacitor in the active filter, thereby adjusting the cutoff frequency of the active filter and, simultaneously, controls the feedback resistance of the active filter, thereby adjusting the Q factor of the active filter.

In the non-patent document 2 whose lead author is the single investor of the patent document 1, a filter tuning system similar to the filter adjustment circuit described in the patent document 1 is described. A fifth-order low-pass filter described in the non-patent document 2 is used as a low-pass filter having a bandwidth of 40 MHz of the direct conversion architecture for high-throughput enlargement-option for IEEE802.11n as one of wireless LAN standards devised by IEEE.

A filter tuning system illustrated in FIG. 14 of the non-patent document 2 includes a replica filter, a main filter, a reference signal/reference voltage generator, a phase comparator, an amplitude comparator, and a control circuit. The main filter is configured by a fifth-order Chebyshev active RC low-pass filter, and the replica filter is configured by a second-order low-pass filter as a replica of the main filter.

A replica input signal and a reference signal generated from the reference signal/reference voltage generator and having a phase difference of 90 degrees are supplied to the input terminal of the replica filter and one of input terminals of the phase comparator. A filter output signal from the replica filter is supplied to the other input terminal of the phase comparator and one of input terminals of the amplitude comparator, and reference voltage generated from the reference signal/reference voltage generator is supplied to the other input terminal of the amplitude comparator. A phase comparison result of the phase comparator and an amplitude comparison result of the amplitude comparator are supplied to the control circuit. By an output of the control circuit, the cutoff frequency of the replica filter and the Q factor of the replica filter are adjusted. In the adjustment, first, the cutoff frequency of the replica filter is adjusted by the resistance value of a total feedback resistor of the second-order low-pass filter as the replica filter. The total feedback resistor is coupled between the inversion input terminal of an amplifier in the first stage of the second-order low-pass filter as the replica filter and the output terminal of the signal inverter having the gain −1 of the output terminal of an amplifier in the second stage. In the adjustment, next, the Q factor of the replica filter is adjusted by the resistance value of a local feedback resistor of the second-order low-pass filter as the replica filter. The local feedback resistor is coupled to a feedback capacitor in series between the inversion input terminal and the output terminal of each of the amplifiers in the first and second stages in the second-order low-pass filter as the replica filter. In the adjustment, the parameter set in the replica filter which is tuned at last is copied into the main filter.

RELATED ART DOCUMENTS

Patent Documents

[Patent Document 1] Japanese Unexamined Patent Publication No. 2007-281604

Non-Patent Documents

[Non-Patent Document 1]
M. Konfal et al, "CMOS Analog Baseband Channel Filter for Direct A Conversion WCDMA Receiver", Proceedings. 5th International Conference on ASIC, 2003, Volume 1, 21-24 Oct. 2003, pp. 577 to 580

[Non-Patent Document 2]
Shouhei Kousai et al, "A 19.7 MHz, Fifth-Order Active-RC Chebyshev LPF for Draft IEEE802.11n with Automatic Quality-Factor Tuning Scheme", IEEE Journal of Solid-State Circuit, Vol. 42, No. 11, November 2007, pp. 2326 to 2337.

SUMMARY

Prior to the present invention, the inventors of the present invention were engaged in research and development of a semiconductor integrated circuit to be mounted on a cellular phone terminal or the like supporting transmission/reception of the third-generation WCDMA.

First, as a receiver supporting transmission/reception of the third-generation WCDMA, the architecture of a direct conversion WCDMA receiver was employed as described in the background art. As a result, the channel selection filter for suppressing a disturbing signal out of a desired channel becomes necessary as described in the background art.

On the other hand, during the research and development, it is requested to be compatible with a new standard of a cellular phone called a long term evolution (LTE) standard. In conventional standards, the baseband signal bandwidth is fixed. In the LTE standard, a baseband signal bandwidth can be selected from a plurality of bandwidths and used.

Specifically, in the GSM system, for example, a fixed value of 270 kHz is used as the channel bandwidth. In the WCDMA system, for example, a fixed value of 3.84 MHz is used as the channel bandwidth. In the LTE standard of the frequency division multiplexing system, one channel bandwidth is selected from 1.4 MHz, 3 MHz, 5 MHz, 10 MHz, 15 MHz, and 20 MHz and the selected channel bandwidth is used. In the direct conversion architecture of dividing an RF reception signal to an in-phase (I) component and a quadrature (Q) component by using a quadrature mixer and directly converting the component to a baseband signal, the cutoff frequency of a channel selection filter which selectively receives the baseband signal bandwidth is about the half of the channel bandwidth. To reduce the area, a market demand for a multi-mode receiver receiving different modes of GSM, WCDMA, and LTE by a single chip is high. As a result, to make the direct conversion WCDMA receiver compatible with the multiple modes, the cutoff frequency of the channel selection filter has to be varied in a plurality of frequencies. GSM stands for Global System for Mobile Communications, and WCDMA stands for Wideband Code Division Multiple Access.

Prior to the present invention, the inventors of the present invention have examines the filter adjustment methods described in the patent document 1 and the non-patent document 1.

In the filter adjustment method described in the patent document 1, the first signal having the same frequency as the cutoff frequency to be set in a filter and the second signal have to be supplied to one of the input terminals of the phase comparator and the input terminal of the active filter. Consequently, just to apply the filter adjustment method described in the patent document 1 only to the LTE standard, the frequencies of the first and second signals have to be set in each of a plurality of baseband signal bandwidth of the LTE standard. For the application, a phase locked loop (PLL) circuit is used, and the frequencies of the first and second signals are changed in large change widths by a frequency divider having a large variable frequency division ratio of the PLL circuit. A frequency divider having a variable frequency division ratio for generating cutoff frequencies corresponding to six kinds of baseband widths of 1.4 MHz, 3 MHz, 5 MHz, 10 MHz, 15 MHz, and 20 MHz as the plurality of baseband signal bandwidths of the LTE standard has to be provided. Further, signals having a different phase of 90 degrees have to be generated. There is consequently a problem that the circuit design for signal generation is complicated.

In the filter adjustment method described in the non-patent document 2, to set the main filter at the cutoff frequency of 19.7 MHz, a replica input signal having a frequency of 20 MHz close to the frequency of 19.7 MHz and the reference signal have to be supplied to the input terminal of the replica filter and one of the input terminals of the phase comparator. Therefore, to apply the filter adjustment method described in the non-patent document 2 to the LTE standard, the frequencies of the replica input signal and the reference signal have to be set in all of a plurality of baseband signal bandwidths in the LTE standard. As a result, the frequency divider of the PLL circuit has to have the above-described six kinds of variable frequency division ratios. In addition, signals having a phase difference of 90 degrees have to be generated. There is consequently a problem that the circuit design for signal generation is complicated.

In the filter adjustment method described in the patent document 1, the reference voltage generated from the reference voltage generating circuit and supplied to the other input terminal of the amplitude comparator is set to the product of the voltage amplitude of a second signal supplied to the input terminal of the active filter, the DC gain and the Q factor in order to indicate a predetermined amplitude value for specifying the Q factor. As a result, even when the amplitude value of the output signal of the active filter fluctuates due to variations in the DC gain of the active filter, the reference voltage does not change in response to the variations in the DC gain, so that the Q factor of the active filter cannot be accurately adjusted according to the amplitude comparison result of the amplitude comparator.

On the other hand, in the filter adjustment method described in the non-patent document 2, reference voltage generated from an R-2R digital-analog converter of 10 bits of the reference signal/reference voltage generator and supplied to the other input terminal of the amplitude comparator is set to a constant value of 16 Vin/π. The voltage Vin is voltage of the replica input signal supplied to the input terminal of the replica filter. Therefore, by the investigation conducted by the inventors of the present invention previously to the present invention, the following problem was revealed. Even when the voltage signal amplitude of the output voltage signal at the peak frequency of the replica filter further fluctuates due to the fluctuation in the DC gain of the replica filter caused by adjustment of the peak frequency of the replica filter by the total feedback resistance, since the reference voltage is set to a constant value, the Q factor of the replica filter cannot be accurately adjusted by the amplitude comparison result of the amplitude comparator.

The present invention has been achieved as a result of the investigation conducted by the inventors of the present invention previously to the present invention.

An object of the present invention is, therefore, to accurately set a frequency characteristic of a filter integrated in a semiconductor integrated circuit.

The above and other objects and novel features of the present invention will become apparent from the description of the specification and the appended drawings.

Representative one of inventions disclosed in the present application will be briefly described as follows.

A semiconductor integrated circuit according to a representative embodiment of the present invention includes: a filter circuit (1); a cutoff frequency calibration circuit (2) which gives a cutoff frequency adjustment result as a signal for adjusting cutoff frequency of the filter circuit to the filter circuit; and a Q-factor calibration circuit (3) which gives a Q-factor adjustment signal as a signal for adjusting a Q factor of the filter circuit to the filter circuit on the basis of an output of the filter circuit.

The cutoff frequency calibration circuit can adjust the cutoff frequency of the filter circuit to a desired value by adjusting a capacitance component (C1, C2) of the filter circuit.

The Q-factor calibration circuit can adjust the Q factor of the filter circuit to a desired value by adjusting, after adjustment of the cutoff frequency of the filter circuit by the cutoff frequency calibration circuit, a resistance component (R3) of the filter circuit (refer to FIG. 3).

An effect obtained by the representative one of the inventions disclosed in the present application will be briefly described as follows.

According to the present invention, the frequency characteristic of the filter integrated in the semiconductor integrated circuit can be accurately set.

BRIEF DESCRIPTION OF THE DRAWINGS

FIG. 9 is a diagram illustrating the relation among resistance values of a plurality of resistors R31, R32, ..., R38 of the feedback resistor R3 of the imperfect integrator in the second stage of the filter circuit 1 according to the first embodiment of the invention shown in FIG. 7.

FIG. 10 is a diagram for explaining operation of calibrating a frequency characteristic of the filter circuit 1 as the channel selection filter provided in the semiconductor integrated circuit according to the first embodiment of the invention illustrated in FIGS. 1 and 2.

FIG. 11 is a diagram for explaining a state where a control circuit 51 of the Q-factor calibration circuit 3 generates a Q-factor adjustment input signal in the Q-factor compensating operation in step S2 in the operation of calibrating a frequency characteristic of the filter circuit 1 of the semiconductor integrated circuit according to the first embodiment of the invention illustrated in FIG. 10.

DETAILED DESCRIPTION

1. Outline of Embodiments

Figure 1:
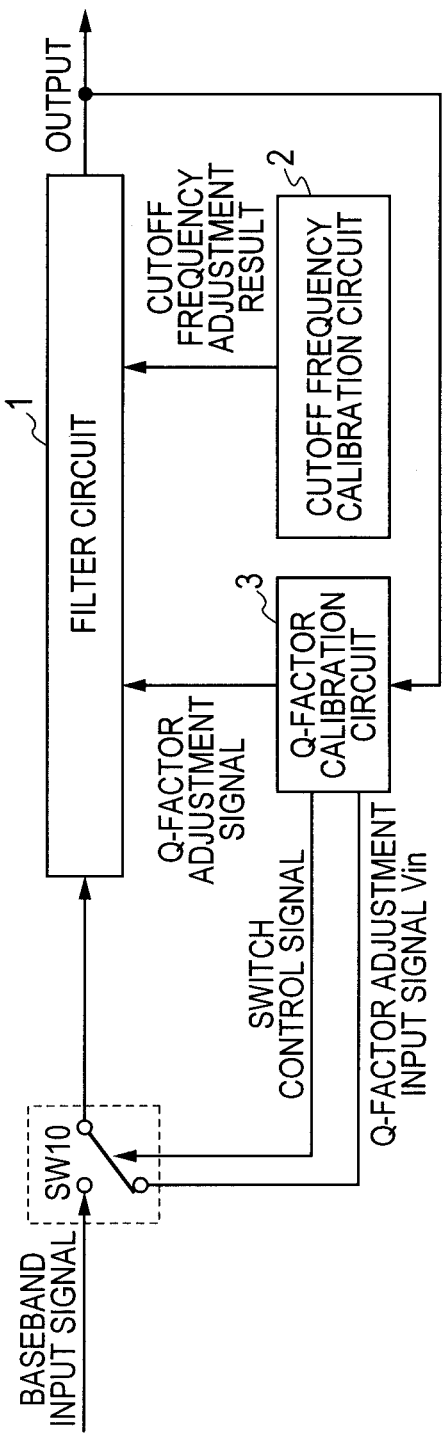
FIG. 1 is a diagram illustrating the configuration of a semiconductor integrated circuit according to a first embodiment of the present invention, including a filter circuit 1 as a channel selection filter for a direct conversion multimode receiver compatible with the long term evolution (LTE) standard, and a cutoff frequency calibration circuit 2 and a Q-factor calibration circuit 3 for setting a frequency characteristic of the filter circuit 1.

First, outline of representative embodiments of the invention disclosed in the present application will be described. Reference numerals of the drawings referred to in parentheses in the description of the outline of the representative embodiments merely illustrate components designated with the reference numerals included in the concept of the components.

[1] A semiconductor integrated circuit according to a representative embodiment of the present invention includes: a filter circuit (1); a cutoff frequency calibration circuit (2) which gives a cutoff frequency adjustment result as a signal for adjusting cutoff frequency of the filter circuit to the filter circuit; and a Q-factor calibration circuit (3) which gives a Q-factor adjustment signal as a signal for adjusting a Q factor of the filter circuit to the filter circuit on the basis of an output of the filter circuit.

The cutoff frequency calibration circuit can adjust the cutoff frequency of the filter circuit to a desired value by adjusting a capacitance component (C1, C2) of the filter circuit.

Figure 3:
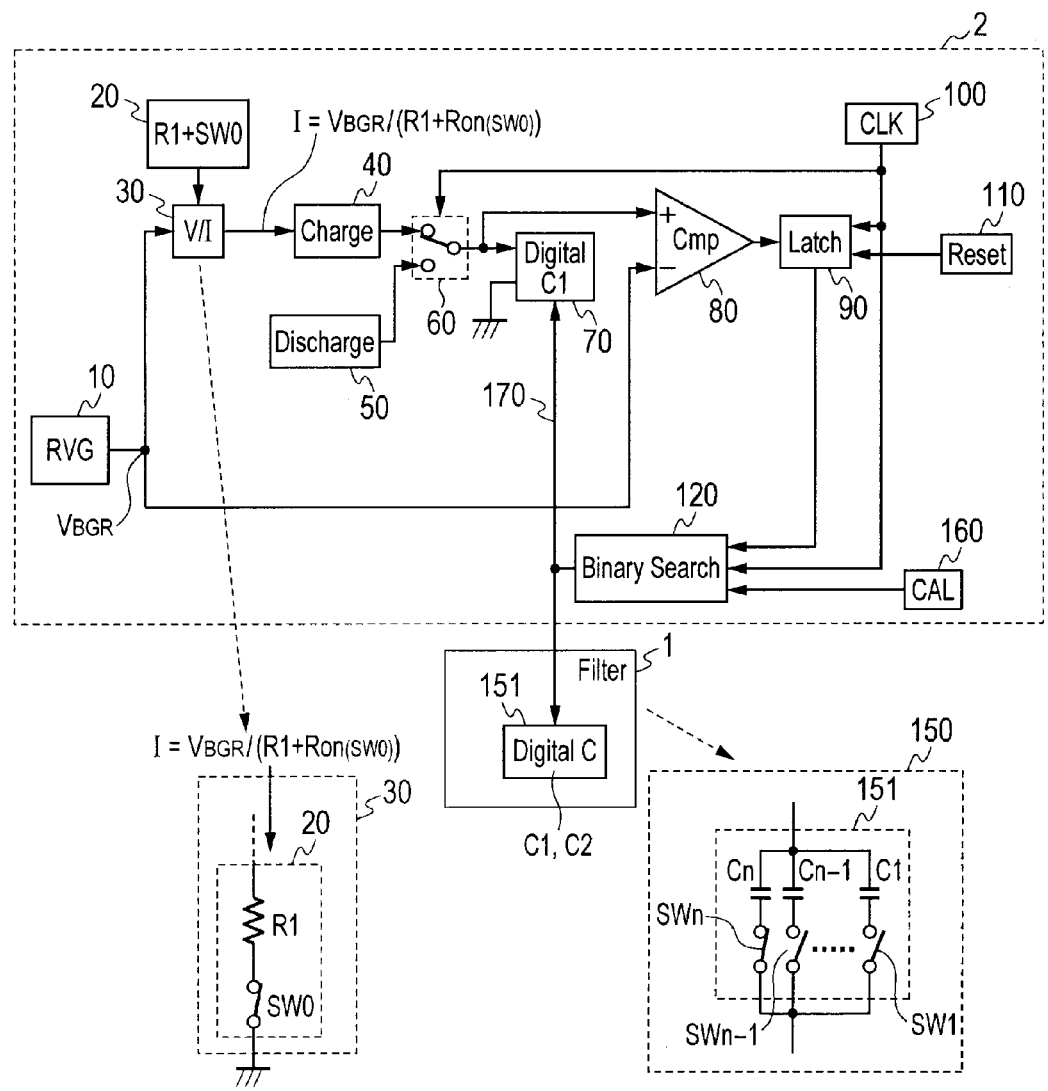
FIG. 3 is a diagram illustrating the configuration of the cutoff frequency calibration circuit 2 in the semiconductor integrated circuit according to the first embodiment of the invention illustrated in FIGS. 1 and 2.

The Q-factor calibration circuit can adjust the Q factor of the filter circuit to a desired value by adjusting, after adjustment of the cutoff frequency of the filter circuit by the cutoff frequency calibration circuit, a resistance component (R3) of the filter circuit (refer to FIG. 3).

According to the embodiment, the frequency characteristic of the filter integrated in the semiconductor integrated circuit can be accurately set.

In a preferred embodiment, the filter circuit is a low-pass filter which outputs a signal of a result of cutting off a component of a frequency higher than a predetermined frequency from an input signal.

The cutoff frequency calibration circuit detects an error of the capacitance component by time integration using at least one of charging and discharging of the capacitance component of the low-pass filter and, on the basis of a detection result of the error, can compensate the error of the capacitance component (refer to FIG. 3).

In another preferred embodiment, the Q-factor calibration circuit includes a reference voltage generator (Ref50), an amplitude comparator (50), and a control register (52).

The reference voltage generator generates a reference voltage (VrefQ) for determining amplitude of an output signal of an output terminal of the low-pass filter.

The amplitude comparator compares the reference voltage generated by the reference voltage generator and the amplitude of the output signal of the low-pass filter.

The control register stores Q-factor control information which adjusts the resistance component of the low-pass filter.

In the case where the amplitude comparator determines that the amplitude of the output signal of the low-pass filter is larger than the reference voltage generated by the reference voltage generator, the value of the Q-factor control information is changed to decrease the amplitude of the output signal of the low-pass filter (S130).

Figure 12:
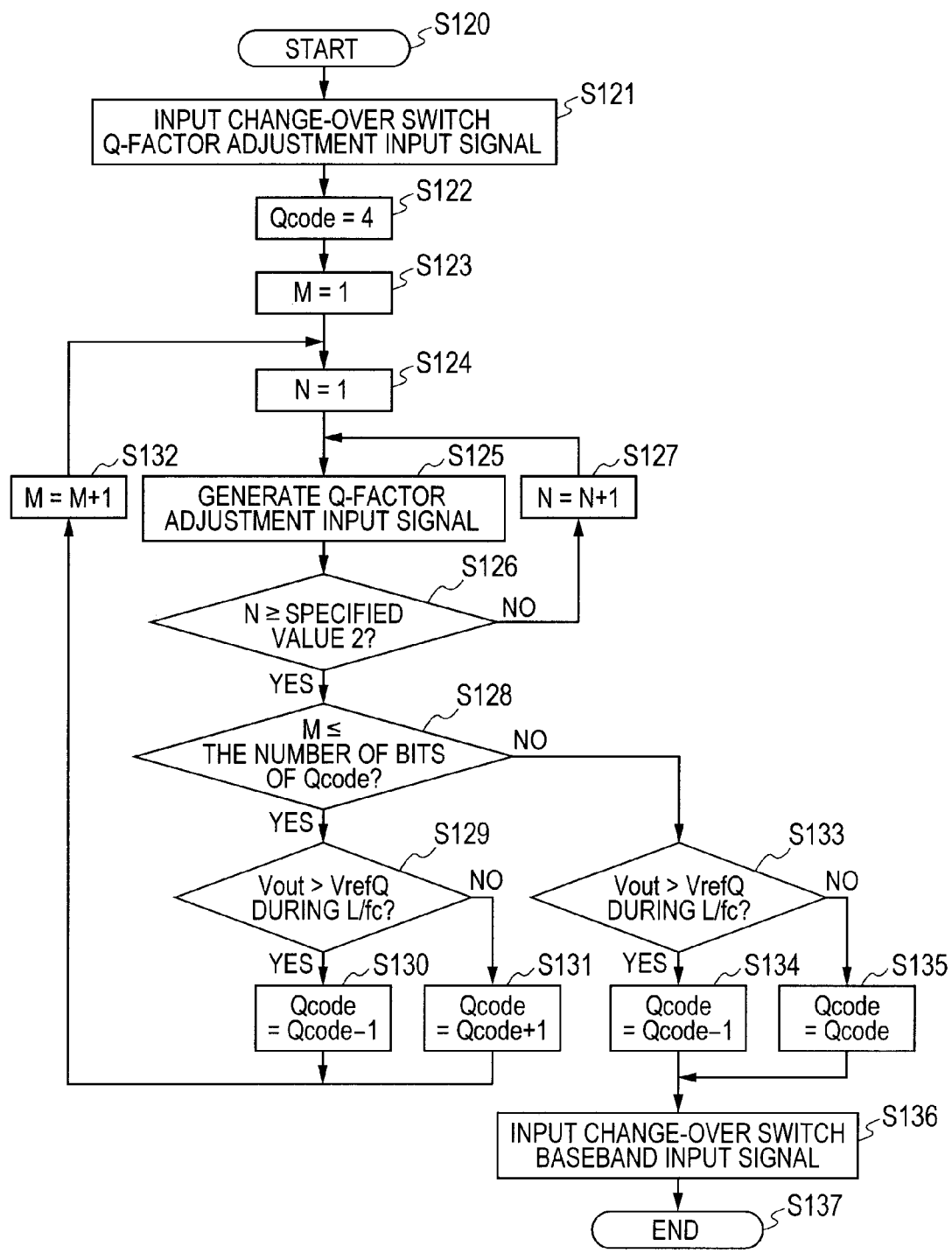
FIG. 12 is a diagram for explaining, more specifically, the Q-factor compensating operation in step S2 in the operation of calibrating the frequency characteristic of the filter circuit 1 of the semiconductor integrated circuit according to the first embodiment of the invention illustrated in FIG. 10.

In the case where the amplitude comparator determines that the amplitude of the output signal of the low-pass filter is smaller than the reference voltage generated by the reference voltage generator, the value of the Q-factor control information is changed to increase the amplitude of the output signal of the low-pass filter (S131) (refer to FIG. 12).

In a more preferred embodiment, the Q-factor calibration circuit generates an adjustment input signal (Vinpk) which is set to a predetermined voltage level in a period sufficiently longer than a cycle of cutoff frequency of the low-pass filter of the desired value and supplies the adjustment input signal to an input terminal of the low-pass filter.

The low-pass filter substantially DC-responds to the adjustment input signal, and the Q-factor calibration circuit can cancel off a fluctuation in a direct-current gain (DCgain) of the low-pass filter by a voltage change in the adjustment input signal so that the voltage (Voutpk) of a DC-response output signal generated at the output terminal of the low-pass filter matches a predetermined reference level (VrefA) (refer to FIGS. 13 to 19).

Figure 20:
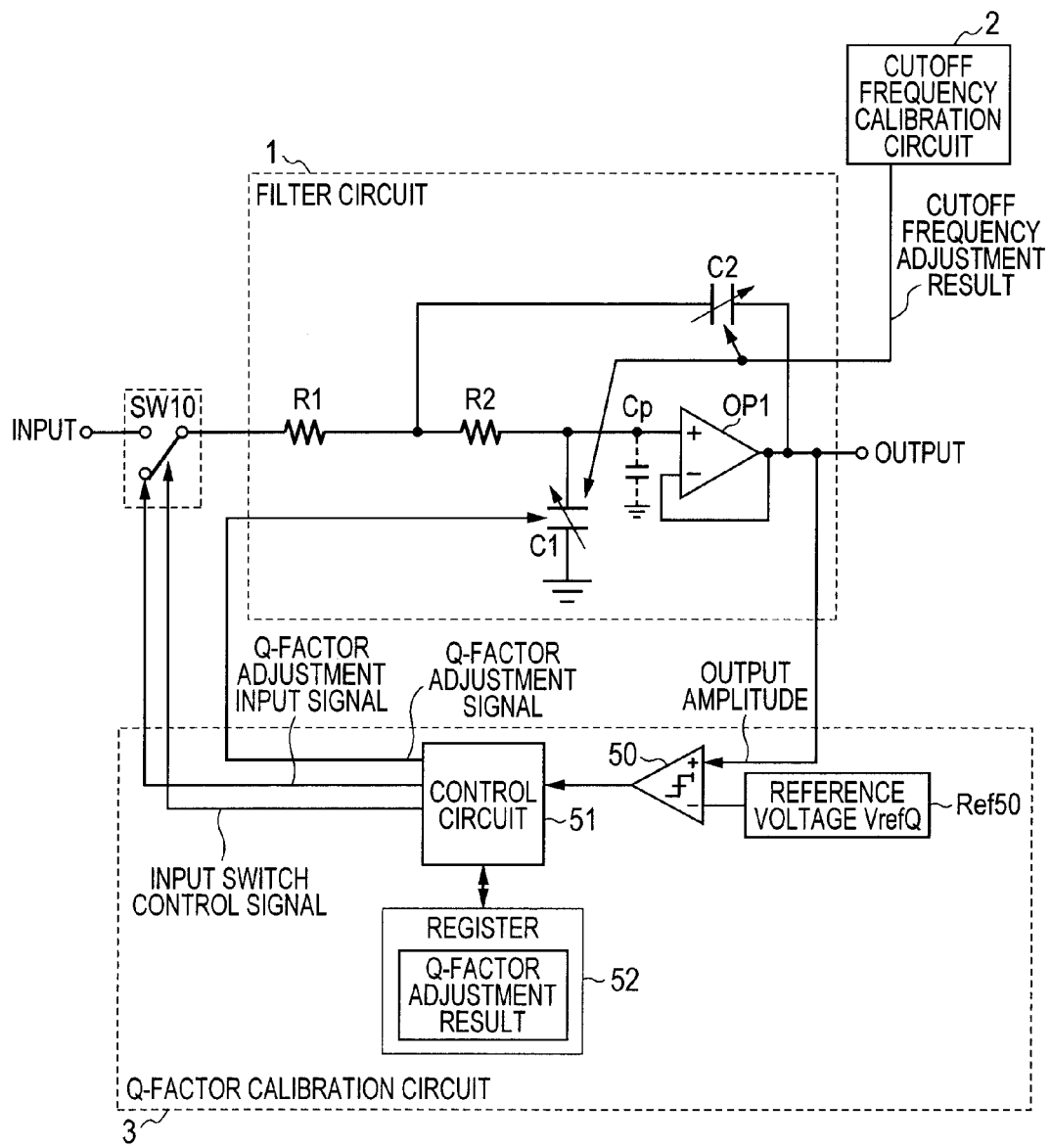
FIG. 20 is a diagram illustrating another configuration of a semiconductor integrated circuit according to a third embodiment of the present invention, including the filter circuit 1 as a channel selection filter for a direct conversion multimode receiver compatible with the long term evolution (LTE) method, and the cutoff frequency calibration circuit 2 and the Q-factor calibration circuit 3 for setting a frequency characteristic of the filter circuit 1.

In further another preferred embodiment, the low-pass filter is a Sallen-key low-pass filter (refer to FIG. 20).

Figure 2:
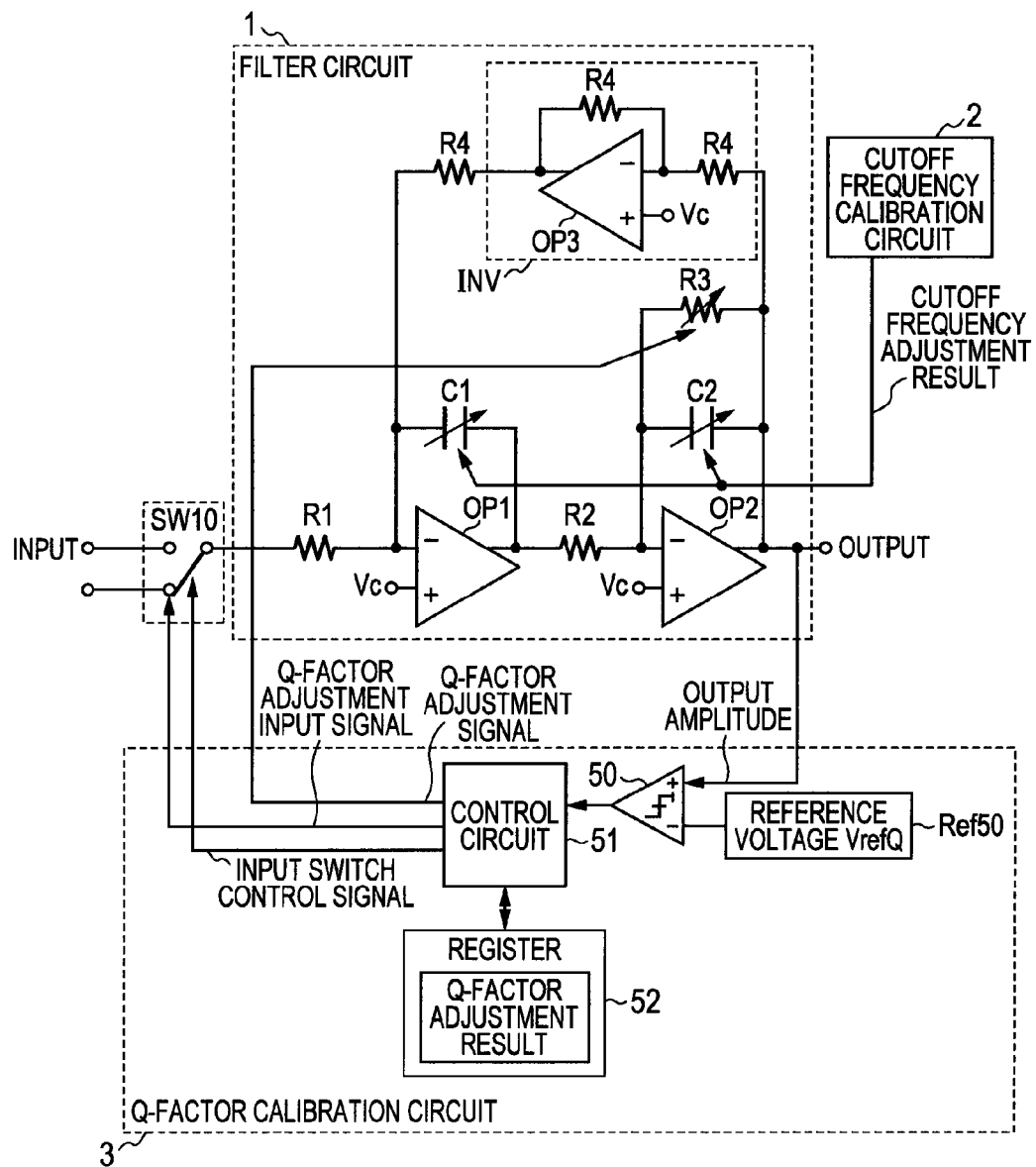
FIG. 2 is a diagram illustrating a more detailed configuration of the semiconductor integrated circuit according to the first embodiment of the present invention shown in FIG. 1.

In further another preferred embodiment, the low-pass filter is an active low-pass filter including a plurality of operational amplifiers (OP1 and OP2) cascade coupled (refer to FIG. 2).

Figure 21:
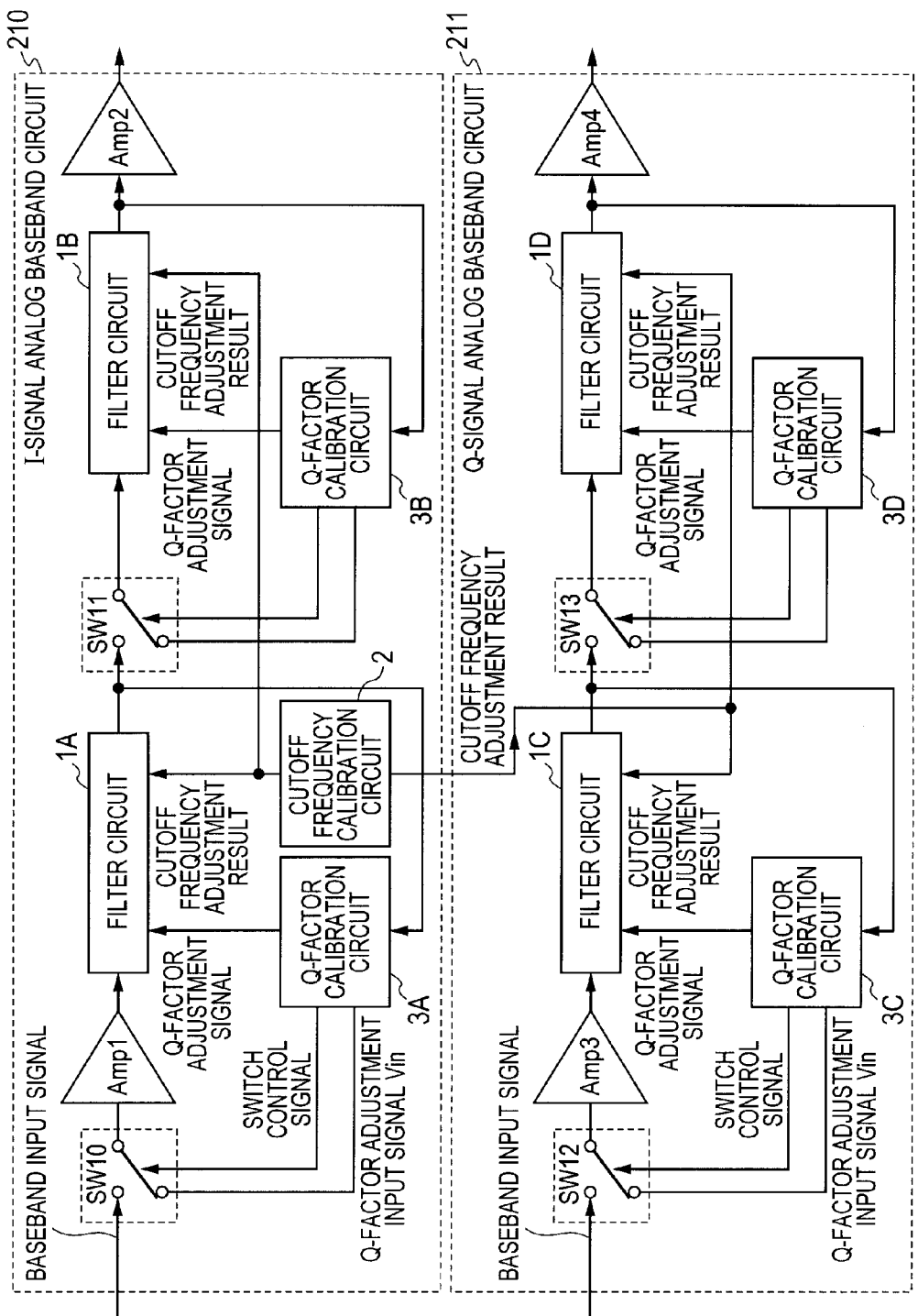
FIG. 21 is a diagram illustrating another configuration of a semiconductor integrated circuit according to a fourth embodiment of the present invention, including a plurality of filter circuits 1A, 1B, 1C, and 1D as channel selection filters of I channel and Q channel in the case of using a multimode receiver of a quadrature direct downconversion method compatible with the long term evolution (LTE) method, and the common cutoff frequency calibration circuit 2 and a plurality of Q-factor calibration circuits 3A, 3B, 3C, and 3D for setting a frequency characteristic of the filter circuits.
Figure 22:
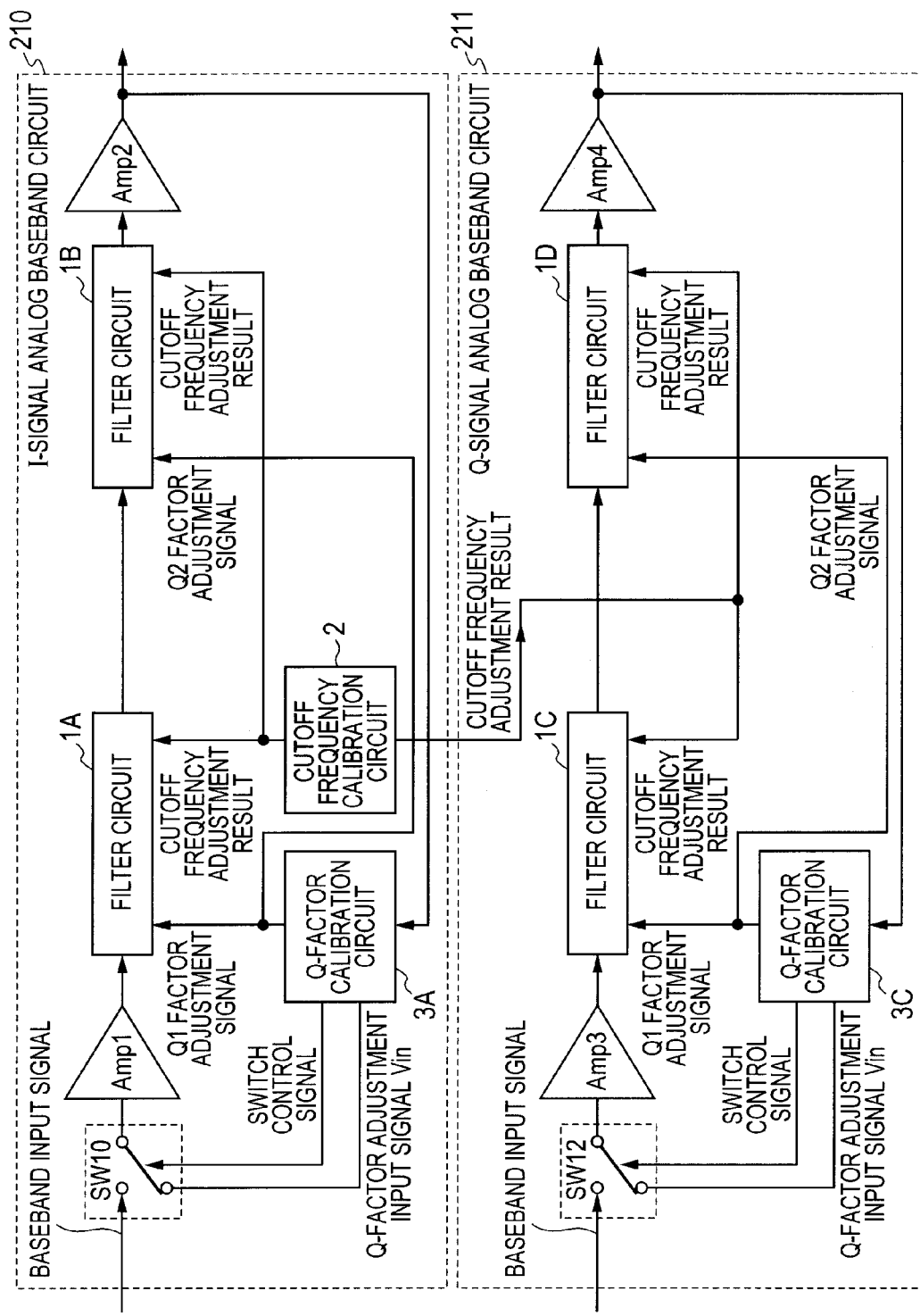
FIG. 22 is a diagram illustrating another configuration of a semiconductor integrated circuit according to a fifth embodiment of the present invention, including the plurality of filter circuits 1A, 1B, 1C, and 1D as channel selection filters of I channel and Q channel in the case of using a multimode receiver of a quadrature direct downconversion method compatible with the long term evolution (LTE) method, and the cutoff frequency calibration circuit 2 and a plurality of Q-factor calibration circuits 3A and 3C for setting a frequency characteristic of the filter circuits.

In further another preferred embodiment, the low-pass filter includes a plurality of low-pass filters (1A and 1B) cascade-coupled (refer to FIGS. 21 and 22).

In further another preferred embodiment, the semiconductor integrated circuit further has a direct downconversion receiver including a low-noise amplifier (30), a reception mixer (40, 70), an RF oscillator (110), and a channel selection filter (50, 80).

The channel selection filter is the low-pass filter.

The cutoff frequency calibration circuit can adjust the cutoff frequency of the low-pass filter to the desired value by adjusting the capacitance component of the low-pass filter configured as the channel selection filter.

Figure 25:
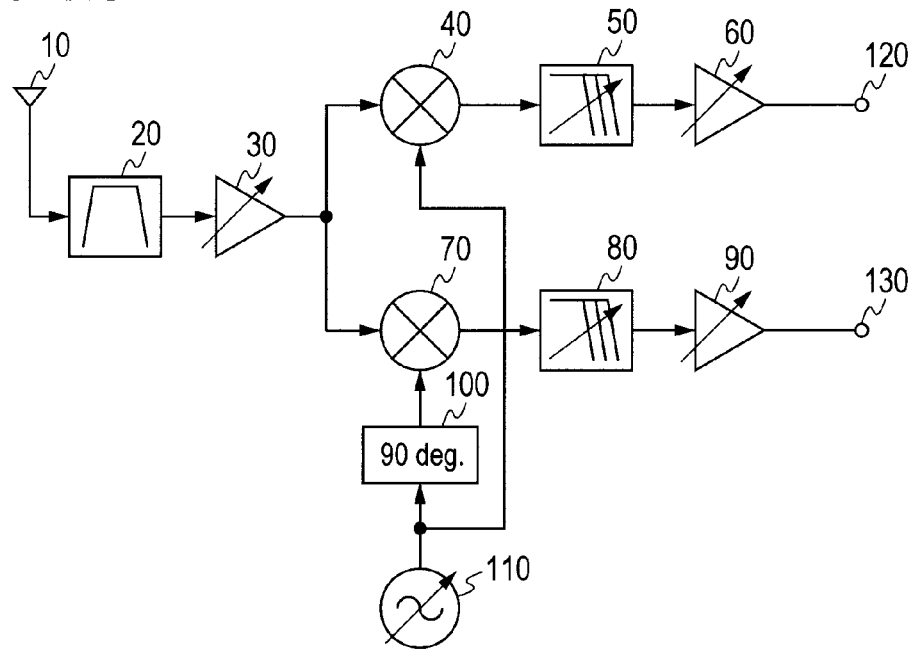
FIG. 25 is a diagram illustrating a configuration of applying a filter circuit provided in the semiconductor integrated circuit according to any of the first to fifth embodiments of the invention to a channel selection filter of a receiver of the quadrature downconversion method according to the sixth embodiment of the invention having an analog baseband unit of two systems of the I channel of an in-phase component and the Q channel of a quadrature component.

The Q-factor calibration circuit can adjust the Q factor of the low-pass filter to the desired value by adjusting the resistance component of the low-pass filter after the adjustment of the cutoff frequency of the low-pass filter by the cutoff frequency calibration circuit (refer to FIG. 25).

In a concrete embodiment, the direct downconversion receiver is compatible with a long term evolution standard (refer to FIGS. 1 and 2).

Figure 26:
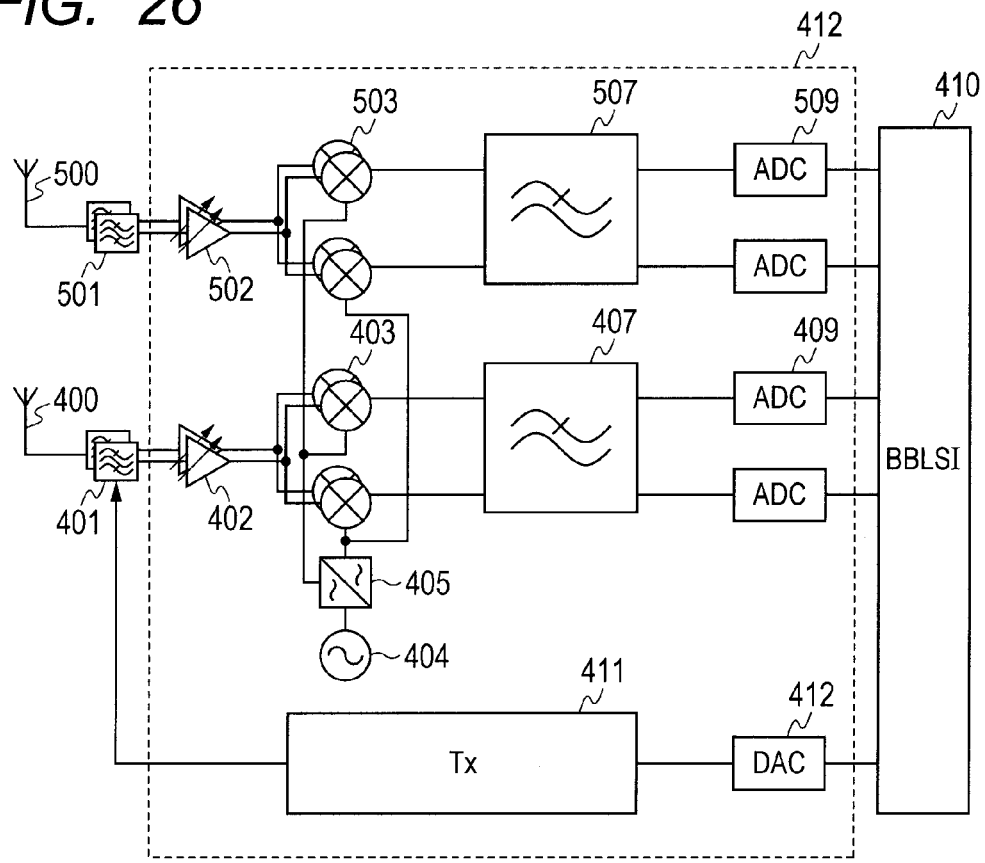
FIG. 26 is a diagram illustrating a configuration of applying a filter circuit provided in the semiconductor integrated circuit according to any of the first to fifth embodiments of the invention to a channel selection filter of a receiver of the quadrature downconversion method according to the sixth embodiment of the invention used for a multi-input multi-output (MIMO) communication system.

In another concrete embodiment, the direct downconversion receiver is compatible with a multi-input multi-output communication system and diversity reception (refer to FIG. 26).

[2] A representative embodiment from another aspect of the invention relates to an operation method of a semiconductor integrated circuit including: a filter circuit (1); a cutoff frequency calibration circuit (2) which gives a cutoff frequency adjustment result as a signal for adjusting cutoff frequency of the filter circuit to the filter circuit; and a Q-factor calibration circuit (3) which gives a Q-factor adjustment signal as a signal for adjusting a Q factor of the filter circuit to the filter circuit on the basis of an output of the filter circuit. The method includes the steps of: adjusting the cutoff frequency of the low-pass filter to a desired value by adjusting a capacitance component (C1, C2) of the low-pass filter by using the cutoff frequency calibration circuit: and after the step of adjusting the cutoff frequency of the low-pass filter by using the cutoff frequency calibration circuit, adjusting the Q factor of the low-pass filter to a desired value by adjusting a resistance component (R3) of the filter circuit by using the Q-factor calibration circuit (refer to FIGS. 3 and 10).

According to the embodiment, the frequency characteristic of the filter integrated in the semiconductor integrated circuit can be accurately set.

2. Details of Embodiments

Next, the embodiments will be described more specifically. In all of drawings for explaining best modes for carrying out the present invention, the same reference numerals are designated to parts having the same functions as those in the described drawings and repetitive description will not be given.

First Embodiment

Configuration of Semiconductor Integrated Circuit

FIG. 1 is a diagram illustrating the configuration of a semiconductor integrated circuit according to a first embodiment of the present invention, including a filter circuit 1 as a channel selection filter for a direct conversion multimode receiver compatible with the long term evolution (LTE) standard, and a cutoff frequency calibration circuit 2 and a Q-factor calibration circuit 3 for setting a frequency characteristic of the filter circuit 1.

An output terminal of an input change-over switch SW10 is coupled to an input terminal of the filter circuit 1 as the channel selection filter, a baseband input signal generated from a reception mixer of a direct conversion multimode receiver is supplied to one of input terminals of the input change-over switch SW10, a Q-factor adjustment input signal generated from the Q-factor calibration circuit 3 is supplied to the other input terminal of the input change-over switch SW10, and a switch control signal generated from the Q-factor calibration circuit 3 is supplied to a switch control terminal of the input change-over switch SW10.

The cutoff frequency calibration circuit 2 outputs a cutoff frequency adjustment result for compensating variations in the cutoff frequency of the filter circuit 1 caused by device variations to the filter circuit 1. The Q-factor calibration circuit 3 outputs the Q-factor adjustment input signal and the switch control signal for compensating variations in the Q factor caused by the device variations to the input change-over switch SW10 by controlling the input change-over switch SW10 and, finally, outputs the Q-factor adjustment signal to the filter circuit 1.

More Detailed Configuration of Semiconductor Integrated Circuit

FIG. 2 is a diagram illustrating a more detailed configuration of the semiconductor integrated circuit according to the first embodiment of the present invention shown in FIG. 1.

As illustrated in FIG. 2, the filter circuit 1 as the channel selection filter is an active RC low-pass filter having a biquad configuration. Specifically, in the filter circuit 1 of FIG. 2, the first stage is configured by a perfect integrator including an input resistor R1, an operational amplifier OP1, and a feedback capacitor C1, and a second stage is configured by an imperfect integrator including an input resistor R2, an operational amplifier OP2, a feedback capacitor C2, and a feedback resistor R3.

In the first stage, one end of the input resistor R1 is coupled to the output terminal of an input change switch SW10, and the other end is coupled to an inversion input terminal of the operational amplifier OP1. The feedback capacitor C1 is coupled between the inversion input terminal and the output terminal of the operational amplifier OP1, and common mode voltage Vc is supplied to a non-inversion input terminal of the operational amplifier OP1. In the second stage, one end of the input resistor R2 is coupled to the output terminal of the operational amplifier OP1 in the first stage, and the other end is coupled to an inversion input terminal of the operational amplifier OP2 in the second stage. The feedback capacitor C2 and a feedback resistor R3 are coupled in parallel between the inversion input terminal and the output terminal of the operational amplifier OP2, and the common mode voltage Vc is supplied to a non-inversion input terminal of the operational amplifier OP2.

The output terminal of the operational amplifier OP2 in the second stage is coupled to the input terminal of a signal inverter INV whose voltage gain is 1, and the output terminal of the signal inverter INV is coupled to the inversion input terminal of the operational amplifier OP1 in the first stage via a resistor R4. Specifically, the input resistor R4 is coupled to the inversion input terminal of the operational amplifier OP3, the resistor R4 is coupled between the inversion input terminal and the output terminal of an operational amplifier OP3, and the common mode voltage Vc is supplied to the non-inversion input terminal of the operational amplifier OP3. The input resistor R4 and the feedback resistor R4 are set to almost same resistance values, so that the signal inverter INV functions as an inversion buffer amplifier whose voltage gain is 1 (unity gain).

The input voltage and the output voltage of the channel selection filter illustrated in FIG. 2 are set as V1 and V2, and the voltage of the output terminal of the operational amplifier OP1 in the first stage is set as V3. Since the sum of currents at the input terminal of the operational amplifier OP1 in the first stage is zero, the following equation is satisfied.

$$\frac{V_1}{R_1} + \frac{-V_2}{R_4} + sC_1 V_3 = 0 \qquad \text{Equation (1)}$$

Since the sum of currents at the input terminal of the operational amplifier OP2 in the second stage is also zero, the following equation is satisfied.

$$\frac{V_3}{R_2} + sC_2 V_2 + \frac{V_2}{R_3} = 0 \qquad \text{Equation (2)}$$

From the above equation (2), the following equation is satisfied.

$$V_3 = \left(-sC_2 R_2 - \frac{R_2}{R_3}\right) \cdot V_2 \qquad \text{Equation (3)}$$

By substituting the equation (3) into the equation (1), the following equation is satisfied.

$$\frac{V_1}{R_1} + \frac{-V_2}{R_4} - sC_1 R_2 \cdot \left(sC_2 + \frac{1}{R_3}\right) \cdot V_2 = 0 \qquad \text{Equation (4)}$$

By modifying the above equation (4), the following equation is satisfied.

$$\begin{aligned} H(s) &= \frac{V_2}{V_1} \\ &= \frac{1}{R_1 \left(\frac{1}{R_4} + s^2 C_1 C_2 R_2 + \frac{sC_1 R_2}{R_3}\right)} \\ &= \frac{1}{C_1 C_2 R_1 R_2 s^2 + sC_1 \frac{R_1 R_2}{R_3} + \frac{R_1}{R_4}} \\ &= \frac{\frac{1}{C_1 C_2 \cdot R_2 R_4} \cdot \frac{R_4}{R_1}}{s^2 + \frac{1}{C_2 \cdot R_3} \cdot s + \frac{1}{C_1 C_2 R_2 R_4}} \\ &= \frac{\omega_0^2 \cdot \frac{R_4}{R_1}}{s^2 + \frac{\omega_0}{Q} \cdot s + \omega_0^2} \end{aligned} \qquad \text{Equation (5)}$$

In the case where $s=j \cdot 2\pi f$, $C1=C2=C$, and $R2=R4$, $\phi_0$, Q, and the cutoff frequency fc are given by the following equations.

$$\omega_0 = \sqrt{\frac{1}{C_1 C_2 R_2 R_4}} = \frac{1}{CR_2} \qquad \text{Equation (6)}$$

$$Q = C_2 R_3 \omega_0 \qquad \text{Equation (7)}$$
$$= C_2 R_3 \sqrt{\frac{1}{C_1 C_2 R_2 R_4}}$$
$$= \sqrt{\frac{R_3^2 C_2}{C_1 R_2 R_4}}$$
$$= \frac{R_3}{R_2}$$

$$fc = \frac{1}{2\pi}\omega_0 = \frac{1}{2\pi CR_2} \qquad \text{Equation (8)}$$

A transfer function H(s) given by the above equation (5) becomes the following DC gain DCgain in an input signal of a frequency sufficiently lower than the cutoff frequency $fc(=\frac{1}{2\pi CR_2})$.

$$H(s) = DCgain = \frac{R_4}{R_1} = \frac{R_2}{R_1} \qquad \text{Equation (9)}$$

Further, the transfer function H(s) given by the above equation (5) is approximated as follows at the cutoff frequency fc $(=\frac{1}{2\pi CR_2})$.

$$H(s) \cong DCgain \cdot Q = \frac{R_4}{R_1} \cdot \frac{R_3}{R_2} = \frac{R_3}{R_1} \qquad \text{Equation (10)}$$

Therefore, in the first embodiment of the present invention illustrated in FIG. 2, to make the channel selection filter of a direct conversion multimode receiver correspond to LTE baseband signal bandwidths, the cutoff frequency is changed from high frequencies to low frequencies like from approximately 10 MHz to 7.5 MHz, 5 MHz, 2.5 MHz, 1.5 MHz, and 700 kHz. As a result, as the frequency "f" decreases, the value of s=j·2·f also decreases. To make the transfer function H(s) almost constant despite the decrease in the frequency "f", the value of the feedback capacitor C is increased, and the value of ω0 is decreased.

Since the increase in the value of the feedback capacitor C which can be integrated in the semiconductor integrated circuit causes increase in area, by decreasing the Q factor=R3/R2 in accordance with the decrease in the frequency "f", the transfer function H(s) can be made almost constant despite of the crease in the frequency "f". For this purpose, in the channel selection filter according to the first embodiment of the present invention illustrated in FIG. 1, a variable resistor is used as the feedback resistor R3 coupled between the inversion input terminal and the inversion output terminal of the operational amplifier OP2 in the second stage, the resistance value of the variable feedback resistor R3 is decreased in accordance with the decrease in the frequency "f".

Functions of Cutoff Frequency Calibration Circuit and Q-Factor Calibration Circuit 3

The DC gain DCgain of the filter circuit 1 as the channel selection filter provided in the semiconductor integrated circuit according to the first embodiment of the invention illustrated in FIG. 2 is determined by R2/R1 as shown in the above equation 9. Further, when the capacitors C1, C2, and C are equal to one another (C1=C2=C), the cutoff frequency fc can be determined by $2\pi CR_2$ (fc=$2\pi CR_2$) as shown in the above equation (8), and Q factor is determined by R3/R2 as shown in the above equation (7).

In the operation of calibrating the frequency characteristic of the filter circuit 1 as the channel selection filter provided in the semiconductor integrated circuit according to the first embodiment of the invention illustrated in FIGS. 1 and 2, first, the cutoff frequency calibration circuit 2 compensates the capacitance values C of the capacitors C1 and C2 to accurate values so that the cutoff frequency fc is not influenced by device variation of the semiconductor integrated circuit, the cutoff frequency fc expressed by the above equation (8) is set to desired LTE baseband signal bandwidth.

After that, in the operation of calibrating the frequency characteristic of the filter circuit 1 as the channel selection filter provided in the semiconductor integrated circuit according to the first embodiment of the invention illustrated in FIGS. 1 and 2, a Q-factor calibration circuit 3 adjusts the resistance value of the feedback resistor R3 so that the Q factor is not influenced by device variation of the semiconductor integrated circuit, the Q factor expressed by the above equation (7) is set to a desired value.

As illustrated in FIG. 2, the Q-factor calibration circuit 3 includes an amplitude comparator 50 which compares the output amplitude of the filter circuit 1 and reference voltage VrefQ of a reference voltage generator Ref50, a control circuit 51 to which a result of the amplitude comparison of the amplitude comparator 50 is supplied, and a control register 52 which stores Q-factor control information.

Since the Q-factor adjustment input signal having the cutoff frequency fc $(=\frac{1}{2\pi CR_2})$ generated from the control circuit 51 is supplied to the input terminal of the filter circuit 1 via the input change switch SW10, an output voltage signal depending on the transfer function H(s) expressed by the equation (5) is generated at the output terminal of the filter circuit 1. The amplitude comparator 50 and the control circuit 51 set, in the control register 52, the Q-factor control information for adjusting the resistance value of the feedback resistor R3 so that the output amplitude of the filter circuit 1 and the reference voltage VrefQ coincide with each other.

As a result, by using the Q-factor calibration circuit 3 illustrated in FIG. 2, the Q factor as the gain of the filter circuit 1 for a signal component around the cutoff frequency fc can be set to a desired value in the signal bandwidth of a desired LTE baseband input signal generated from a reception mixer in a direct conversion multimode receiver.

An input signal peak voltage Vinpk of the Q-factor adjustment input signal having the cutoff frequency fc $(=\frac{1}{2\pi CR_2})$ supplied to the input terminal of the filter circuit 1 via the input change switch SW10 is determined by common mode voltage Vc supplied to the non-inversion input terminals of the operational amplifiers OP1 and OP2 in the filter circuit 1 and the voltage amplitude Vpk1.

$$Vinpk = Vc + Vpk1 \qquad \text{Equation (11)}$$

On the other hand, in the operational amplifiers OP1 and OP2 in the filter circuit 1, a common mode feedback (CMFB) circuit is used so that the DC voltage level of the output terminal coincides with the common mode voltage Vc supplied to the non-inversion input terminal. As a result, output signal peak voltage Voutpk of the output voltage signal having the cutoff frequency fc $(=\frac{1}{2\pi CR_2})$ generated from the output terminal of the filter circuit 1 is expressed as follows.

$$Voutpk = Vc + DCgain \cdot Q \cdot Vpk1 \qquad \text{Equation (12)}$$

On the other hand, when a desired Q factor to be set in the filter circuit 1 is $Q_0$, the reference voltage VrefQ of the reference voltage generator Ref50 is set as follows.

$$VrefQ = Vc + DCgain \cdot Q_0 \cdot Vpkl \qquad \text{Equation (13)}$$

In the case where, for example, an initial Q factor is larger than the desired factor $Q_0$ immediately after the Q-factor calibration circuit 3 starts the Q-factor calibration operation of setting the Q factor to the desired factor $Q_0$, the output signal peak voltage Voutpk of the filter circuit 1 of the above equation (12) becomes a value larger than the reference voltage VrefQ of the reference voltage generator Ref50 expressed by the above equation (13). In such a case, the amplitude comparator 50 and the control circuit 51 decrease the resistance value of the feedback resistor R3 so that the output signal peak voltage Voutpk of the filter circuit 1 and the reference voltage VrefQ of the reference voltage generator Ref50 coincide each other, thereby decreasing the Q factor to be smaller than the initial Q factor. After that, the amplitude comparator 50 and the control circuit 51 determine that the output signal peak voltage Voutpk of the filter circuit 1 and the reference voltage VrefQ of the reference voltage generator Ref50 coincide with each other and, in the case where the output signal peak voltage Voutpk of the filter circuit 1 is still a value larger than the reference voltage VrefQ of the reference voltage generator Ref50, the Q factor is further decreased. By repeating such an operation, even if there are device variations in the semiconductor integrated circuit, the Q factor of the filter circuit 1 can be set to a desired value.

In the Q-factor compensating operation by the Q-factor calibration circuit 3, the Q-factor calibration circuit 3 can adjust the Q factor expressed by the above equation (7) to a desired value by adjusting the resistance value of the feedback resistor R3.

Configuration of Cutoff Frequency Calibration Circuit

FIG. 3 is a diagram illustrating the configuration of the cutoff frequency calibration circuit 2 of the semiconductor integrated circuit according to the first embodiment of the invention shown in FIGS. 1 and 2.

As illustrated in FIG. 3, the cutoff frequency calibration circuit 2 includes a reference voltage generator 10, a resistance circuit 20, a voltage-current converter 30, a charging circuit 40, the discharging circuit 50, a change-over switch 60, a calibration capacitor 70, a voltage comparator 80, and a latch 90. Further, the cutoff frequency calibration circuit 2 includes a clock supply circuit 100, a reset circuit 110, a search circuit 120, a channel selection filter 1, and a calibration end control circuit 160. The cutoff frequency calibration circuit 2 and the channel selection filter 1 illustrated in FIG. 3 are integrated in a silicon semiconductor chip configuring the semiconductor integrated circuit.

As the filter circuit 1 illustrated in FIG. 2 has been described, the first stage of the channel selection filter 1 illustrated in FIG. 3 is configured by the perfect integrator including the input resistor R1, the operational amplifier OP1, and the feedback capacitor C1, and the second stage is configured by the imperfect integrator including the input resistor R2, the operational amplifier OP2, the feedback capacitor C2, and the feedback resistor R3. The channel selection filter 1 also includes the signal inverter INV and the feedback resistor R4.

The channel selection filter 1 illustrated in FIG. 3 also includes a filter capacitor 151 as each of the two feedback capacitors C1 and C2 included in the filter circuit 1 illustrated in FIG. 2 as symbolically shown in a right lower part of FIG. 3.

The cutoff frequency calibration circuit 2 illustrated in FIG. 3 executes calibrating operation previously to the normal operation of the channel selection filter 1, thereby tuning the channel selection filter 1 to a predetermined frequency characteristic. The frequency tuning is executed by tuning of the filter capacitor 151. Therefore, after completion of execution of the calibrating operation by the cutoff frequency calibration circuit 2, the channel selection filter 1 tuned to a predetermined frequency characteristic suppresses a disturbing signal by the direct conversion multimode receiver corresponding to the LTE system.

The configuration and operation of each of the circuits configuring the cutoff frequency calibration circuit 2 will be described more specifically below.

The reference voltage generator 10 is configured by, for example, a band gap reference voltage generating circuit or the like, thereby generating an almost stable band gap reference voltage $V_{BRG}$ which is not substantially influenced by the manufacturing process of the semiconductor integrated circuit, the operation temperature, the power supply voltage, and the like. That is, the band gap reference voltage $V_{BRG}$ from the reference voltage generator 10 can be considered as a constant voltage having extremely small fluctuations. In the case where power supply voltage of high precision is supplied from the outside, the power supply voltage is divided by using a resistor, and the divided voltage can be used as the reference voltage.

As illustrated in a lower left part in FIG. 3, the resistance circuit 20 is configured by serially coupling a resistor R1 and a switch SW0 which is configured by a MOS transistor and is set in the on state. The current in the voltage-current converter 30 is determined by the serial coupling between the resistor R1 and the switch SW0 in the resistance circuit 20. That is, when the on resistance of the MOS transistor configuring the switch SW0 is expressed as $Ron_{(SW0)}$, conversion current I of the voltage-current converter 30 is given by the following equation.

$$I = \frac{V_{BRG}}{R1 + Ron(sw0)} \qquad \text{Equation (14)}$$

The conversion current I from the voltage-current converter 30 is supplied to the charging circuit 40, so that the value of the charging current of the charging circuit 40 is set by the value of the conversion current I. The calibration capacitor 70 is charged by the charging current of the charging circuit 40 via the change-over switch 60, and the terminal voltage of the calibration capacitor 70 increases. Since the value of the discharge current of the discharging circuit 50 is set extremely larger than that of the charge current of the charging circuit 40, by discharging the calibration capacitor 70 at high speed via the change-over switch 60 with the extremely large discharge current of the discharging circuit 50, the terminal voltage of the calibration capacitor 70 decreases rapidly.

The change-over switch 60 supplies the charge current of the charging circuit 40 to the calibration capacitor 70 during the period of the low level of the clock signal CLK in response to the clock signal CLK supplied from the clock supply circuit 100, so that the calibration capacitor 70 can be charged with the charging current of the charging circuit 40. Since the change-over switch 60 makes the large discharge current of the discharging circuit 50 go out from the calibration capacitor 70 in the period of the high level "1" of the clock signal CLK, the calibration capacitor 70 can be discharged at high speed by the large discharge current of the discharging circuit 50.

The capacitance value of the calibration capacitor 70 and that of the filter capacitor 151 included in the channel selection filter 1 can be controlled by a multibit digital control signal 170 from the output of the search circuit 120. As illustrated in a right lower part of FIG. 3, the filter capacitor 151 included in the channel selection filter 1 includes a plurality of capacitors $C_n, C_{n-1}, \ldots C_1$ coupled in parallel, and a plurality of switches $SW_n, SW_{n-1}, \ldots SW_1$ are coupled in series to the plurality of capacitors $C_n, C_{n-1}, \ldots C_1$, respectively. The left capacitor $C_n$ has a capacitance value of the maximum weight, and the left switch $SW_n$ is on/off-controlled by the MSB (Most Significant Bit) of the multibit digital control signal 170. The capacitor $C_{n-1}$, second from left, has a capacitance value of the second weight, and the switch $SW_{n-1}$, second from left, is on/off-controlled by the second-highest-order bit of the multibit digital control signal 170. Similarly, the capacitor $C_1$ which is the "n"th from left has a capacitance value of the minimum weight, and the switch SW1 which is the n-th from left is on/off-controlled by the LSB (Least Significant Bit) of the multibit digital control signal 170. By the filter capacitor 151 controlled by the multibit digital control signal 170 from the search circuit 120, the cutoff frequency fc determining the filter character of the channel selection filter 1 is set.

The calibration capacitor 70 has the same configuration as that of the filter capacitor 151 included in the channel selection filter 1 or a configuration having the same ratio of weights of capacitance values, and is controlled by the same method as that of controlling the filter capacitor 151 included in the channel selection filter 1 by the multibit digital control signal 170 from the search circuit 120. As a result, a change in the capacitance value of the calibration capacitor 70 by the control of the multibit digital control signal 170 from the search circuit 120 becomes the same as that in the capacitance value of the filter capacitor 151 included in the channel selection filter 1.

The voltage comparator 80 detects the difference between the voltage level of the terminal voltage of the calibration capacitor 70 supplied to the non-inversion input terminal and that of the band gap reference voltage $V_{BRG}$ from the reference voltage generator 10 supplied to the inversion input terminal.

The latch 90 latches an output signal of the voltage comparator 80 in the period of the low level "0" of the clock signal CLK in response to the clock signal CLK, and an output signal of the voltage comparator 80 as determination of the charging speed of the calibration capacitor 70 charged with the charge current of the charging circuit 40 is latched by the latch 90. The number of times of determining the charging speed of the calibration capacitor 70 is equal to the number of bits of the multibit digital control signal 170 from the output of the search circuit 120. Results of determination of the charging speed performed a plurality of times during the calibration operation of the channel selection filter 1 shown in FIG. 3 are sequentially stored in a plurality of flip flops of the latch 90. The results stored in the plurality of flip flops of the latch 90 at the time of completion of the calibration operation are control information for tuning the filter illustrated in FIG. 1 to an ideal characteristic. During the calibration operation period, the search circuit 120 sequentially determines the information stored in the plurality of flip flops in the latch 90 for on/off controlling the plurality of switches $SW_n, SW_{n-1}, \ldots SW_1$ of the filter capacitor 151 in accordance with, for example, a predetermined search algorithm called the binary search. A time integrator is formed by the charging circuit 40 and the calibration capacitor 70, and tuning control information is generated from the results of determining the charging speed of a plurality of times as integral speed of a plurality of times during the calibration operation. The calibrating method of compensating a frequency characteristic of a filter provided in the semiconductor integrated circuit using the search algorithm called the binary search is described in Japanese Unexamined Patent Publication No. 2010-16591 filed by the inventors of the present invention. As the search algorithm in the search circuit 120, a search algorithm such as a linear search or a search according to the Newton method other than the binary search can be also used. In the case where the search circuit 120 measures the integration rate by counting the clock signals CLK, it is not always necessary to directly supply the clock signal CLK to the switch 60 and the latch 90. In this case, each time the determination of the charging speed is finished, in place of supplying the clock signal CLK, the calibration capacitor 70 is discharged, and the control signal can be supplied to the latch 90 so that the output signal of the voltage comparator 80 is latched by the latch 90.

Filter Capacitor in Channel Selection Filter

Figure 4:
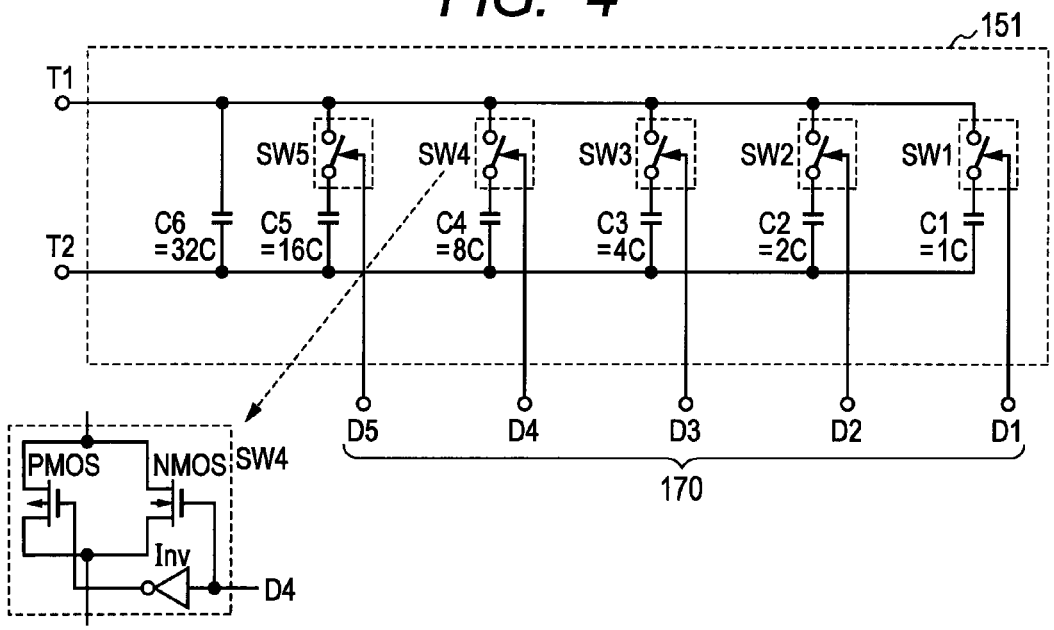
FIG. 4 is a diagram illustrating the configuration of a filter capacitor 151 of the channel selection filter 1 shown in FIG. 3.

FIG. 4 is a diagram illustrating the configuration of a filter capacitor 151 of the channel selection filter 1 shown in FIG. 3. As illustrated in FIG. 4, the filter capacitor 151 includes five capacitors C5, C4, C3, C2, and C1 coupled in parallel between first and second terminals T1 and T2, and five switches SW5, SW4, SW3, SW2, and SW1 are coupled in series to the five capacitors C5, C4, C3, C2, and C1, respectively.

One fixed capacitor C6 is coupled to the five capacitors C5 to C1. The leftmost fixed capacitor C6 has the largest weight 32C. The capacitor C5 second from the left has a capacitance value of the second largest weight 16C. The leftmost switch SW5 is on/off-controlled by a signal D5 of the most significant bit (MSB) of the multibit digital control signal 170. The capacitor C4 third from the left has a capacitance value of the third largest weight 8C. The switch SW4 second from the left is on/off-controlled by a signal D4 of the second highest bit of the multibit digital control signal 170. The capacitors C3 and C2 and the switches SW3 and SW2 are similarly configured. The capacitor C1 sixth from the left has a capacitance value of the smallest weight 1C. The switch SW1 fifth from the left is on/off-controlled by a signal D1 of the least significant bit (LSB) of the multibit digital control signal 170. By the capacitance value of the filter capacitor 151 controlled by the multibit digital control signal 170 from the search circuit 120, the cutoff frequency fc determining the filter characteristic of the channel selection filter 1 is set.

Each of the five switches SW5 to SW1 of the filter capacitor 151 in FIG. 4 is configured by, as illustrated in a left lower part, a P-channel MOS transistor PMOS and an N-channel MOS transistor NMOS which are coupled in parallel, and an inverter circuit Inv having a CMOS configuration. The five switches SW5 to SW1 are controlled to the on state by the high-level signals D5 to D1 of the multibit digital control signal 170.

The calibration capacitor 70 illustrated in FIG. 3 can be formed by a configuration quite similar to that of the filter capacitor 151 shown in FIG. 4.

The configuration of the filter capacitor is not limited to that of the filter capacitor 151 illustrated in FIG. 4. The multimode receiver compatible with the LTE method has a very wide range of varying the capacitance. For example, like the relations among the capacitor C5, the switch SW5, and the digital signal D5 in FIG. 4, by adding a digital signal D6 so as to be the MSB, a switch SW6 controlled by the digital signal D6 can be coupled to the capacitor C6 in series. In this case, the capacitor C6 can be also controlled by the multibit digital control signal 170, so that the capacitance of the larger variation range can be configured.

Resistance Circuit, Voltage-Current Converter, and Charging Circuit

Figure 5:
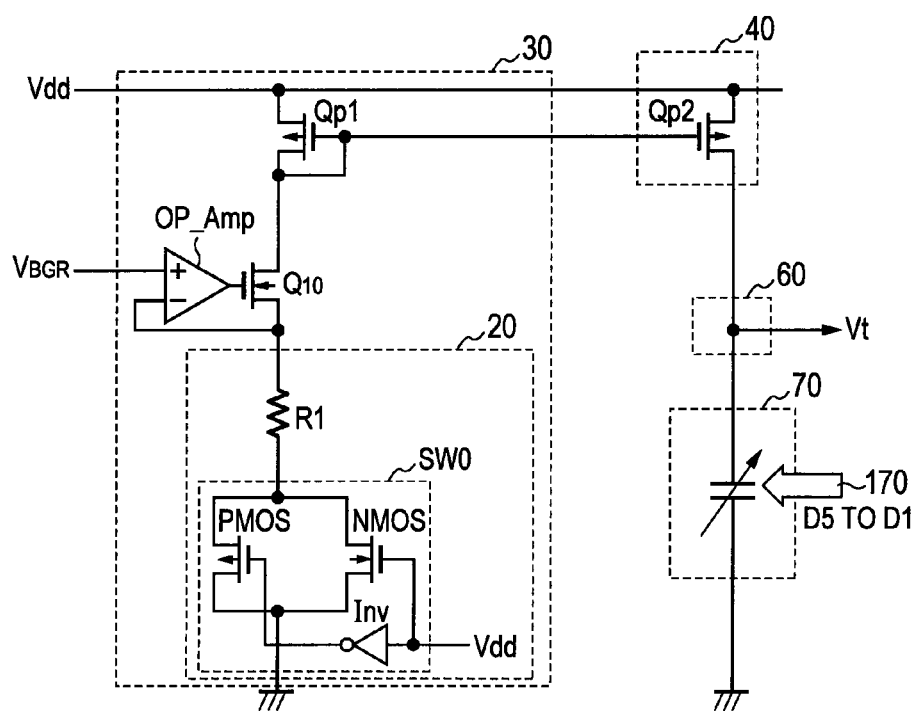
FIG. 5 is a diagram illustrating the configuration of a resistance circuit 20, a voltage-current converter 30, and a charging circuit 40 shown in FIG. 3.

FIG. 5 is a diagram illustrating the configuration of the resistance circuit 20, the voltage-current converter 30, and the charging circuit 40 shown in FIG. 3.

As illustrated in FIG. 5, the resistance circuit 20 is configured by serial coupling of the resistor R1 and the switch SW0, and the switch SW0 is configured by the P-channel MOS transistor PMOS and the N-channel MOS transistor NMOS which are coupled in parallel, and the inverter circuit Inv of the CMOS configuration. In the switch SW0, the high-level power supply voltage Vdd is supplied to the gate of the N-channel MOS transistor NMOS, and the low-level output signal of the inverter circuit Inv is supplied to the gate of the P-channel MOS transistor PMOS. Therefore, the N-channel MOS transistor NMOS and the P-channel MOS transistor PMOS in the switch SW0 are controlled to be always in the on state.

The switch SW0 in the resistance circuit 20 in FIG. 5 and the five switches SW5 to SW1 in the filter capacitor 151 in FIG. 2 can be manufactured simultaneously under the same manufacture conditions by the silicon CMOS manufacturing process of the semiconductor integrated circuit. Therefore, the on resistance of the CMOS switch of the switch SW0 in the resistance circuit 20 in FIG. 3 and that of the CMOS switch of the five switches SW5 to SW1 of the filter capacitor 151 in FIG. 2 are almost equal values.

As illustrated in FIG. 5, the voltage-current converter 30 is configured by a diode-coupled P-channel MOS transistor Qp1, an operational amplifier OP_Amp, an N-channel MOS transistor Q10, and the resistance circuit 20. The band gap reference voltage $V_{BRG}$ of the reference voltage generator 10 is supplied to the non-inversion input terminal (+) of the operational amplifier OP_Amp, the output terminal of the operational amplifier OP_Amp is coupled to the gate of the N-channel MOS transistor Q10, and the source of the N-channel MOS transistor Q10 and one end of the resistor R1 of the resistance circuit 20 are coupled to the inversion input terminal (−) of the operational amplifier OP_Amp. By the coupling of the gate and the drain, the P-channel MOS transistor Qp1 in the diode coupling form is coupled between the power supply voltage Vdd and the drain of the N-channel MOS transistor Q10.

As illustrated in FIG. 3, the charging circuit 40 is configured by a P-channel MOS transistor Qp2 coupled between the power supply voltage Vdd and the calibration capacitor 70. Across the source and the gate of the P-channel MOS transistor Qp2 of the charging circuit 40, the source/gate voltage of the diode-coupled P-channel MOS transistor Qp1 of the voltage-current converter 30 is supplied. Consequently, a current mirror is configured by the two P-channel MOS transistors Qp1 and Qp2. For example, by making the device sizes of the MOS transistors Qp1 and Qp2 the same, the charging current of the P-channel MOS transistor Qp2 of the charging circuit 40 can be set by conversion current I of the voltage-current converter 30 flowing in the voltage-current converter 30 and the resistance circuit 20 on the input side of the current mirror.

Terminal voltage Vt of the calibration capacitor 70 formed by the charging current of the P-channel MOS transistor Qp2 of the charging circuit 40 on the output side of the current mirror is supplied to the non-inversion input terminal of the voltage comparator 80. The N-channel MOS transistor Q10 can be replaced by an NPN transistor.

Calibration Operation of Filter Capacitor

Figure 6:
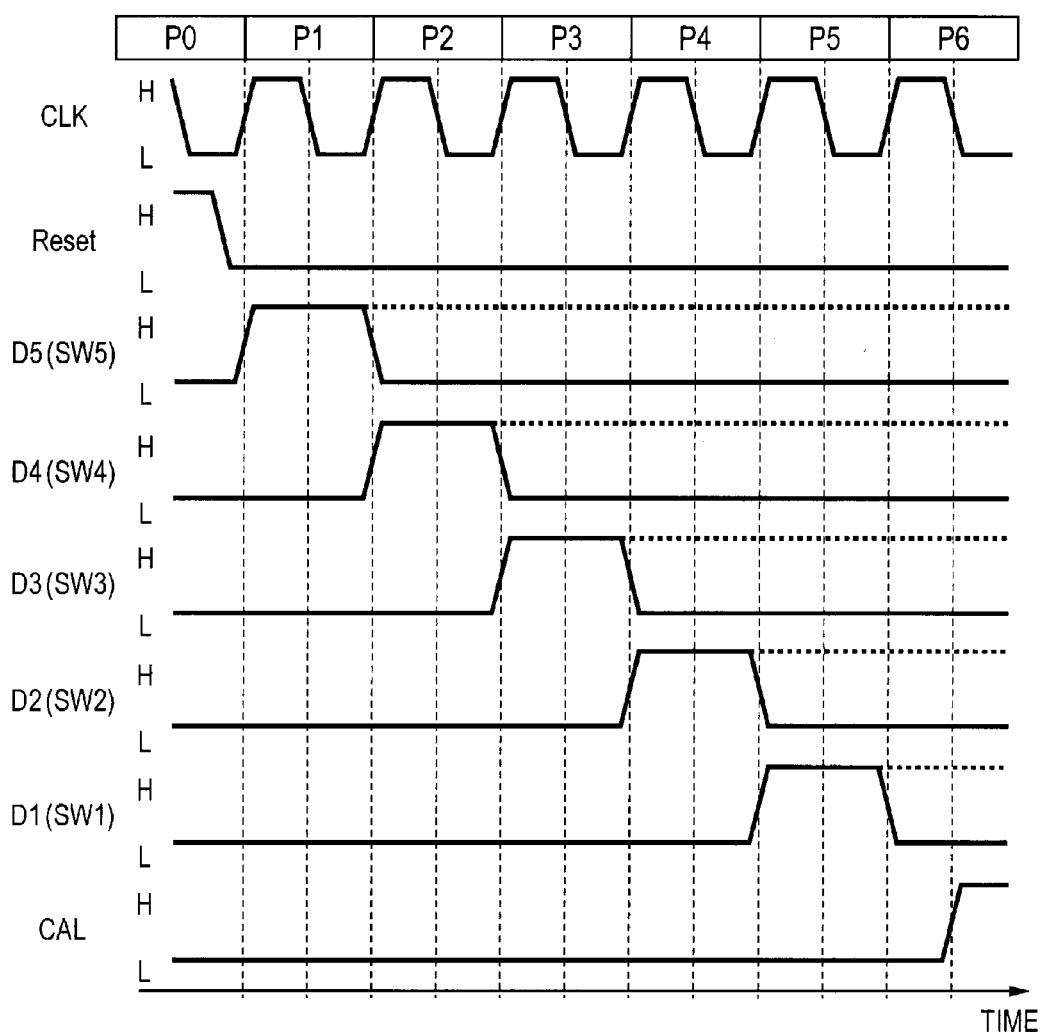
FIG. 6 is a diagram for explaining calibration operation for calibrating a capacitance value of the filter capacitor 151 of the channel selection filter 1 in FIG. 2 described with reference to FIG. 4.

FIG. 6 is a diagram explaining calibration operation for calibrating a capacitance value of the filter capacitor 151 of the channel selection filter 1 in FIG. 2 described with reference to FIG. 4.

As shown in an initialize period P0 of FIG. 6, in response to a calibration operation command which is not shown, a reset signal Reset of the high level H is generated from the reset circuit 110. In response to the high level H of the reset signal Reset, the plurality of flip flops of the latch 90 and the search circuit 120 are initialized. That is, all of non-inversion output signals of five bits from the flip flop D5 of the most significant bit (MSB) to the flip flop D1 of the least significant bit (LSB) included in the latch 90 are set to the initial state of the high level.

In a first period P1, the reset signal Reset becomes the low level L, the clock signal CLK of the high level H is generated from the clock supply circuit 100, and the calibration operation is started. First, in the first half of the first period P1, since the clock signal CLK is at the high level H, the calibration capacitor 70 is discharged at high speed by large discharge current of the discharging circuit 50. Next, in the latter half of the first period P1, since the clock signal CLK is at the low level L, the calibration capacitor 70 is charged with the charge current of the charging circuit 40. Each of the calibration capacitor 70 and the filter capacitor 151 of the channel selection filter 1 is configured only by the single fixed capacitor C6 having the capacitance value of the largest weight 32C illustrated in FIG. 4 in the initialize period P0.

It is assumed that the initial capacitance value of the fixed capacitor C6 of the calibration capacitor 70 is increased by a deviation in the silicon CMOS manufacture process of the semiconductor integrated circuit. In the latter half of the first period P1, the voltage level of the terminal voltage Vt of the calibration capacitor 70 supplied to the non-inversion input terminal of the voltage comparator 80 cannot exceed the voltage level of the reference voltage $V_{BRG}$ supplied to the inversion input terminal. Therefore, in the latter half of the first period P1, in response to the clock signal CLK of the low level L, the output signal of the low level L of the voltage comparator 80 is set in the flip flop D5 of the most significant bit (MSB) of the latch 90. The signal in the flip flop D5 changes from the high level H in the initial state to the low level L as shown by the solid line D5 (SW5) in FIG. 6. In this case, in the following second period P2, the switch SW5 is controlled to be in the off state by the low level L of the flip flop D5 of the latch 90, so that the initial value in the second period P2 of the calibration capacitor 70 is determined only by the fixed capacitor C6.

On the other hand, it is assumed that the initial capacitance value of the fixed capacitor C6 of the calibration capacitor 70 is decreased by a deviation in the silicon CMOS manufacture process of the semiconductor integrated circuit. In the latter half of the first period P1, the voltage level of the terminal voltage Vt of the calibration capacitor 70 supplied to the non-inversion input terminal of the voltage comparator 80 exceeds the voltage level of the reference voltage $V_{BRG}$ supplied to the inversion input terminal. Therefore, in the latter half of the first period P1, the output signal of the voltage comparator 80 becomes the high level H. In the latter half of the first period P1, in response to the clock signal CLK of the low level L, the output signal of the high level H of the voltage comparator 80 is set in the flip flop D5 of the most significant bit (MSB) of the latch 90. The signal in the flip flop D5 of the most significant bit (MSB) of the latch 90 is maintained in the initial state of the high level H as shown by the solid line D5 (SW5) in FIG. 6. In this case, in the following second period P2, the switch SW5 is controlled to be in the on state by the high level H of the flip flop D5 of the latch 90, so that the initial value in the second period P2 of the calibration capacitor 70 becomes the capacitance obtained by adding the capacitance value of the weight 16C of the capacitor C5 to the fixed capacitor C6.

In a second period P2, depending on the above-described operation in the first period P1, there are two cases; a case where the initial capacitance value of the calibration capacitor 70 is only the capacitance value of the fixed capacitor C6, and a case where the capacitance value of the weight 16C of the capacitor C5 is added to the capacitance value of the fixed capacitor C6.

The digital signals D4 ton for adjusting the capacitance value of the calibration capacitor 70 from the second period P2 to the fifth period P5 are controlled in a manner similar to the control in the first period P1.

In such a manner, by the operations from the first period P1 to the fifth period P5 in the calibration operation started from the initialize period P0, the values in the flip flops from the flip flop D5 of the most significant bit to the flip flop D1 of the least significant bit are set. By the values in the flip flops D5 to D1 of five bits in the latch 90, the capacitance value of the filter capacitor 151 of the channel selection filter 1 in the normal operation period after the calibration operation is determined. That is, for the capacitance value of the filter capacitor 151, whether the capacitors C5 to C1 are added to the fixed capacitor C6 in FIG. 4 or not is determined by the values of the flip flops D5 to D1 of five bits in the latch 90.

In the latter half of the sixth period P6, a calibration end signal CAL of the high level H is generated from the calibration end control circuit 160. In response to the change from the low level L to the high level H of the calibration end signal CAL in the latter half of the sixth period P6, the on/off control on the five switches SW5 to SW1 of the filter capacitor 151 of the channel selection filter 1 can be finally determined. That is, in response to the change from the low level L to the high level H of the signal CAL, the values of the five bits in the latch 90 can be transferred to the flip flops of five bits of another latch which finally determines the on/off control of the five switches SW5 to SW1 of the filter capacitor 151 of the channel selection filter 1.

The calibration method of compensating a frequency characteristic of the filter provided in the semiconductor integrated circuit using the search algorithm according to the binary search as described above is described in Japanese Unexamined Patent Application No. 2010-16591 filed by the inventors of the present invention. As the search algorithm in the search circuit 120, another search algorithm such as a linear search or a search according to the Newton method other than the binary search can be also used. In this case, the operation sequence of FIG. 6 is changed according to the search algorithm.

Frequency Characteristic Calibrating Operation

FIG. 10 is a diagram for explaining operation of calibrating a frequency characteristic of the filter circuit 1 as the channel selection filter provided in the semiconductor integrated circuit according to the first embodiment of the invention illustrated in FIGS. 1 and 2.

As illustrated in FIG. 10, after the frequency characteristic calibrating operation starts in step S0, the cutoff frequency calibration circuit 2 compensates the capacitance values C of the capacitors C1 and C2 to accurate values so that the cutoff frequency fc is not influenced by device variations in the semiconductor integrated circuit in the first step S1, thereby setting the cutoff frequency fc expressed by the above equation (8) in a desired baseband signal bandwidth of the LTE method. The details of the cutoff frequency compensating operation executed in the first step S1 are as described above with reference to FIGS. 3 to 6.

After that, the Q-factor calibration circuit 3 adjusts the resistance value of the feedback resistor R3 so that the Q factor is not influenced by device variations in the semiconductor integrated circuit in the following step S2, thereby setting the Q factor expressed by the equation (7) to a desired value.

Q-factor Compensating Operation

Figures 7, 8:
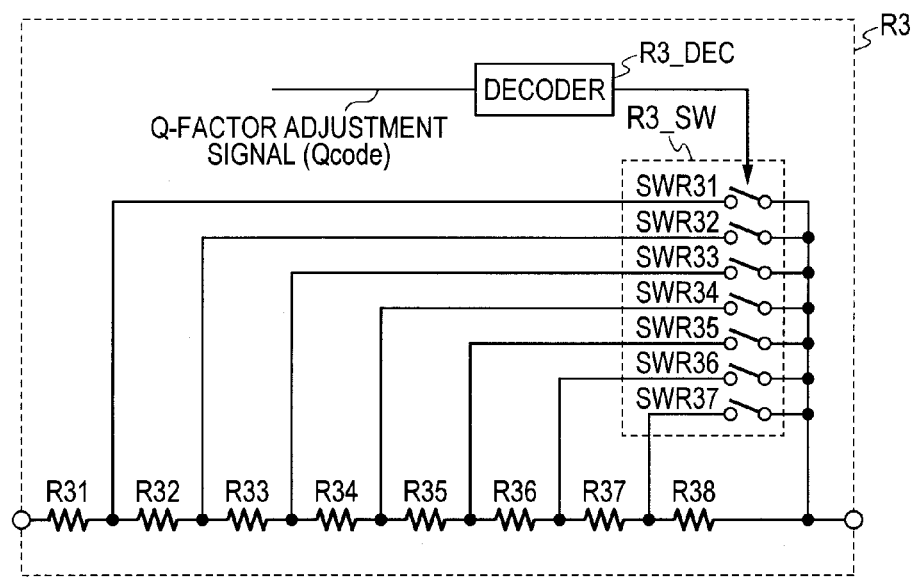
FIG. 7 is a diagram illustrating the configuration of a feedback resistor R3 of an imperfect integrator in the second stage of the filter circuit 1 as the channel selection filter adjusted by the Q-factor calibration circuit 3 of the semiconductor integrated circuit according to the first embodiment of the invention shown in FIGS. 1 and 2.
FIG. 8 is a diagram illustrating the relation between a Q code Qcode as a Q-factor adjustment signal supplied to a decoder R3_DEC of the feedback resistor R3 in the imperfect integrator in the second stage of the filter circuit 1 according to the first embodiment of the invention shown in FIG. 7 and the resistance value of the feedback resistor R3.

FIG. 7 is a diagram illustrating the configuration of the feedback resistor R3 of the imperfect integrator in the second stage of the filter circuit 1 as the channel selection filter adjusted by the Q-factor calibration circuit 3 of the semiconductor integrated circuit according to the first embodiment of the invention shown in FIGS. 1 and 2.

As illustrated in FIG. 7, the feedback resistor R3 in the filter circuit 1 includes a plurality of resistors R31, R32, ... and R38, a change-over switch R3_SW, and a decoder R3_DEC. Further, the change-over switch R3_SW includes a plurality of switches SWR31, SWR32, ... and SWR37. The Q code Qcode as a Q-factor adjustment signal generated from the Q-factor calibration circuit 3 is supplied to the input terminal of the decoder R3_DEC. The on/off state of the plurality of switches SWR31, SWR32, ... SWR37 in the change-over s witch R3_SW is controlled by a decode output signal of the decoder R3_DEC.

The eight resistors R31, R32, ..., and R38 are coupled in series between both terminals of the feedback resistor R3. The first switch SWR31 is coupled between a first common coupling point of the first and second resistors R31 and R32 and the other terminal of the feedback resistor R3. The second switch SWR32 is coupled between a third common coupling point of the second and third resistors R32 and R33 and the other terminal of the feedback resistor R3. Similarly, the third to six switches are coupled. The seventh switch SWR37 is coupled between a seventh common coupling point of the seventh and eighth resistors R37 and R38 and the other terminal of the feedback resistor R3.

FIG. 8 is a diagram illustrating the relation between a Q code Qcode as a Q-factor adjustment signal supplied to the decoder R3_DEC of the feedback resistor R3 in the imperfect integrator in the second stage of the filter circuit 1 according to the first embodiment of the invention shown in FIG. 7 and the resistance value of the feedback resistor R3.

FIG. 9 is a diagram illustrating the relation among resistance values of the plurality of resistors R31, R32, ..., and R38 of the feedback resistor R3 of the imperfect integrator in the second stage of the filter circuit 1 according to the first embodiment of the invention shown in FIG. 7.

As illustrated in FIG. 8, the Q code Qcode as the Q-factor adjustment signal generated from the Q-factor calibration circuit 3 changes from 0 as the minimum value to 7 as the maximum value. In the change-over switch R3_SW, only the first switch SWR31 is turned on in response to the Q code Qcode of the minimum value. The adjustment resistance of the feedback resistor R3 is set by the resistance value of the first resistor R31. In response to the Q code Qcode of 1 as the second largest value, only the second switch SWR32 is turned on, so that the adjustment resistance of the feedback resistor R3 is set by a total resistance value of the first and second resistors R31 32. Similarly, in response to the Q code Qcode of 7 as the maximum value, all of the plurality of switches SWR31, SWR32, ..., and SWR37 of the change-over switch R3_SW are turned off. Consequently, the adjustment resistance of the feedback resistor R3 is set by the total resistance value of all of the first to seventh resistors R31 to R37.

Therefore, when the resistance value of the input resistor R2 of the imperfect integrator in the second stage of the filter circuit 1 according to the first embodiment of the invention illustrated in FIG. 7 is set to 5 kΩ, the Q factor given by the relation of Q=R3/R2 of the equation (7) can be adjusted in 1 dB steps from 8 dB as the smallest value to 15 dB as the largest value as illustrated in FIG. 8.

In the example shown in FIG. 7, as the control method for varying the value of the resistor R3, the resistors coupled in series are switched. However, the invention is not limited to the configuration. The resistors coupled in parallel can be switched. In this case, to configure a resistor having the same adjustment variable width as that of FIG. 7, the total resistance value and the semiconductor chip area increase. On the other hand, since the resistance value is large, the influence of the on resistance of the change-over switch is small, and high precision can be achieved. To achieve both small area and high precision, the resistors can be switched between serial coupling and parallel coupling.

Generation of Q-factor Adjustment Input Signal

FIG. 11 is a diagram for explaining a state where the control circuit 51 of the Q-factor calibration circuit 3 generates a Q-factor adjustment input signal in the Q-factor compensating operation in step S2 in the operation of calibrating a frequency characteristic of the filter circuit 1 of the semiconductor integrated circuit according to the first embodiment of the invention illustrated in FIG. 10.

As illustrated in FIG. 11, the Q-factor adjustment input signal generating operation is started in step S10.

In the first step S11, the relation "Vinpk=common mode voltage Vc+amplitude Vpk1" is set (where Vinpk denotes the peak voltage of the input signal voltage Vin as the Q-factor adjustment input signal). The voltage setting continues during the cycle ½fc of the cutoff frequency fc in step S12.

In the subsequent step S13, the relation "Vinpk=Vc−amplitude Vpk1" is set (where Vinpk denotes the peak voltage of the input signal voltage Vin as the Q-factor adjustment input signal). The voltage setting continues in the cycle ½fc of the cutoff frequency fc in step S14 and, after that, the Q-factor adjustment input signal generating operation is finished in step S15. As a result, by the Q-factor adjustment input signal generating operation illustrated in FIG. 11, the Q-factor adjustment input signal Vin of one cycle can be generated.

Details of Q-factor Compensating Operation

FIG. 12 is a diagram for explaining, more specifically, the Q-factor compensating operation in step S2 in the operation of calibrating the frequency characteristic of the filter circuit 1 of the semiconductor integrated circuit according to the first embodiment of the invention illustrated in FIG. 10.

As illustrated in FIG. 12, the Q-factor compensating operation starts in step S120.

In step S121, by the switch control signal from the Q-factor calibration circuit 3 supplied to the switch control terminal of the input change-over switch SW10, the Q-factor adjustment input signal from the Q-factor calibration circuit 3 to be supplied to the other input terminal of the input change-over switch SW10 is selected and supplied to the input terminal of the filter circuit 1.

In step S122, the control circuit 51 of the Q-factor calibration circuit 3 sets the Q code Qcode as a Q-factor adjustment signal to the value of four. The Q code Qcode of 4 is an intermediate value between the smallest value 0 and the largest value 7 of the Q code Qcode shown in FIG. 8.

In step S123, the control circuit 51 of the Q-factor calibration circuit 3 sets the initial value of the M value to 1. The M value can be designated from the smallest value 0 to the largest value 7 of the Q code Qcode shown in FIG. 8 by the Q-factor adjustment signal of three bits supplied to the decoder R3_DEC of the feedback resistor R3 of the filter circuit 1 according to the first embodiment of the invention illustrated in FIG. 7. The change from the intermediate value 4 to the largest value 7 of the Q code Qcode set in step S122 can be made by increasing, three times, the Q code Qcode which changes step by step. On the other hand, the change from the intermediate value 4 to the smallest value 0 of the Q code Qcode set in step S122 can be made by decreasing, four times, the Q code Qcode which changes step by step. To execute the increase of three times or decrease of three times in a loop process from step S124 to step S132 and execute decrease of the fourth time in step S134, the M value is set to the initial value 1 in step S123.

In step S124, the control circuit 51 of the Q-factor calibration circuit 3 sets the initial value of the N value to 1. That is, the loop process from step S125 to step S127 is a process for waiting for generation of the Q-factor adjustment input signal Vin of the N cycles by the Q-factor adjustment input signal generating operation illustrated in FIG. 11.

In step S125, by executing the Q-factor adjustment input signal generating operation illustrated in FIG. 11, the Q-factor adjustment input signal Vin of one cycle is generated.

In step S126, whether the N value is equal to or larger than a specified value or not is determined by the control circuit 51 of the Q-factor calibration circuit 3. For example, when the specified value of the N value is set to 2, the first determination result in step S126 is "NO". Consequently, in step S127, the N value is incremented by one by the control circuit 51 of the Q-factor calibration circuit 3. Since the program shifts to step S125 after the process in step S127, by execution of the Q-factor adjustment input signal generating operation shown in FIG. 11 in the process in step S125 of the second time, the Q-factor adjustment input signal Vin of one cycle is generated.

Since the determination result of the second time in step S126 becomes "YES", the program goes to step S128. In step S128, whether the M value is equal to or less than the number of bits of the Q code Qcode or not is determined by the control circuit 51 of the Q-factor calibration circuit 3. Before the M value obtained by the process of incrementing M by one in step S132 becomes four, the determination result in step S128 is inevitably "YES", and the program shifts to step S129.

In step S129, during the cycle L/fc, whether or not the output signal peak voltage Voutpk of the filter circuit 1 given by the equation (12) exceeds the reference voltage VrefQ of the reference voltage generator Ref50 given by the equation (13) is determined by the Q-factor calibration circuit 3. In the case where it is determined in step S129 that the output signal peak voltage Voutpk exceeds the reference voltage VrefQ during the cycle L/fc, the program advances to step S130. On the other hand, in the case where it is determined in step S129 that the output signal peak voltage Voutpk does not exceed the reference voltage VrefQ, the program advances to step S131.

In step S130, since it is determined in step S129 that the output signal peak voltage Voutpk is larger than the reference voltage VrefQ, the Q code Qcode is decremented by one by the control circuit 51 of the Q-factor calibration circuit 3 in order to decrease the output signal peak voltage Voutpk of the filter circuit 1. Therefore, the resistance value of the feedback resistor R3 of the imperfect integrator in the second stage of the filter circuit 1 as the channel selection filter of the semiconductor integrated circuit according to the first embodiment of the invention shown in FIG. 7 is decreased by one step. As a result, the Q factor expressed by Q=R3/R2 in the equation (7) and shown in FIG. 8 is decreased by one step. Consequently, the output signal peak voltage Voutpk of the filter circuit 1 determined in the following step S129 is decreased.

In step S131, since it is determined in step S129 that the output signal peak voltage Voutpk is smaller than the reference voltage VrefQ, the Q code Qcode is incremented by one by the control circuit 51 of the Q-factor calibration circuit 3 in order to increase the output signal peak voltage Voutpk of the filter circuit 1. Therefore, the resistance value of the feedback resistor R3 of the imperfect integrator in the second stage of the filter circuit 1 as the channel selection filter of the semiconductor integrated circuit according to the first embodiment of the invention shown in FIG. 7 is increased by one step. As a result, the Q factor expressed by Q=R3/R2 in the equation (7) and shown in FIG. 8 is increased by one step. Consequently, the output signal peak voltage Voutpk of the filter circuit 1 determined in the following step S129 is increased.

After the process in step S130 or the process in step S131, the program moves to the process of "M=M+1" in S132, the loop process from step S124 to step S132 is additionally executed only by twice, and the Q code Qcode, the feedback resistor R3, and the output signal peak voltage Voutpk of the filter circuit 1 are further changed only by twice. After that, the M value becomes four by the process of incrementing M by one in step S132, so that the determination result in step S128 becomes inevitably "NO", and the program shifts to step S133.

In step S133, during the cycle L/fc, whether or not the output signal peak voltage Voutpk of the filter circuit 1 given by the equation (12) exceeds the reference voltage VrefQ of the reference voltage generator Ref50 given by the equation (13) is determined by the Q-factor calibration circuit 3. In the case where it is determined in step S133 that the output signal peak voltage Voutpk exceeds the reference voltage VrefQ during the cycle L/fc, the program advances to step S134. On the other hand, in the case where it is determined in step S133 that the output signal peak voltage Voutpk does not exceed the reference voltage VrefQ, the program advances to step S135.

In step S134, since it is determined in step S133 that the output signal peak voltage Voutpk is still larger than the reference voltage VrefQ in spite of the fact that the Q code Qcode, the feedback resistor R3, and the output signal peak voltage Voutpk of the filter circuit 1 are decreased three times in total by the loop process of total three times from step S124 to step S132, the Q code Qcode is finally decremented by one by the control circuit 51 of the Q-factor calibration circuit 3 in order to decrease the output signal peak voltage Voutpk of the filter circuit 1, and the Q code Qcode is set to the smallest value 0 of the Q code Qcode. Therefore, the resistance value of the feedback resistor R3 of the imperfect integrator in the second stage of the filter circuit 1 as the channel selection filter of the semiconductor integrated circuit according to the first embodiment of the invention shown in FIG. 7 is decreased to the smallest resistance value corresponding to the minimum value 0 of the Q code Qcode.

In step S135, since it is determined in step S133 that the output signal peak voltage Voutpk is smaller than the reference voltage VrefQ in spite of the fact that the Q code Qcode, the feedback resistor R3, and the output signal peak voltage Voutpk of the filter circuit 1 are increased three times in total by the loop process of total three times from step S124 to step S132, it is desired to increase the output signal peak voltage Voutpk of the filter circuit 1. However, since the Q code Qcode has already changed from the initial value 4 to the largest value 7 by this time point, it is impossible to increase the Q code Qcode. Therefore, in step S135, the control circuit 51 of the Q-factor calibration circuit 3 sets the Q code Qcode of the largest value 7 which is set by the loop process of total three times from step S124 to step S132.

After the process of step S134 or the process of step S135, in step S136, the baseband input signal generated from a reception mixer of the direct conversion multimode receiver supplied from one of the input terminals of the input change-over switch SW10 is selected by the switch control signal from the Q-factor calibration circuit 3 which is supplied to the switch control terminal of the input change-over switch SW10, and the selected signal is supplied to the input terminal of the filter circuit 1. After the process of step S136, the Q-factor compensating operation is finished in step S137.

The specified value of the N value in step S126 indicates the number of cycles in which the Q-factor adjustment input signal Vin is supplied previously to the determination in step S129 or S133. The smaller the value is, the more the time of Q calibration can be shortened. On the other hand, when the Q code Qcode is switched by the process of steps S130 and S131, the output signal peak voltage Voutpk of the filter circuit 1 responding to the Q-factor adjustment input signal Vin is not stabilized at the value given by the equation (12) due to the influence of the switching, an error may occur. To prevent the error, the specified value of the N value is set to two or larger.

The value L in steps S129 and S133 indicates a determination cycle of determining whether the output signal peak voltage Voutpk of the filter circuit 1 given by the equation (12) by the Q-factor calibration circuit exceeds the reference voltage VrefQ of the reference voltage generator Ref50 given by the equation (13). When the value L is set to be too large, the probability of erroneous determination that the output signal peak voltage Voutpk of the filter circuit 1 exceeds the reference voltage VrefQ of the reference voltage generator Ref50 given by the expression (13) due to external noise or the like increases. On the contrary, when the value L is less than 1, it is erroneously determined that the output signal peak voltage Voutpk does not always exceed the reference voltage VrefQ. When the value is too large, the process time of the Q-factor compensating operation becomes longer. Consequently, the value L is set to a value which is at least exceeding 1.

Preferably, the frequency of the Q-factor adjustment input signal in the embodiment is the same as the cutoff frequency of the filter circuit 1 but they do not have to be strictly the same. The frequency of the Q-factor adjustment input signal is determined by the process time in steps S12 and S14 in FIG. 11. The process time in steps S12 and S14 is generally regulated by the semiconductor integrated circuit and an external clock signal. Therefore, it is difficult to make the frequency of the Q-factor adjustment input signal match the cutoff frequency fc of the filter circuit 1. Even if it is attempted to make the frequency of the Q-factor adjustment input signal match the cutoff frequency fc, there is the case that it is difficult to set the duty ratio of the Q-factor adjustment input signal to 50% due to the difference between the process time in step S12 and that in step S14. However, the error in the frequency of the Q-factor adjustment input signal is about ±−20%. Even if a change in the duty ratio of the Q-factor adjustment input signal is about 60% to 40%, the Q-factor calibration can be executed. In this case, even if the output signal peak voltage Voutpk of the filter circuit 1 given by the equation (12) becomes the same as the reference voltage VrefQ of the reference voltage generator Ref50 given by the above equation (13), an error from a desired Q value occurs. However, an error amount from the desired Q value is constant, so that the Q code Qcode can be adjusted to compensate an error amount. The Q code Qcode can be adjusted by, for example, adding/subtracting a predetermined value to/from the Q code Qcode determined by the Q-factor compensating operation illustrated in FIG. 12.

Second Embodiment

Another Configuration of Semiconductor Integrated Circuit

Figure 13:
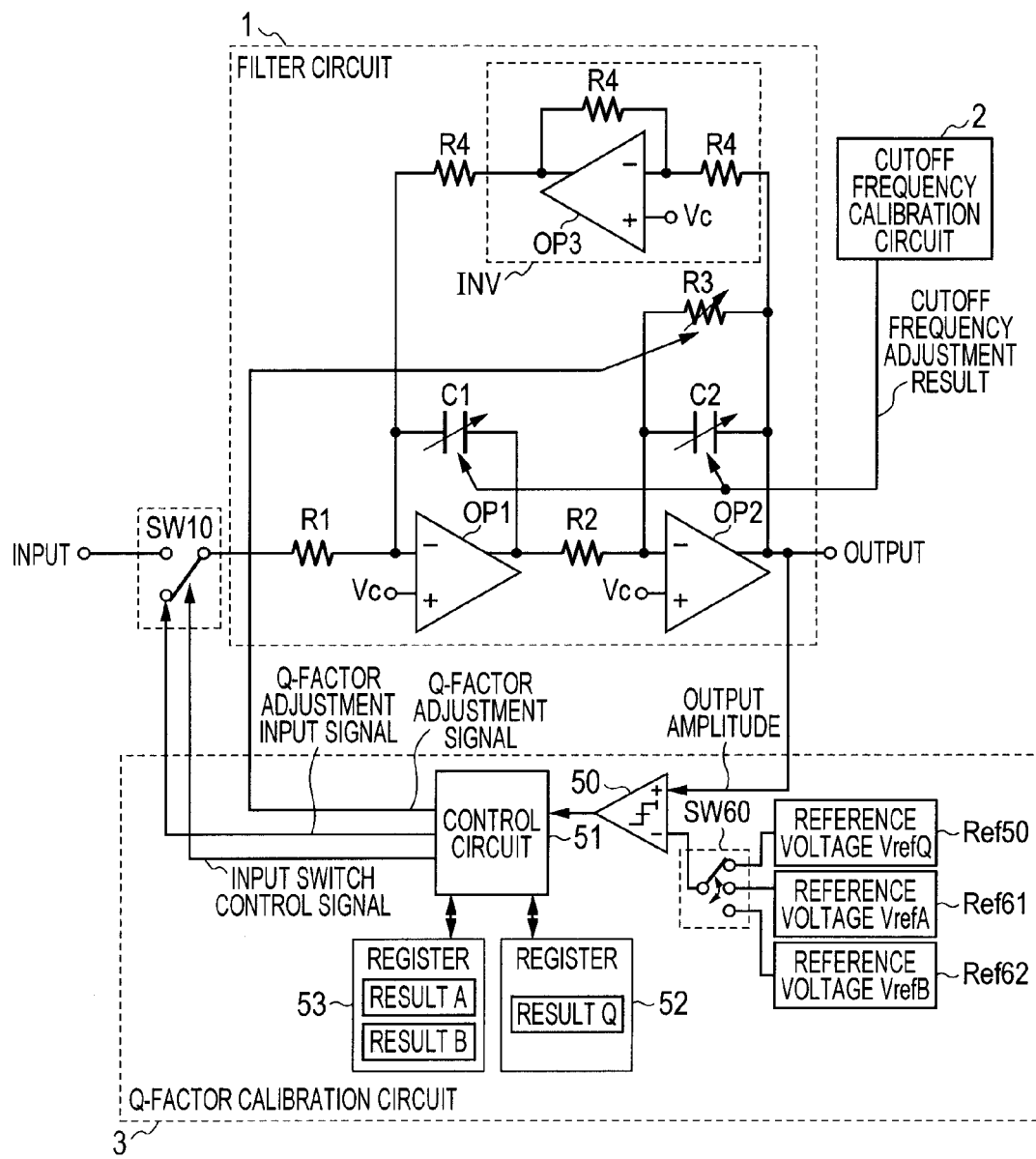
FIG. 13 is a diagram illustrating another configuration of a semiconductor integrated circuit according to a second embodiment of the present invention, including the filter circuit 1 as a channel selection filter for a direct conversion multimode receiver compatible with the long term evolution (LTE) method, and the cutoff frequency calibration circuit 2 and the Q-factor calibration circuit 3 for setting a frequency characteristic of the filter circuit 1.

FIG. 13 is a diagram illustrating another configuration of a semiconductor integrated circuit according to a second embodiment of the present invention, including the filter circuit 1 as a channel selection filter for a direct conversion multimode receiver compatible with the long term evolution (LTE) method, and the cutoff frequency calibration circuit 2 and the Q-factor calibration circuit 3 for setting a frequency characteristic of the filter circuit 1.

The semiconductor integrated circuit according to the second embodiment of the invention illustrated in FIG. 13 is different from that according to the first embodiment of the invention illustrated in FIG. 2 with respect to the following point.

The Q-factor calibration circuit 3 of the semiconductor integrated circuit according to the first embodiment of the invention illustrated in FIG. 2 includes the amplitude comparator 50 for comparing the output amplitude of the filter circuit 1 and the reference voltage VrefQ of the reference voltage generator Ref50, the control circuit 51 to which the amplitude comparison result of the amplitude comparator 50 is supplied, and the control register 52 storing Q-factor control information. On the other hand, for the Q-factor calibration circuit 3 of the semiconductor integrated circuit according to the second embodiment of the invention illustrated in FIG. 13, three reference voltage generators Ref50, Ref61, and Ref62, two control registers 52 and 53, and a change-over switch SW60 are used.

That is, in the semiconductor integrated circuit according to the second embodiment of the invention illustrated in FIG. 13, it is considered that the output signal peak voltage Voutpk of the filter circuit 1 depends on not only the Q factor as given by the equation (12) but also the direct-current gain DCgain given by the equation (9). When the DC gain DCgain of the filter circuit 1 given by "DCgain=R2/R1" in the equation (9) fluctuates due to device variations, the output signal peak voltage Voutpk of the filter circuit 1 given by "Voutpk=Vc+DCgain·Q·Vpk1 in the equation (12) fluctuates.

Therefore, in the semiconductor integrated circuit according to the second embodiment of the invention illustrated in FIG. 13, previously to the Q-factor compensating operation, an input signal compensating operation of compensating a fluctuation in the DC gain DCgain of the filter circuit 1 by adjusting the input signal peak voltage Vinpk of the Q-factor adjustment input signal is executed. Specifically, in the Voutpk=Vc+DCgain·Q·Vpk1 of the equation (12), a fluctuation in the DC gain DCgain is cancelled off by a change in the input signal peak voltage Vinpk. Therefore, the fluctuation amount of the DC gain DCgain and the change amount in the input signal peak voltage Vinpk are set to the same absolute value in the opposite signs. In the semiconductor integrated circuit according to the second embodiment of the invention illustrated in FIG. 13, the input signal compensating operation previous to the Q-factor compensating operation is executed next to the cut-off frequency compensating operation of step S1 of the operation of calibrating a frequency characteristic of the filter circuit 1 illustrated in FIG. 10.

In the semiconductor integrated circuit according to the second embodiment of the invention illustrated in FIG. 13, to execute the input signal compensating operation, adjustment of the input signal peak voltage Vinpk of the Q-factor adjustment input signal is executed by "the peak voltage Vinpk+ of positive amplitude=common mode voltage Vc+amplitude Vpk1+" and "the peak voltage Vinpk−=common mode voltage Vc+amplitude Vpk1−".

For adjustment of the input signal peak voltage Vinpk+ having the positive amplitude of the Q-factor adjustment input signal, the reference voltage VrefA generated from the reference voltage generator Ref61 is used. For adjustment of the input signal peak voltage Vinpk− having the negative amplitude of the Q-factor adjustment input signal, the reference voltage VrefB generated from the reference voltage generator Ref62 is used. An intermediate voltage between the reference voltages VrefA and VrefB is set to the voltage level of the common mode voltage Vc supplied to the non-inversion input terminals of the operational amplifiers OP1 and OP2 of the filter circuit 1.

Figure 17:
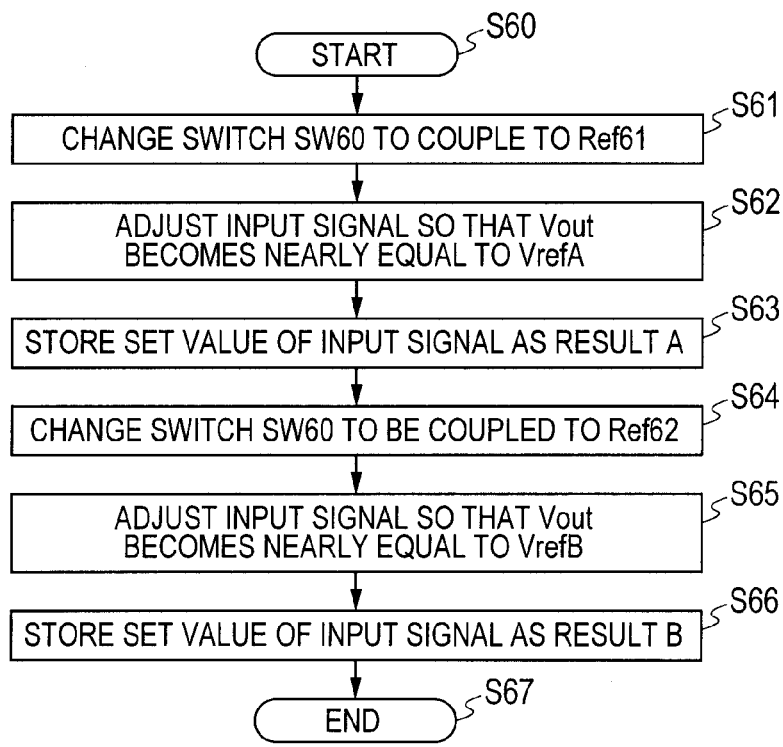
FIG. 17 is a diagram illustrating a state where input signal compensating operation for reducing fluctuation in the output signal peak voltage Voutpk of the filter circuit 1 is executed in the semiconductor integrated circuit according to the second embodiment of the invention illustrated in FIG. 13.

FIG. 17 is a diagram illustrating a state where input signal compensating operation for reducing fluctuation in the output signal peak voltage Voutpk of the filter circuit 1 is executed in the semiconductor integrated circuit according to the second embodiment of the invention illustrated in FIG. 13.

As illustrated in FIG. 17, the input signal compensating operation starts in step S60.

In step S61, in the semiconductor integrated circuit according to the second embodiment of the invention illustrated in FIG. 13, the reference voltage VrefA generated from the reference voltage generator Ref61 for adjusting the input signal peak voltage Vinpk+ having positive amplitude of the Q-factor adjustment input signal is supplied to the non-inversion input terminal of the amplitude comparator 50 via the change-over switch SW60.

In step S62, during a period considerably longer than the cycle ½fc of the cutoff frequency fc of the filter circuit 1, the peak voltage Vinpk+ of the positive amplitude of the Q-factor adjustment input signal=common mode voltage Vc+ amplitude Vpk1+ is supplied to the input terminal of the filter circuit 1 via the input change-over switch SW10. Therefore, the filter circuit 1 DC-amplifies the peak voltage having the positive amplitude of the Q-factor adjustment input signal in accordance with the DC gain DCgain given by the DCgain=R2/R1 of the equation (9). At this time, the output signal peak voltage Voutpk+ of the output voltage signal having the positive amplitude generated from the output terminal of the filter circuit 1 is expressed as follows.

$$Voutpk+ = Vc + DCgain \cdot Vpk1+ \qquad \text{Equation (15)}$$

The amplitude Vpk1+ as the positive amplitude of the Q-factor adjustment input signal is set by the output signal of the amplitude comparator 50 so that the output signal peak voltage Voutpk+ of the output voltage signal having positive amplitude given by the equation (15) matches the reference voltage VrefA generated from the reference voltage generator Ref61. The set value is stored as a setting result A in the control register 53. In response to the setting result A stored in the control register 53, the control circuit 51 of the Q-factor calibration circuit 3 adjusts the positive amplitude Vpk1+ in the peak voltage Vinpk having the positive amplitude of the Q-factor adjustment input signal=common mode voltage Vc+ amplitude Vpk.

Therefore, in step S63, the setting result A is stored in the control register 53 of the Q-factor calibration circuit 3.

In step S64, in the semiconductor integrated circuit according to the second embodiment of the invention illustrated in FIG. 13, the reference voltage VrefB generated from the reference voltage generator Ref62 is supplied for adjustment of the input signal peak voltage Vinpk– of the negative amplitude of the Q-factor adjustment input signal to the non-inversion input terminal of the amplitude comparator 50 via the change-over switch SW60.

In step S65, during a period considerably longer than the cycle ½fc of the cutoff frequency fc of the filter circuit 1, the peak voltage Vinpk– of the negative amplitude of the Q-factor adjustment input signal=common mode voltage Vc– amplitude Vpk1– is supplied to the input terminal of the filter circuit 1 via the input change-over switch SW10. Therefore, the filter circuit 1 DC-amplifies the peak voltage of the negative amplitude of the Q-factor adjustment input signal in accordance with the DC gain DCgain given by the DCgain=R2/R1 of the equation (9). At this time, the output signal peak voltage Voutpk– of the output voltage signal having the negative amplitude generated from the output terminal of the filter circuit 1 is expressed as follows.

$$V\text{outpk–}=Vc–DC\text{gain}\cdot V\text{pkl–} \quad \text{Equation (16)}$$

The negative amplitude Vpk1– of the Q-factor adjustment input signal is set by the output signal of the amplitude comparator 50 so that the output signal peak voltage Voutpk– of the output voltage signal having negative amplitude given by the equation (16) matches the reference voltage VrefB generated from the reference voltage generator Ref62. The set value is stored as a setting result B in the control register 53. In response to the setting result B stored in the control register 53, the control circuit 51 of the Q-factor calibration circuit 3 adjusts the negative amplitude Vpk1– in "the peak voltage Vinpk– having the negative amplitude of the Q-factor adjustment input signal=common mode voltage Vc– amplitude Vpk–".

Therefore, in step S66, the setting result B is stored in the control register 53 of the Q-factor calibration circuit 3. In the final step S67, the input signal compensating operation is finished.

Figure 15:
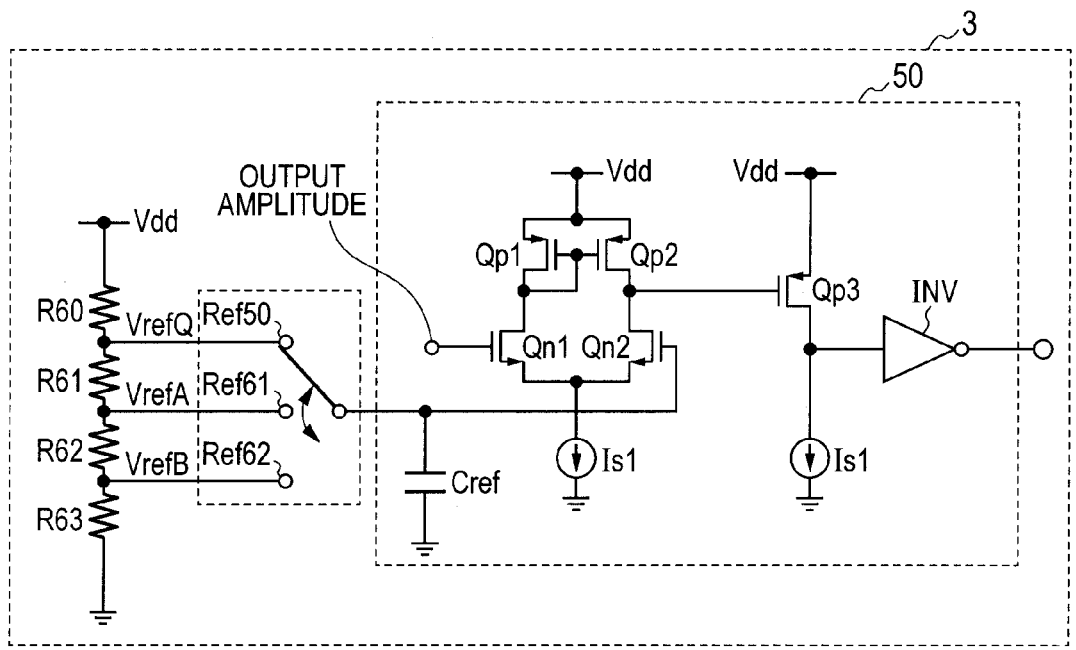
FIG. 15 is a diagram illustrating the configuration of three reference voltage generators Ref50, Ref61, and Ref62, a change-over switch SW60, and an amplitude comparator 50 included in the Q-factor calibration circuit 3 of the semiconductor integrated circuit according to the second embodiment of the invention shown in FIG. 13.

FIG. 15 is a diagram illustrating the configuration of three reference voltage generators Ref50, Ref61, and Ref62, the change-over switch SW60, and the amplitude comparator 50 included in the Q-factor calibration circuit 3 of the semiconductor integrated circuit according to the second embodiment of the invention shown in FIG. 13.

As illustrated in FIG. 15, the three reference voltage generators Ref50, Ref61, and Ref62 are coupled to four resistors R60, R61, R62, and R63 coupled in series between the power supply voltage Vdd and the ground potential. For example, the power supply voltage Vdd is set to 1V, and the four resistors R60, R61, R62, and R63 are set to 30 kΩ, 15 kΩ, 10 kΩ, and 45 kΩ, respectively. As a result, the reference voltages VrefQ, VrefA, and VrefB are set to 0.7V, 0.55V, and 0.45V, respectively.

As illustrated in FIG. 15, the amplitude comparator 50 includes N-channel differential MOS transistors Qn1 and Qn2, P-channel load MOS transistors Qp1 and Qp2, a P-channel drive MOS transistor Qp3, an output CMOS inverter INV, two current sources Is1 and Is2, and a smoothing capacitor Cref.

Figure 14:
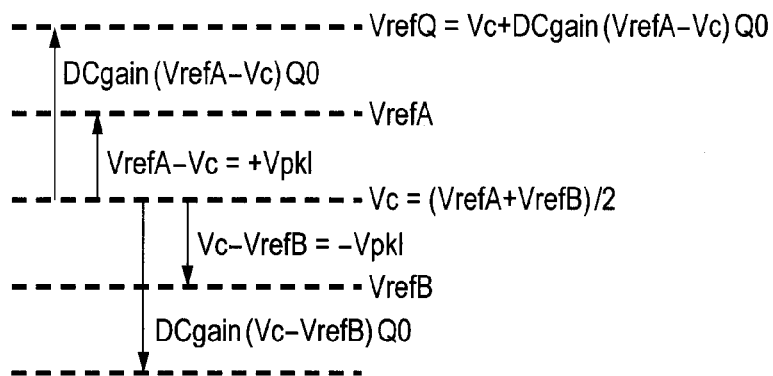
FIG. 14 is a diagram showing the relations of reference voltages VrefQ, VrefA, and VrefB generated from reference voltage generators Ref50, Ref61, and Ref62, respectively, included in the Q-factor calibration circuit 3 of the semiconductor integrated circuit according to the second embodiment of the invention illustrated in FIG. 13.

FIG. 14 is a diagram showing the relations of reference voltages VrefQ, VrefA, and VrefB generated from reference voltage generators Ref50, Ref61, and Ref62, respectively, included in the Q-factor calibration circuit 3 of the semiconductor integrated circuit according to the second embodiment of the invention illustrated in FIG. 13.

As illustrated in FIG. 14, an intermediate voltage between the reference voltages VrefA and VrefB is set to the voltage level of the common mode voltage Vc supplied to the non-inversion input terminals of the operational amplifiers OP1 and OP2 of the filter circuit 1. The voltage difference VrefA–Vc between the reference voltage VrefA and the common mode voltage Vc is equal to the positive amplitude Vpkl+ having the positive amplitude of the Q-factor adjustment input signal. The voltage difference Vc–VrefB between the common mode voltage Vc and the reference voltage VrefB is equal to the negative amplitude Vpkl– having the negative amplitude of the Q-factor adjustment input signal.

Since the reference voltage VrefQ is given as VrefQ=Vc+DCgain·Q0·Vpkl of the equation (13), VrefQ=Vc+DCgain·(VrefA–Vc)·Q0 is also satisfied. On the other hand, in the equation (13), the DC gain DCgain is an ideal value of the filter circuit 1, and the Q factor is an ideal desired factor $Q_0$. Consequently, the reference voltage VrefQ illustrated in FIG. 14 is set to an almost constant value regardless of device variations in the semiconductor integrated circuit.

In the semiconductor integrated circuit according to the second embodiment of the invention illustrated in FIG. 13, after completion of execution of the input signal compensating operation illustrated in FIG. 17, the Q-factor compensating operation is executed using the amplitude comparator 50 and the reference voltage VrefQ which is set to an almost constant value. In the period in which the Q-factor compensating operation is executed, the output signal peak voltage Voutpk of the output voltage signal having the cutoff frequency fc $(=\frac{1}{2}\pi CR_2)$ generated from the output terminal of the filter circuit 1 is given by Voutpk=Vc+DCgain·Q·Vpkl of the equation (12) when the Q factor is equal to 1 or larger.

On the other hand, since the fluctuation amount of the DC gain DCgain and the change amount in the input signal peak voltage Vinpk are set to the same absolute value in the opposite signs by the input signal compensating operation executed before that time point. Consequently, the fluctuation in the DC gain DCgain is cancelled off by the change in the input signal peak voltage Vinpk. In Voutpk=Vc+DCgain·Q·Vpkl of the equation (12), the output signal peak voltage Voutpk is influenced by not only the fluctuation amount of the DC gain DCgain but also the fluctuation in the DC offset of the operational amplifier as an component in FIG. 13 and the common mode voltage Vc. However, even when there are the fluctuation amounts, the relations shown in FIG. 14 are maintained similarly as described above, so that each of fluctuation amounts can be cancelled off by the input signal peak voltage Vinpk. Therefore, the output signal peak voltage Voutpk of the output voltage signal having the cutoff frequency fc $(=\frac{1}{2}\pi CR_2)$ generated from the output terminal of the filter circuit 1 during the period of execution of the Q-factor compensating operation depends only on the Q factor regardless of the fluctuation in the DC gain DCgain, a DC offset of each of the operational amplifiers, and the fluctuation in the common mode voltage.

Figure 16:
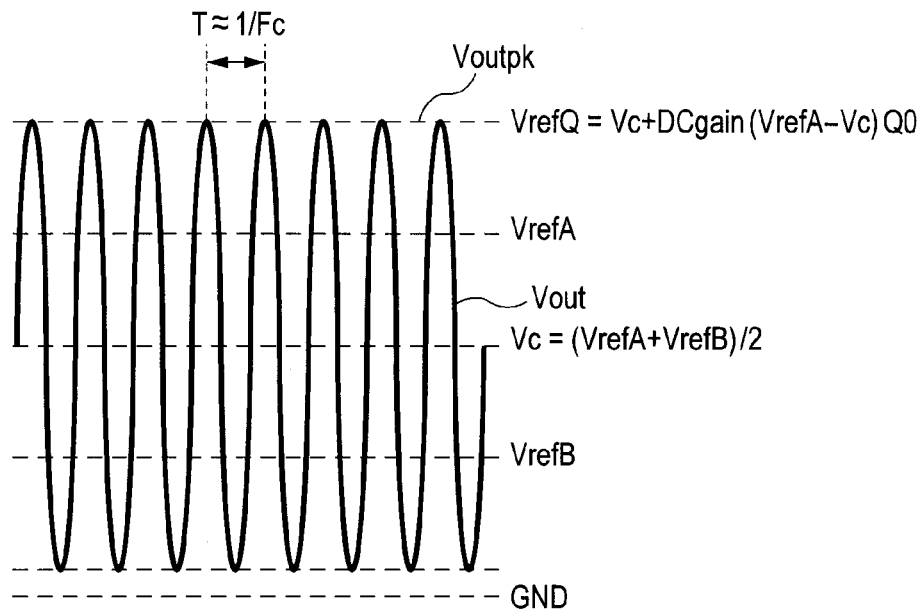
FIG. 16 is a diagram showing the relations among an output voltage signal Vout having the cutoff frequency fc ($=\frac{1}{2\pi CR_2}$) generated from the output terminal of the filter circuit 1 after execution of the Q-factor compensating operation of the semiconductor integrated circuit according to the second embodiment of the invention illustrated in FIG. 13, output signal peak voltage Voutpk of the output voltage signal Vout, and reference voltage VrefQ set to a value which is almost constant.

FIG. 16 is a diagram showing the relations among the output voltage signal Vout having the cutoff frequency fc $(=\frac{1}{2}\pi CR_2)$ generated from the output terminal of the filter circuit 1 after execution of the Q-factor compensating operation of the semiconductor integrated circuit according to the second embodiment of the invention illustrated in FIG. 13, the output signal peak voltage Voutpk of the output voltage signal Vout, and reference voltage VrefQ set to a value which is almost constant.

Since an actual Q factor of the filter circuit 1 is set to an ideal desired factor $Q_0$ by execution of the Q-factor compensating operation using the amplitude comparator 50 and the reference voltage VrefQ which is set to an almost constant value, even if there are fluctuation in the DC gain DCgain, a DC offset of each of the operational amplifiers, and the fluctuation in the common mode voltage due to device variations in the semiconductor integrated circuit, the actual Q factor of the filter circuit 1 can be set to a desired value.

Figure 18:
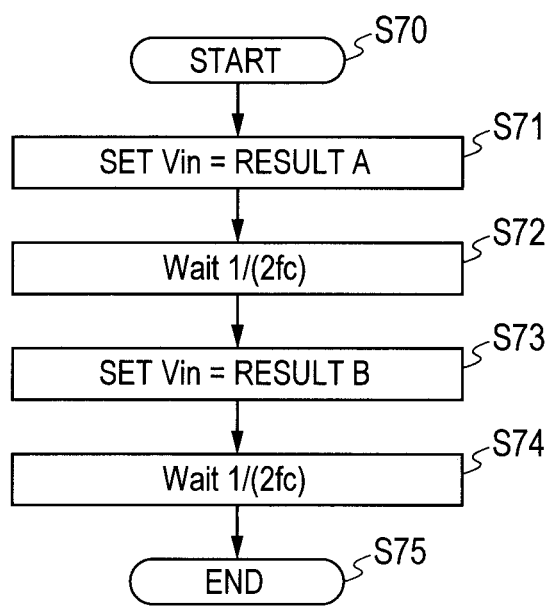
FIG. 18 is a diagram explaining a state where the control circuit 51 of the Q-factor calibration circuit 3 generates a Q-factor adjustment input signal in the Q-factor compensating operation in the semiconductor integrated circuit according to the second embodiment of the invention shown in FIG. 13.

FIG. 18 is a diagram explaining a state where the control circuit 51 of the Q-factor calibration circuit 3 generates a Q-factor adjustment input signal in the Q-factor compensating operation in the semiconductor integrated circuit according to the second embodiment of the invention shown in FIG. 13.

The method of generating the Q-factor adjustment input signal illustrated in FIG. 18 is different from that shown in FIG. 11 with respect to the point that the positive amplitude Vpkl+ and the negative amplitude Vpkl− of the Q-factor adjustment input signal are adjusted in response to the setting results A and B stored in the control register 53.

As illustrated in FIG. 18, the Q-factor adjustment input signal generating operation starts in step S70.

In the first step S71, the relation of Vinpk=common mode voltage Vc+ positive amplitude Vpkl1 is set where Vinpk denotes the peak voltage of the input signal voltage Vin as a Q-factor adjustment input signal. In the setting, using the setting result A stored in the control register 53, the positive amplitude Vpkl+ of the Q-factor adjustment input signal is adjusted. The voltage setting is continued during the cycle ½ fc of the cutoff frequency fc of step S72.

Further, in the following step S73, the relation of Vinpk=common mode voltage Vc− negative amplitude Vpkl− is set where Vinpk denotes the peak voltage of the input signal voltage Vin as the Q-factor adjustment input signal. In the setting, using the setting result B stored in the control register 53, the negative amplitude Vpkl− of the Q-factor adjustment input signal is adjusted. The voltage setting is also continued during the cycle ½fc of the cutoff frequency fc in step S74, and the Q-factor adjustment input signal generating operation is finished in step S75. As a result, by the Q-factor adjustment input signal generating operation illustrated in FIG. 18, the Q-factor adjustment input signal Vin of one cycle can be generated.

Details of Q-factor Compensating Operation

Figure 19:
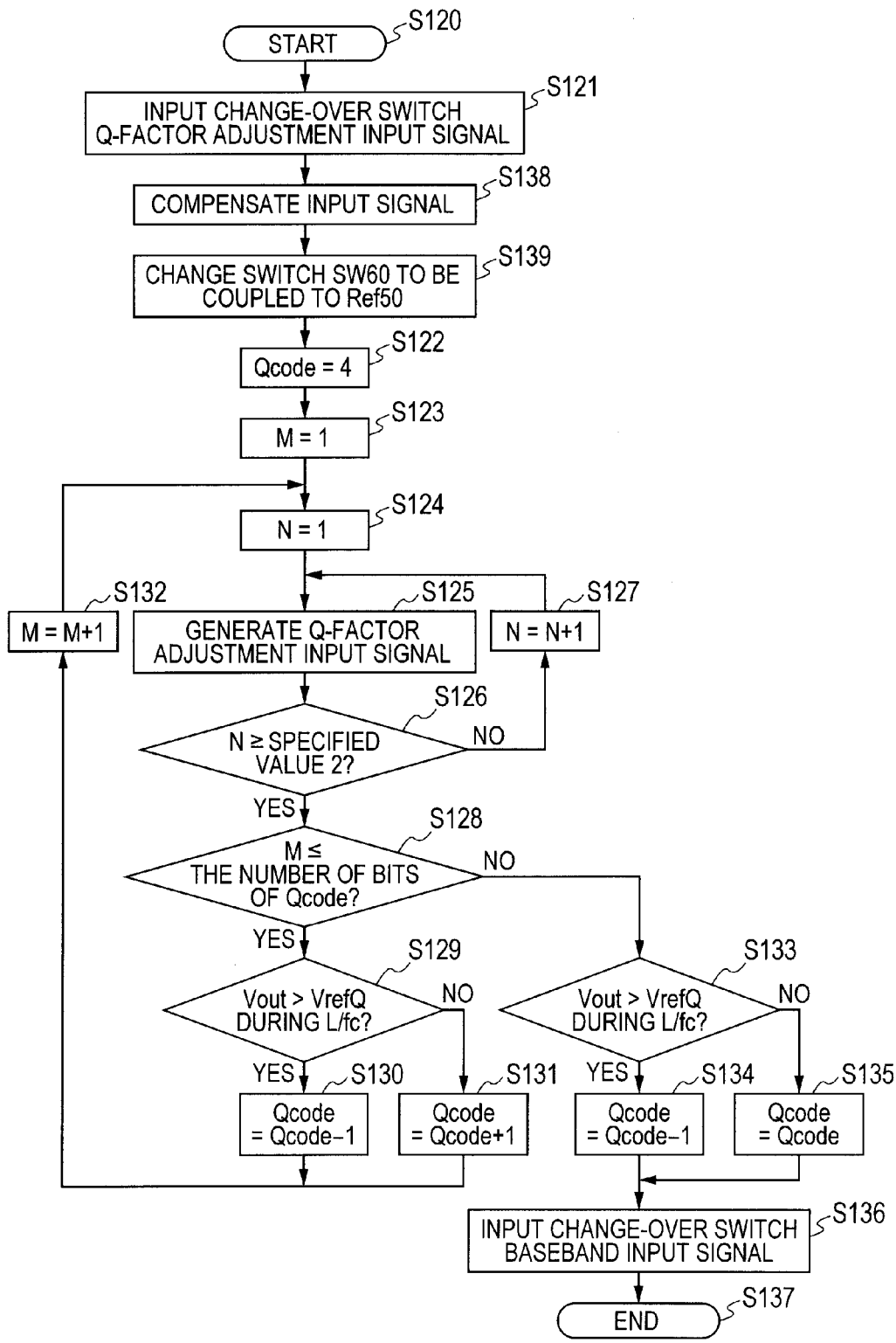
FIG. 19 is a diagram explaining the Q-factor compensating operation of the filter circuit 1 of the semiconductor integrated circuit according to the second embodiment of the invention illustrated in FIG. 13.

FIG. 19 is a diagram explaining the Q-factor compensating operation of the filter circuit 1 of the semiconductor integrated circuit according to the second embodiment of the invention illustrated in FIG. 13.

The Q-factor compensating operation according to the second embodiment of the invention illustrated in FIG. 19 is different from that according to the first embodiment of the invention shown in FIG. 12 with respect to the point that the steps S138 and S139 are added to the Q-factor compensating operation in FIG. 19.

In step S138 added to the Q-factor compensating operation of FIG. 19, the input signal compensating operation for reducing the fluctuation in the output signal peak voltage Voutpk of the filter circuit 1 described with reference to FIG. 17 is executed.

In step S139 added to the Q-factor compensating operation of FIG. 19, the reference voltage VrefQ of the reference voltage generator Ref50 is supplied to the amplitude comparator 50 by the change-over switch SW60 included in the Q-factor compensating circuit 3 of the semiconductor integrated circuit according to the second embodiment of the invention illustrated in FIG. 15. Since the Q-factor compensating operation according to the second embodiment of the invention illustrated in FIG. 19 is the same as that according to the first embodiment of the invention illustrated in FIG. 12 except for the steps S138 and S139, the Q-factor compensating operation of FIG. 19 will not be further described.

Although the frequency of the Q-factor adjustment input signal of the second embodiment is preferably the same as the cutoff frequency of the filter circuit 1, in a manner similar to the first embodiment, they do not have to be strictly the same.

Third Embodiment

Another Configuration of Semiconductor Integrated Circuit

FIG. 20 is a diagram illustrating another configuration of a semiconductor integrated circuit according to a third embodiment of the present invention, including the filter circuit 1 as a channel selection filter for a direct conversion multimode receiver compatible with the long term evolution (LTE) method, and the cutoff frequency calibration circuit 2 and the Q-factor calibration circuit 3 for setting a frequency characteristic of the filter circuit 1.

The semiconductor integrated circuit according to the third embodiment of the invention illustrated in FIG. 20 is different from that according to the first embodiment of the invention illustrated in FIG. 2 with respect to the following point.

In the semiconductor integrated circuit according to the third embodiment of the invention illustrated in FIG. 20, the filter circuit 1 as the channel selection filter is configured by an active RC low-pass filter of the Sallen-Key type. As it is well known, the low-pass filter circuit 1 of the Sallen-key type is obtained by coupling the inversion input terminal and the output terminal of the operational amplifier OP1 to the connection node of the two series resistors R1 and R2 of input via the capacitor C2. The filter circuit 1 as the channel selection filter eliminates signals other than a desired channel as the baseband signal bandwidth.

In the filter circuit 1 configured by the active RC low-pass filter of the Sallen-Key type, in the case where R1=R2=R, $\omega_0$, the cutoff frequency fc, and the Q factor are given by the following equations.

$$\omega_0 = \sqrt{\frac{1}{C_1 C_2 R_1 R_2}} = \frac{1}{\sqrt{C_1 C_2}\ R} \qquad \text{Equation (17)}$$

$$fc = \frac{1}{2\pi}\omega_0 = \frac{1}{2\pi\sqrt{C_1 C_2}\ R} \qquad \text{Equation (18)}$$

$$Q = \frac{\sqrt{\frac{C_2}{C_1}}}{2} \qquad \text{Equation (19)}$$

However, in the low-pass filter circuit 1 of the Sallen-Key type illustrated in FIG. 20, in the case where an unignorable parasite capacitor Cp exists in the non-inversion input terminal of the operational amplifier OP1, the first capacitor C1 is effectively increased. Therefore, the cutoff frequency fc and the Q factor change from the ideal values. When the first and second capacitors C1 and C2 are set to capacitance values larger than the parasite capacitor Cp, the characteristic fluctuation is compensated. However, the semiconductor chip area and the manufacturing cost of the semiconductor integrated circuit increase.

Even when the first and second capacitors C1 and C2 are simply compensated by the cutoff frequency calibration circuit 2 in a manner similar to the first embodiment of the invention illustrated in FIG. 2, the cutoff frequency fc subjected to the cutoff frequency compensating operation changes from the ideal value, and the Q factor remains changed from the ideal value.

Therefore, in the semiconductor integrated circuit according to the third embodiment of the invention illustrated in FIG. 20, the first and second capacitors C1 and C2 are simply compensated by the cutoff frequency calibration circuit 2 in a manner similar to the first embodiment of the invention illustrated in FIG. 2 and, after that, the Q factor is adjusted to the ideal value by adjusting only the capacitance value of the first capacitor C1 by using the reference voltage generator Ref50, the amplitude comparator 50, and the Q-factor calibration circuit 3. By the final Q-factor compensating operation as described above, the cutoff frequency fc of the low-pass filter circuit 1 of the Sallen-Key type is set to an ideal value.

Fourth Embodiment

Quadrature Direct Downconversion Receiver

FIG. 21 is a diagram illustrating another configuration of a semiconductor integrated circuit according to a fourth embodiment of the present invention, including a plurality of filter circuits 1A, 1B, 1C, and 1D as channel selection filters of I channel and Q channel in the case of using a multimode receiver of a quadrature direct downconversion method compatible with the long term evolution (LTE) method, and the common cutoff frequency calibration circuit 2 and a plurality of Q-factor calibration circuits 3A, 3B, 3C, and 3D for setting a frequency characteristic of the filter circuits.

As illustrated in FIG. 21, an I-signal analog baseband circuit 210 includes the first input change-over switch SW10, the first baseband amplifier Amp1, the first filter circuit 1A, the first Q-factor calibration circuit 3A, the second input change-over switch SW11, the second filter circuit 1B, the second Q-factor calibration circuit 3B, the second baseband amplifier Amp2, and the common cutoff frequency calibration circuit 2.

As illustrated in FIG. 21, a Q-signal analog baseband circuit 211 includes the third input change-over switch SW12, the third baseband amplifier Amp3, the third filter circuit 1C, the third Q-factor calibration circuit 3C, the fourth input change-over switch SW13, the fourth filter circuit 1D, the fourth Q-factor calibration circuit 3D, and the fourth baseband amplifier Amp4.

First, in the semiconductor integrated circuit according to the fourth embodiment of the invention illustrated in FIG. 21, the common cutoff frequency calibration circuit 2 executes not only the cutoff frequency compensating operation of the first and second filter circuits 1A and 1B of the I-signal analog baseband circuit 210 in series but also the cutoff frequency compensating operation of the third and fourth filter circuits 1C and 1D of the Q-signal analog baseband circuit 211 in series. First, the common cutoff frequency calibration circuit 2 can execute, in parallel, the cutoff frequency compensating operation of the first filter circuit 1A in the front stage and that of the third filter circuit 1C in the front stage. The common cutoff frequency calibration circuit 2 can execute, in parallel, the cutoff frequency compensating operation of the second filter circuit 1B on the rear stage and that of the fourth filter circuit 1D on the rear stage. Since the cutoff frequency compensating operation is the same as that executed in the semiconductor integrated circuit according to the first embodiment of the invention illustrated in FIGS. 1 and 2, the description will not be described here. In short, the cutoff frequency compensating operation can be simultaneously performed on the plurality of filter circuits 1A, 1B, 1C, and 1D.

Subsequently, in the semiconductor integrated circuit according to the fourth embodiment of the invention illustrated in FIG. 21, the Q-factor compensating operation is executed. In the I-signal analog baseband circuit 210, the Q-factor compensating operation of the first filter circuit 1A by the first Q-factor calibration circuit 3A and the of the second filter circuit 1B by the second Q-factor calibration circuit 3B are executed in parallel. Further, in the Q-signal analog baseband circuit 211, the Q-factor compensating operation of the third filter circuit 1C by the third Q-factor calibration circuit 3C and the of the fourth filter circuit 1D by the fourth Q-factor calibration circuit 3D are executed in parallel. Since the Q-factor compensating operation is the same as that executed in the semiconductor integrated circuit according to the first embodiment of the invention illustrated in FIGS. 1 and 2, the description will not be repeated. In short, the Q-factor compensating operation can be simultaneously performed on the plurality of filter circuits 1A, 1B, 1C, and 1D.

Fifth Embodiment

Quadrature Direct Downconversion Receiver

FIG. 22 is a diagram illustrating another configuration of a semiconductor integrated circuit according to a fifth embodiment of the present invention, including the plurality of filter circuits 1A, 1B, 1C, and 1D as channel selection filters of I channel and Q channel in the case of using a multimode receiver of a quadrature direct downconversion method compatible with the long term evolution (LTE) method, and the cutoff frequency calibration circuit 2 and a plurality of Q-factor calibration circuits 3A and 3C for setting a frequency characteristic of the filter circuits.

The semiconductor integrated circuit according to the fifth embodiment of the invention illustrated in FIG. 22 is different from that according to the fourth embodiment of the invention illustrated in FIG. 21 with respect to the following point.

The semiconductor integrated circuit according to the fifth embodiment of the invention illustrated in FIG. 22 does not include the second input change-over switch SW11, the fourth input change-over switch SW13, the second Q-factor calibration circuit 3B, and the fourth Q-factor calibration circuit 3D which are included in the semiconductor integrated circuit according to the fourth embodiment of the invention illustrated in FIG. 21.

Therefore, in the I-signal analog baseband circuit 210, the output terminal of the first filter circuit 1A and the input terminal of the second filter circuit 1B are directly coupled to each other. In the Q-signal analog baseband circuit 211, the output terminal of the third filter circuit 1C and the input terminal of the fourth filter circuit 1D are directly coupled Further, in the I-signal analog baseband circuit 210, the output signal of the first filter circuit 1A is supplied to the first Q-factor calibration circuit 3A via the second filter circuit 1B and the second baseband amplifier Amp2. Similarly, in the Q-signal analog baseband circuit 211, the output signal of the third filter circuit 1C is supplied to the third Q-factor calibration circuit 3C via the fourth filter circuit 1D and the fourth baseband amplifier Amp4.

Figure 23:
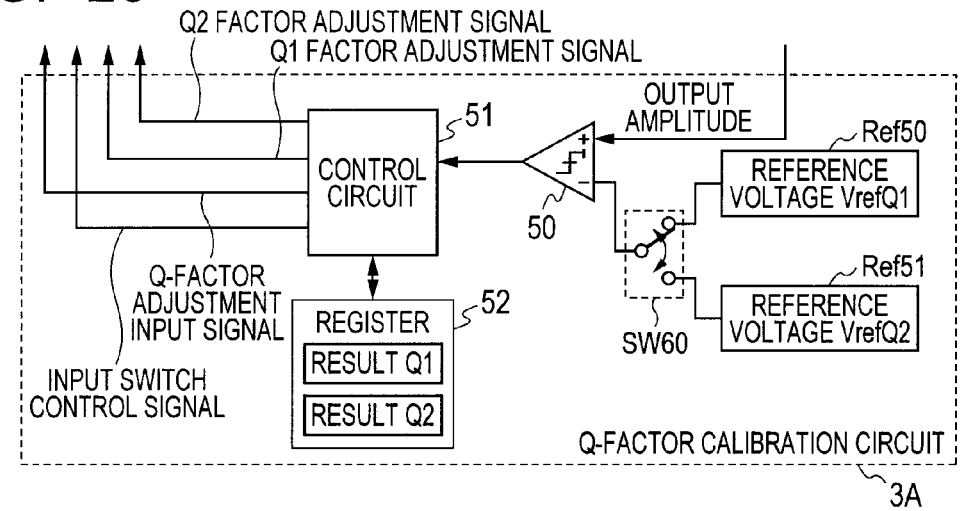
FIG. 23 is a diagram illustrating the configuration of the first Q-factor calibration circuit 3A included in an I-signal analog baseband circuit 210 of the semiconductor integrated circuit according to the fifth embodiment of the invention shown in FIG. 22.

FIG. 23 is a diagram illustrating the configuration of the first Q-factor calibration circuit 3A included in the I-signal analog baseband circuit 210 of the semiconductor integrated circuit according to the fifth embodiment of the invention shown in FIG. 22.

The first Q-factor calibration circuit 3A illustrated in FIG. 23 is obtained by adding the second reference voltage generator Ref51 and the change-over switch SW60 to the Q-factor calibration circuit 3 of the semiconductor integrated circuit according to the first embodiment of the invention illustrated in FIG. 2.

In the first Q-factor calibration circuit 3A illustrated in FIG. 23, when the change-over switch SW60 selects the first reference voltage VrefQ1 of the first reference voltage generator Ref50, the amplitude comparator 50 compares the output amplitude of the first filter circuit 1A on the front stage and the first reference voltage VrefQ1. Therefore, the amplitude comparator 50 and the control circuit 51 set Q1 control information on the front stage in the control register 52 so that the output amplitude of the first filter circuit 1A on the front stage and the first reference voltage VrefQ1 match. Further, when the change-over switch SW60 selects the second reference voltage VrefQ2 of the second reference voltage generator Ref51, the amplitude comparator 50 compares the output amplitude of the second filter circuit 1B on the rear stage and the second reference voltage VrefQ2. Therefore, the amplitude comparator 50 and the control circuit 51 set Q2 control information on the rear stage into the control register 52 so that the output amplitude of the second filter circuit 1B on the rear stage and the second reference voltage VrefQ2 match. Although not illustrated, the third Q-factor calibration circuit 3C included in the Q-signal analog baseband circuit 211 of the semiconductor integrated circuit according to the fifth embodiment of the invention illustrated in FIG. 22 is configured in a manner similar to the first Q-factor calibration circuit 3A included in the I-signal analog baseband circuit 210 illustrated in FIG. 22.

Figure 24:
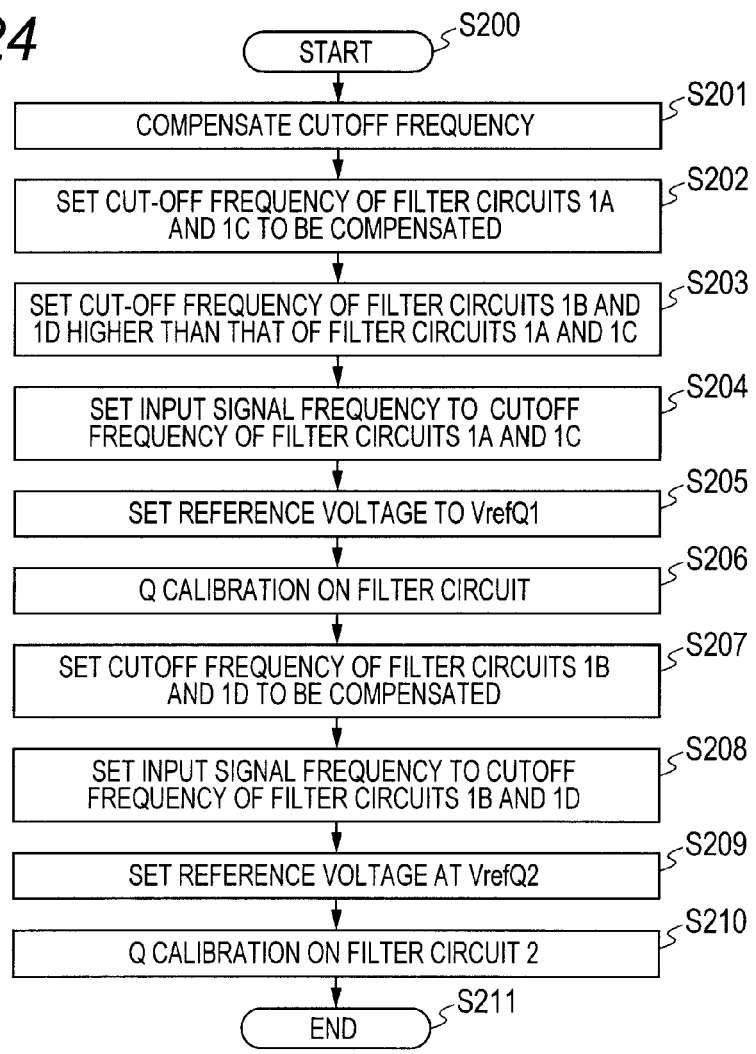
FIG. 24 is a diagram explaining operation of calibrating the frequency characteristic of the plurality of filter circuits 1A, 1B, 1C, and 1D as the channel selection filters provided in the semiconductor integrated circuit according to the fifth embodiment of the invention shown in FIG. 22.

FIG. 24 is a diagram explaining operation of calibrating the frequency characteristic of the plurality of filter circuits 1A, 1B, 1C, and 1D as the channel selection filters provided in the semiconductor integrated circuit according to the fifth embodiment of the invention shown in FIG. 22.

When the frequency characteristic calibrating operation starts in step S200, the cutoff frequency compensating operation starts in step S201.

In step S202, the common cutoff frequency calibration circuit 2 executes the cutoff frequency compensating operation of the first filter circuit 1A of the I-signal analog baseband circuit 210 and the cutoff frequency compensating operation of the third filter circuit 1C of the Q-signal analog baseband circuit 211 in series. Consequently, the first filter circuit 1A in the front stage and the third filter circuit 1C in the front stage are set to the cutoff frequency to be compensated.

In step S203, the cutoff frequency calibration circuit 2 temporarily sets the cutoff frequency of the second filter circuit 1B in the rear stage of the I-signal analog baseband circuit 210 and the fourth filter circuit 1D of the Q-signal analog baseband circuit 211 to a frequency higher than the cutoff frequency set in the first filter circuit 1A in the front stage and the third filter circuit 1C in the front stage.

The reason is that, during the Q-factor compensating operation of the first filter circuit 1A in the front stage and the third filter circuit 1C in the front stage, in the I-signal analog baseband circuit 210, the output signal of the first filter circuit 1A in the front stage is supplied to the first Q-factor calibration circuit 3A via the second filter circuit 1B and the second baseband amplifier Amp2. In the Q-signal analog baseband circuit 211, the output signal of the third filter circuit 1C in the front stage is supplied to the third Q-factor calibration circuit 3C via the fourth filter circuit 1D and the fourth baseband amplifier Amp4 in the rear stage. That is, the cutoff frequency of the second and fifth filter circuits 1B and 1D in the rear stage is temporarily set to a high frequency so that the high frequency component of the output signal of the first and third filter circuits 1A and 1C in the front stage is not attenuated by the second and fourth filter circuits 1B and 1D in the rear stage.

In step S204, the frequency of the Q-factor adjustment input signal generated from the control circuit 51 of the first Q-factor calibration circuit 3A and the Q-factor adjustment input signal generated from the control circuit 51 of the third Q-factor calibration circuit 3C is set so as to be equal to the cutoff frequency set in the first and third filter circuits 1A and 1C in the front stage.

In step S205, in the first and third Q-factor calibration circuits 3A and 3C, the change-over switch SW60 selects the first reference voltage VrefQ1 of the first reference voltage generator Ref50.

In step S206, the amplitude comparator 50 of the first Q-factor calibration circuit 3A compares the first reference voltage VrefQ1 and the output amplitude of the first filter circuit 1A in the front stage, thereby setting the Q1 control information in the front stage of the first filter circuit 1A in the front stage into the control register 52 of the first Q-factor calibration circuit 3A. In parallel, in step S206, when the amplitude comparator 50 of the third Q-factor calibration circuit 3C compares the first reference voltage VrefQ1 and the output amplitude of the third filter circuit 1C in the front stage, the Q1 control information in the front stage of the third filter circuit 1C in the front stage is set in the control register 52 in the third Q-factor calibration circuit 3C.

In step S207, the common cutoff frequency calibration circuit 2 executes the cutoff frequency compensating operation of the second filter circuit 1B in the rear stage of the I-signal analog baseband circuit 210 and the cutoff frequency compensating operation of the fourth filter circuit 1D in the rear stage of the Q-signal analog baseband circuit 211 in series, thereby setting the second and fourth filter circuits 1B and 1D in the rear stage to the cutoff frequency to be compensated.

In the case where the cutoff frequency to be set in the second and fourth filter circuits 1B and 1D in the rear stage is higher than that set in the first and third filter circuits 1A and 1C in the front stage, the cutoff frequency of the first and third filter circuits 1A and 1C in the front stage is temporarily set to a frequency higher than the cutoff frequency to be set in the second and fourth filter circuits 1B and 1D in the rear stage.

The reason is that, during the Q-factor compensating operation of the second and fourth filter circuits 1B and 1D in the rear stage executed after that, the Q-factor adjustment input signal generated from the control circuit 51 of the first Q-factor calibration circuit 3A and the Q-factor adjustment input signal generated from the control circuit 51 of the third Q-factor calibration circuit 3C are supplied to the second and fourth filter circuits 1B and 1D in the rear stage via the first and third filter circuits 1A and 1C in the front stage, respectively. That is, the cutoff frequency of the first and third filter circuits 1A and 1C in the front stage is temporarily set to a high frequency so that the high frequency component of the Q-factor adjustment input signal of the second and fourth filter circuits 1B and 1D in the rear stage is not attenuated by the first and third filter circuits 1A and 1C in the front stage.

Therefore, after completion of execution of the Q-factor compensating operation of the second and fourth filter circuits 1B and 1D in the rear stage, the cutoff frequency of the first and third filter circuits 1A and 1C in the front stage is reset from the high temporary value to the original cutoff frequency set in step S202.

In step S208, the frequency of the Q-factor adjustment input signal generated from the control circuit 51 of the first Q-factor calibration circuit 3A and the Q-factor adjustment input signal generated from the control circuit 51 of the third Q-factor calibration circuit 3C is set to be equal to the cutoff frequency set in the second and fourth filter circuits 1B and 1D in the rear stage.

In step S209, in the first and third Q-factor calibration circuits 3A and 3C, the change-over switch SW60 selects the second reference voltage VrefQ2 of the second reference voltage generator Ref51.

In step S210, the amplitude comparator 50 of the first Q-factor calibration circuit 3A compares the second reference voltage VrefQ2 and the output amplitude of the second filter circuit 1B, and Q2 control information in the rear stage of the second filter circuit 1B in the rear stage is set in the control register 52 of the first Q-factor calibration circuit 3A. In parallel, in step S210, the amplitude comparator 50 of the third Q-factor calibration circuit 3C compares the second reference voltage VrefQ2 and the output amplitude of the fourth filter circuit 1D in the rear stage, and Q2 control information in the rear stage of the fourth filter circuit 1D in the rear stage is set in the control register 52 of the third Q-factor calibration circuit 3C.

In step S211, the frequency characteristic calibrating operation started in step S200 is completed. In the case where the cutoff frequency to be set in the second and fourth filter circuits 1B and 1D in the rear stage is higher than that set in the first and third filter circuits 1A and 1C in the front stage, the information of the cutoff frequency temporarily set in the first and third filter circuits 1A and 1C in the front stage is discarded. The first and third filter circuits 1A and 1C in the front stage are reset to the original cutoff frequency set in step S202.

Although the cutoff frequency of the first and third filter circuits 1A and 1C in the front stage is temporarily set to be higher than the cutoff frequency to be set in the second and fourth filter circuits 1B and 1D in the rear stage in step S207, the cutoff frequency to be compensated may be set in the first and third filter circuits 1A and 1C in the front stage. As a result, even if an error is included in calibration of the frequency characteristic of the first and third filter circuits 1A and 1C in the front stage, calibration of the frequency characteristic of the second and fourth filter circuits 1B and 1D in the rear stage is executed so as to compensate the error.

Further, in the semiconductor integrated circuit according to the fifth embodiment of the invention illustrated in FIG. 22, a digital signal processing circuit can be coupled between the output terminal of the second baseband amplifier Amp2 of the I-signal analog baseband circuit 210 and the input terminal of the first Q-factor calibration circuit 3A. Similarly, a digital signal processing circuit can be coupled between the output terminal of the fourth baseband amplifier Amp4 of the Q-signal analog baseband circuit 211 and the input terminal of the third Q-factor calibration circuit 3C.

In this case, since an output signal of the digital signal processing circuit is digital data, a digital comparator is used in place of the amplitude comparator 50 configured by the first and third Q-factor calibration circuits 3A and 3C as analog circuits. The digital comparator compares reference digital data pre-stored in a control register or the like and digital data as an output signal of the digital signal processing circuit and executes the Q-factor compensating operation in accordance with the comparison result.

The digital signal processing circuit is configured by an analog-digital converter (ADC) and a digital effective-value computing device. For example, an analog output signal of the second baseband amplifier Amp2 of the I-signal analog baseband circuit 210 is converted to a digital output signal by the analog-digital converter (ADC). The digital output signal of the analog-digital converter (ADC) is supplied to the digital effective-value computing device, and the digital effective-value computing device computes the effective value of the digital output signal. As a method of computing the digital effective-value, a method of squaring a sampling value, adding squared outputs, dividing the resultant output by the number of addition times to average the output, and calculating the square root of the averaged output can be employed.

By employing a method of repeating processes from sampling to averaging, averaging results of the repeating processes, and calculating the square root of the averaged output, the size of a register storing the addition result can be reduced. Further, since noise is reduced by increasing the number of averaging times of the averaging process, the high-precision Q-factor compensating operation can be executed. In the case where the number of addition times of adding the squared output is a power of two, digital division can be replaced by shift operation, so that the circuit scale of digital division can be reduced. By adding also time of an integral multiple of 1/fc and performing averaging at the timing, the averaging can be performed without executing a digital filter process for reducing the influence of the timing of cutting the averaging, and the area can be reduced.

For example, when the sampling frequency of the analog-digital converter (ADC) is 3.2 fc and time corresponds to 20 times of 1/fc, the number of addition times necessary for averaging is 64 so that the shift operation is possible and a condition of requiring no digital filter can be satisfied. To complete averaging at a timing of 20 times of 1/fc and make comparison, the value L can be set to 20 in steps S129 and S133 in the flow of FIG. 12 or 19.

In a method of using an effective value in the digital process, it is unnecessary to compare the peak voltage of the filter output with the analog reference voltage, so that the possibility of occurrence of an error in a comparison result due to noise can be reduced. Also in generation of the reference voltage shown in FIG. 15, there is the possibility that an error in a comparison result is caused by variations in the resistance ratio. In a configuration using an effective value in digital process, digital values are compared. Filter outputs compared are averaged by a computing circuit using an effective value, so that Q calibration resistant to noise can be made. When microfabrication process is used, a digital circuit can be realized with chip area smaller as compared with that of an analog circuit, so that the semiconductor chip area can be reduced. In the case where there are a plurality of Q factors on which the frequency calibration is desired to be executed and there are a plurality of reference voltages as illustrated in FIG. 23, it can be achieved by preparing a plurality of digital values and selecting any of them. In this case, a register for storing the digital values is prepared. A method capable of setting reference voltage from the outside of the semiconductor integrated circuit to an arbitrary value and setting an actual Q factor to a target Q factor by software is employed. As a result, the frequency characteristic of the filter circuit can be adjusted to an arbitrary value which does not depend on device variations, so that a high-precision analog filter circuit in a software wireless device can be provided.

Sixth Embodiment

Quadrature Direct Downconversion Receiver

FIG. 25 is a diagram illustrating a configuration of applying a filter circuit provided in the semiconductor integrated circuit according to any of the first to fifth embodiments of the invention to a channel selection filter of a receiver of the quadrature downconversion method according to the sixth embodiment of the invention having an analog baseband unit of two systems of the I channel of an in-phase component and the Q channel of a quadrature component.

The quadrature direct downconversion receiver according to the sixth embodiment of the invention illustrated in FIG. 25 includes an antenna 10, a bandpass filter 20, a low noise amplifier 30, an I-signal mixer 40, a first channel selection filter 50, a first amplifier 60, a Q-signal mixer 70, a second channel selection filter 80, a second amplifier 90, a 90-degree phase shifter 100, and an RF voltage-controlled oscillator 110.

In the quadrature direct downconversion receiver of FIG. 25, the low noise amplifier 30, the I-signal mixer 40, the first channel selection filter 50, the first amplifier 60, the Q-signal mixer 70, the second channel selection filter 80, the second amplifier 90, the 90-degree phase shifter 100, and the RF voltage-controlled oscillator 110 are integrated on a semiconductor chip of a semiconductor integrated circuit to be mounted on a cellular phone terminal.

By the RF voltage-controlled oscillator (VCO) 110 and the 90-degree phase shifter 100, an I local signal and a Q local signal having a phase difference of 90 degrees are supplied to the I-signal mixer 40 and the Q-signal mixer 70, respectively. An RF reception signal received by the antenna 10 is supplied to the input terminal of the low noise amplifier 30 via the band-pass filter 20, and an RF reception amplified signal of the low noise amplifier 30 is supplied to the I-signal mixer 40 and the Q-signal mixer 70 configuring the quadrature downconversion mixer. An I-baseband signal generated from the I-signal mixer 40 is supplied to the first channel selection filter 50 and the first amplifier 60. On the other hand, a Q-baseband signal generated from the Q-signal mixer 70 is supplied to the second channel selection filter 80 and the second amplifier 90.

In the quadrature direct downconversion receiver illustrated in FIG. 25, the filter circuit according to any of the first to fifth embodiments of the invention is used as the first channel selection filter 50 for the I channel of the in-phase component and the second channel selection filter 80 for the Q channel of the quadrature component.

Seventh Embodiment

Quadrature Downconversion Receiver

FIG. 26 is a diagram illustrating a configuration of applying a filter circuit provided in the semiconductor integrated circuit according to any of the first to fifth embodiments of the invention to a channel selection filter of a receiver of the quadrature downconversion method according to the sixth embodiment of the invention used for a multi-input multi-output (MIMO) communication system.

An MIMO (Multi-Input Multi-Output) communication system is according to a speed-up technique employed in IEEE802.11n as one of standards of a wireless LAN. A transmission system of the MIMO communication system divides the same transmission data into a plurality of streams and almost simultaneously transmits the plurality of streams in the same RF transmission frequency band from a plurality of transmission antennas. A reception system of the MIMO communication system receives a plurality of RF transmission signals transmitted from the transmission system by a plurality of reception antennas, processes distortions by paths of the plurality of RF reception signals received by the plurality of reception antennas, and extracts signals of the original transmission data. By the principle of the MIMO communication system, in the case where the transmission data is divided into two streams, the transmission speed is improved to be doubled. In the case where the transmission data is divided into three streams, the transmission speed is improved to be tripled.

In the case where the reception system is far from a base station of the transmission system or the case where there is much interference of a multipath or the like, the antenna diversity technique is used. The technique of diversity is to improve the probability of receiving an RF reception signal having little fading effect by making two or more reception antennas apart from one another by distance sufficiently longer than the wavelength of the RF reception signal.

The receiver of the quadrature direct downconversion type according to the seventh embodiment of the invention illustrated in FIG. 26 is compatible with the MIMO communication system and diversity reception. The receiver illustrated in FIG. 26 includes a main reception antenna 400, a front-end module 401 made by an antenna switch and an RF filter, a reception mixer 403, a channel selection filter 407, and an analog-digital converter (ADC) 409 and, in addition, a reception antenna 500 to be compatible with the MIMO communication system and diversity reception, a front-end module 501 made by an antenna switch and an RF filter, a reception mixer 503, a channel selection filter 507, and an analog-digital converter (ADC) 509. In the receiver illustrated in FIG. 26, the circuits in a broken line 412 are integrated on a semiconductor chip of a semiconductor integrated circuit for the receiver. To the semiconductor integrated circuit 412 for the receiver, a baseband signal processing LSI 410 is coupled.

The analog-digital converter 409 on the main side converts an analog baseband reception signal generated from the channel selection filter 407 to a digital baseband reception signal and supplies the digital signal to the baseband signal processing LSI 410. The analog-digital converter 509 on the sub side converts the analog baseband reception signal generated from the channel selection filter 407 to a digital baseband reception signal and supplies the digital signal to the baseband signal processing LSI 410. To the reception mixer 403 on the main side and the reception mixer 503 on the sub side, a 90-degree phase shifter 405 for quadrature demodulation and an RF carrier oscillator 404 are coupled. The digital baseband transmission signal generated from the baseband signal processing LSI 410 is converted by a digital-analog converter (DAC) 412 to an analog baseband transmission signal. The analog baseband transmission signal is supplied to an RF transmission signal generator 411. An RF transmission signal generated from the RF transmission signal generator 411 is supplied via the front-end module 401 to the reception antenna 400 also functioning as a transmission antenna.

In the quadrature direct downconversion receiver according to the seventh embodiment of the invention illustrated in FIG. 26, the filter circuit provided in the semiconductor integrated circuit according to any of the first to fifth embodiments of the invention is used as the channel selection filter 407 on the main side and the channel selection filter 507 on the sub side.

Figure 27:
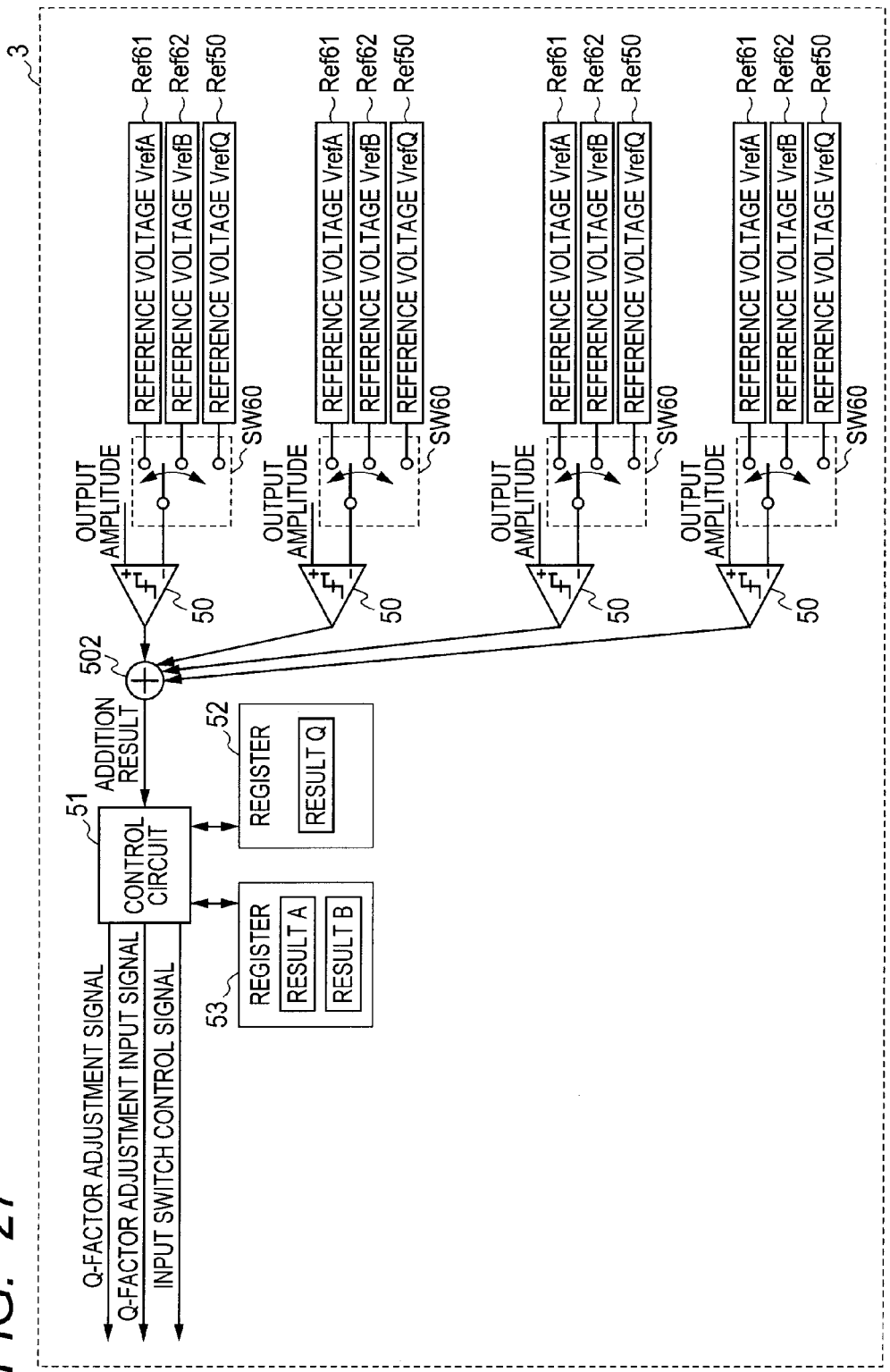
FIG. 27 is a diagram illustrating a configuration of the Q-factor calibration circuit 3 included in the semiconductor integrated circuit for the receiver of the quadrature direct conversion method according to the seventh embodiment of the invention shown in FIG. 26.

FIG. 27 is a diagram illustrating a configuration of the Q-factor calibration circuit 3 included in the semiconductor integrated circuit for the receiver of the quadrature direct conversion method according to the seventh embodiment of the invention shown in FIG. 26.

As illustrated in FIG. 27, the Q-factor calibration circuit 3 included in the semiconductor integrated circuit shown in FIG. 26 is a Q calibration circuit for total four reception paths on the main and sub sides of I-side and Q-side diversity of quadrature demodulation. In the Q-factor calibration circuit illustrated in FIG. 27, results of comparator outputs of the paths are added by an adder 502, and an addition result is output to the control circuit 51. In a manner similar to the second embodiment of the invention illustrated in FIG. 13, the Q-factor calibration circuit 3 of each of the paths illustrated in FIG. 27 includes three reference voltage generators Ref50, Ref61, and Ref62, the two control registers 52 and 53, and the change-over switch SW60. Therefore, in the channel selection filter 407 on the main side and the channel selection filter 507 on the sub side of the semiconductor integrated circuit according to the seventh embodiment of the invention illustrated in FIG. 26, in a manner similar to the second embodiment of the invention illustrated in FIG. 13, the input signal compensating operation is executed between the cutoff frequency compensating operation and the Q-factor compensating operation.

In the Q-factor calibration circuit 3 of each of the paths illustrated in FIG. 27, the amplitude comparator 50 compares the output amplitude of the channel selection filter with the first reference voltage VrefQ1 of the first reference voltage generator Ref50. In the case where it is determined that the output amplitude of the channel selection filter is larger than that of the first reference voltage VrefQ1 of the first reference voltage generator Ref50, the comparison result of the amplitude comparator 50 becomes the high level "1". On the contrary, in the case where it is determined that the output amplitude of the channel selection filter is smaller than the first reference voltage VrefQ1 of the first reference voltage generator Ref50, the comparison result of the amplitude comparator 50 becomes the low level "0". In the case where comparison results of all of paths are added by the adder 502 and an addition result of the adder 502 is three or larger, it is determined that the output amplitude of the channel selection filter is larger than the first reference voltage VrefQ1 of the first reference voltage generator Ref50, the Q-factor compensating operation of the channel selection filter is executed.

In such a manner, in the semiconductor integrated circuit for the quadrature direct downconversion receiver according to the seventh embodiment of the invention illustrated in FIGS. 26 and 27, even if a result of one of a plurality of paths is influenced by noise, the influenced result and the results of the other paths are averaged. Consequently, the Q-factor compensating operation having high resistance to noise can be executed.

Eighth Embodiment

Figure 28:
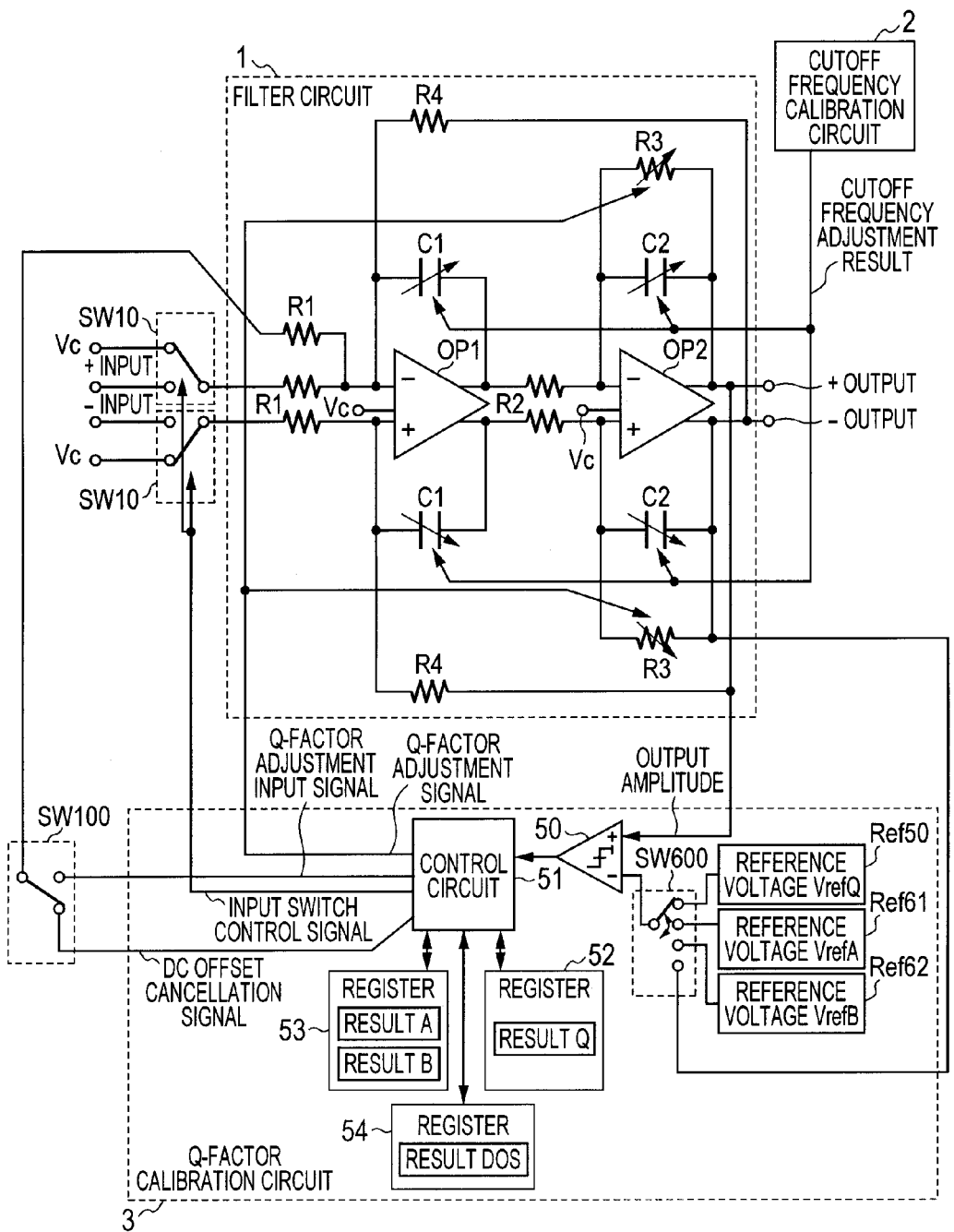
FIG. 28 is a diagram illustrating another configuration of a semiconductor integrated circuit according to an eighth embodiment of the present invention, including the filter circuit 1 as a channel selection filter for the direct conversion multimode receiver compatible with the long term evolution (LTE) method, and the cutoff frequency calibration circuit 2 and the Q-factor calibration circuit 3 for setting the frequency characteristic of the filter circuit 1.

FIG. 28 is a diagram illustrating another configuration of a semiconductor integrated circuit according to an eighth embodiment of the present invention, including the filter circuit 1 as a channel selection filter for the direct conversion multimode receiver compatible with the long term evolution (LTE) method, and the cutoff frequency calibration circuit 2 and the Q-factor calibration circuit 3 for setting the frequency characteristic of the filter circuit 1.

The semiconductor integrated circuit according to the eighth embodiment of the invention illustrated in FIG. 28 differs from that according to the second embodiment of the invention illustrated in FIG. 13 with respect to the following point.

Specifically, the Q-factor calibration circuit 3 of the semiconductor integrated circuit according to the first embodiment of the invention illustrated in FIG. 13 uses, as each of the operational amplifier OP1 in the first stage and the operational amplifier OP2 in the second stage, an operational amplifier of a single-end output type having a single output terminal. In contrast, in the Q-factor calibration circuit 3 of the semiconductor integrated circuit according to the eighth embodiment of the invention illustrated in FIG. 28, a complete differential operational amplifier having a differential input terminal made of a non-inversion input terminal and an inversion input terminal and a differential output terminal made of a non-inversion output terminal and an inversion output terminal is used as each of the operational amplifier OP1 in the first stage and the operational amplifier OP2 in the second stage illustrated in FIG. 13. In this case, the signal inverter INV configured by the input resistor R4, the operational amplifier OP3, and the feedback resistor R4 is not provided. Instead, two feedback resistors R4 are coupled between the differential input terminal of the operational amplifier OP1 in the first stage and the differential output terminal of the operational amplifier OP2 in the second stage. As an output amplitude supplied to the amplitude comparator 50, a non-inversion output signal (positive output) as one of differential output signals of the operational amplifier OP2 in the second stage is supplied.

Further, to cancel a DC offset as a problem in the differential amplifier having high gain, a DC offset cancelling circuit and the Q-factor calibration circuit 3 are commonly used. A DC offset set value DOS by which DC voltages at both the positive and negative outputs as differential outputs of the operational amplifier OP2 in the second stage is stored in the register 54. By reading the set value DOS, the DC offset cancellation signal is generated. A switch SW100 capable of switching between the Q-factor adjustment input signal and the DC offset cancellation signal is disposed to select an arbitrary one of the Q-factor adjustment input signal and the DC offset cancellation signal. As a result, the selected arbitrary signal is supplied to the inversion input terminal of the operational amplifier OP1 in the first stage via the resistor R1. Further, a change-over switch SW600 coupled to the amplitude comparator 50 can be coupled to the non-inversion output signal (positive output) as one of differential output signals of the operational amplifier OP2 in the second stage. The input change-over switch SW10 can switch to supply differential input signals (positive and negative input signals) or common mode voltage Vc to the non-inversion input terminal and the inversion input terminal of the operational amplifier OP1 in the first stage.

In the Q-factor compensating operation, the switch SW100 is controlled to select the Q-factor adjustment input signal. Further, the input change-over switch SW10 is controlled to supply the differential input signals (positive and negative input signals) to the non-inversion input terminal and the inversion input terminal of the operational amplifier OP1 in the first stage during the period of the Q-factor compensating operation. Since the Q-factor compensating operation of the semiconductor integrated circuit according to the eighth embodiment of the invention illustrated in FIG. 28 is similar to that of the second embodiment of the invention illustrated in FIG. 19 except for the control on the switch SW100 and the input change-over switch SW10, its description will not be given.

The DC offset cancelling operation is executed after completion of the Q-factor compensating operation in order to cancel the influence of the fluctuation amount of the DC offset caused by the Q-factor compensating operation. In the DC offset cancelling operation, the switch SW600 is controlled to supply the inversion output signal (negative output) as the other one of the differential output signals of the operational amplifier OP2 in the second stage to the amplitude comparator 50. The input change-over switch SW10 is controlled to select the differential input signals (positive and negative inputs) so that the DC offset included in the differential input signals (positive and negative inputs) is supplied to the non-inversion input terminal and the inversion input terminal of the operational amplifier OP1 in the first stage.

The switch SW100 is controlled so that the DC offset cancellation signal from the control circuit 51 is supplied to the inversion input terminal of the operational amplifier OP1 in the first stage. The DC offset cancelling operation of the semiconductor integrated circuit according to the eighth embodiment of the invention illustrated in FIG. 28 can be executed by an operation sequence which is almost the same as the input signal compensating operation in the second embodiment of the invention illustrated in FIG. 13 except for the change-over switch SW10 and the switches SW600 and SW100. That is, the DC offset set value DOS by which the DC voltages as both positive and negative outputs as the differential outputs of the operational amplifier OP2 in the second stage coincide with each other is stored in the register 54.

In the case of receiving a desired RF reception signal after completion of the DC offset cancelling operation, the input change-over switch SW10 and the switch SW100 are controlled in a manner similar to the control in the DC offset cancelling operation. In response to the set value DOS stored in the register 54, the DC offset cancellation signal from the control circuit 51 is adjusted to a value by which the DC off set voltage between the positive and negative outputs as the differential outputs of the operational amplifier OP2 in the second stage is cancelled, and the adjusted signal is output. Further, in the semiconductor integrated circuit according to the eighth embodiment of the invention illustrated in FIG. 28, in a manner similar to the second embodiment of the invention illustrated in FIG. 13, the frequency characteristic can be calibrated by the Q-factor compensating operation using the Q-factor adjustment input signal.

As described above, in the semiconductor integrated circuit according to the eighth embodiment of the invention illustrated in FIG. 28, the DC offset cancellation circuit and the Q-factor calibration circuit 3 can be shared.

Figure 29:
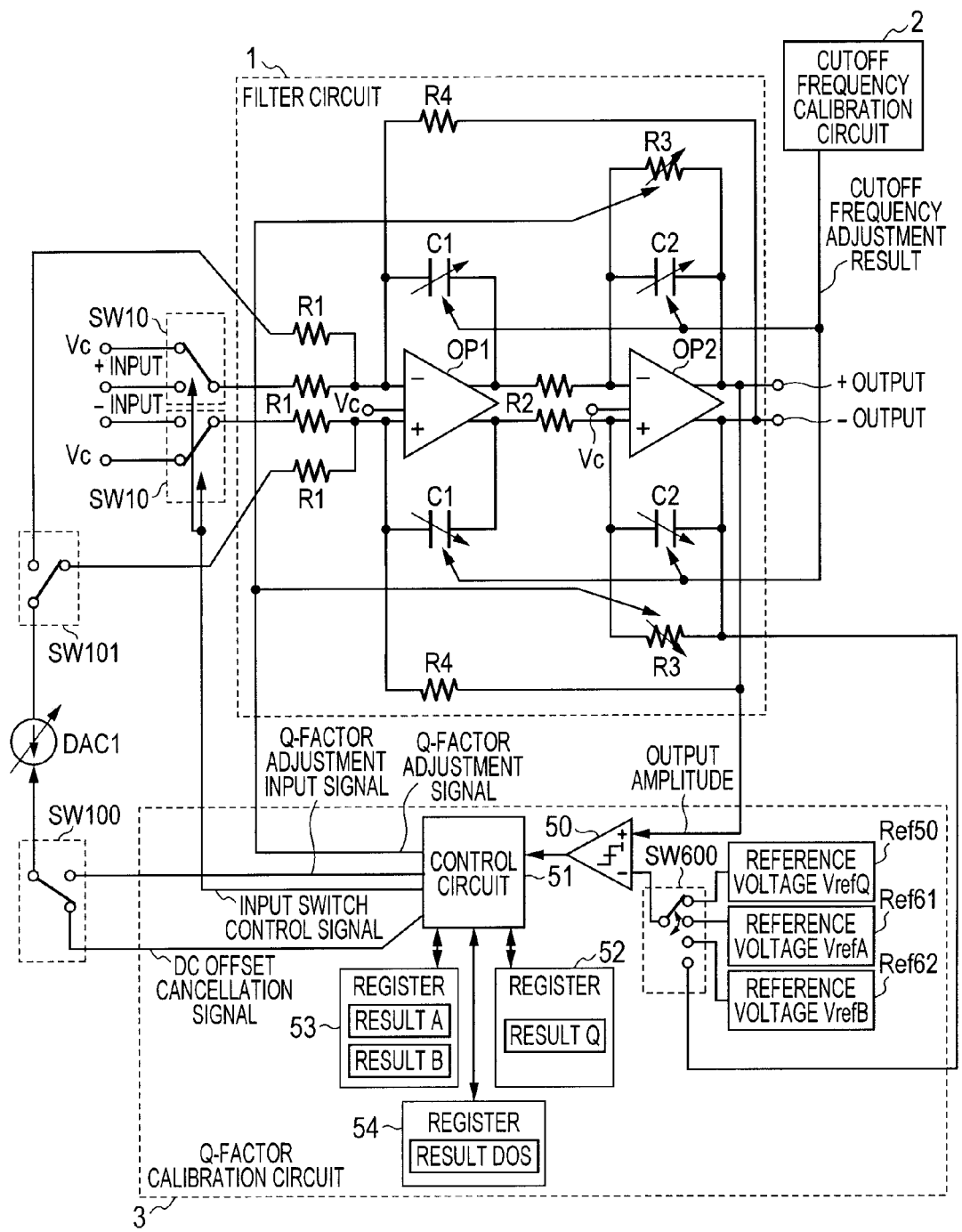
FIG. 29 is a diagram illustrating another configuration of a semiconductor integrated circuit according to the eighth embodiment of the present invention, including the filter circuit 1 as a channel selection filter for the direct conversion multimode receiver compatible with the long term evolution (LTE) method, and the cutoff frequency calibration circuit 2 and the Q-factor calibration circuit 3 for setting the frequency characteristic of the filter circuit 1.

By setting the Q-factor adjustment input signal and the DC offset cancellation signal as digital values and using the digital-analog converter for generating output current responding to the digital values, the Q-factor adjustment input signal and the DC offset cancellation signal which are digital-analog converted can be used. FIG. 29 concretely illustrates this example.

FIG. 29 is a diagram illustrating another configuration of a semiconductor integrated circuit according to the eighth embodiment of the present invention, including the filter circuit 1 as a channel selection filter for the direct conversion multimode receiver compatible with the long term evolution (LTE) method, and the cutoff frequency calibration circuit 2 and the Q-factor calibration circuit 3 for setting the frequency characteristic of the filter circuit 1.

The semiconductor integrated circuit according to the eighth embodiment of the invention illustrated in FIG. 29 is different from that according to the eighth embodiment of the invention illustrated in FIG. 28 with respect to the following point.

In the semiconductor integrated circuit according to the eighth embodiment of the invention illustrated in FIG. 29, the Q-factor adjustment input signal and the DC offset cancellation signal are set as digital values, and a digital-to-analog converter DAC1 for generating analog output current responding to a digital value is used. A switch SW101 is used to select the non-inversion input terminal or the inversion input terminal to which the analog output current of the digital-to-analog converter DAC1 flows. The switch SW101 is controlled to couple the analog output terminal of the digital-to-analog converter DAC1 to one of the non-inversion input terminal and the inversion input terminal of the operational amplifier OP1 in the first stage via a resistor R1. The digital-to-analog converter DAC1 is of a type of extracting analog output current. Consequently, at the time of adjusting the positive amplitude Vpk1+ of the Q-factor adjustment input signal and at the time of applying a set result A as the adjustment result, the switch SW101 is controlled so that the analog output terminal of the digital-to-analog converter DAC1 is coupled to the non-inversion input terminal of the operational amplifier OP1. On the other hand, at the time of adjusting the negative amplitude Vpk1− of the Q-factor adjustment input signal and at the time of applying a set result B as the adjustment result, the switch SW101 is controlled so that the analog output terminal of the digital-to-analog converter DAC1 is coupled to the inversion input terminal of the operational amplifier OP1.

In the DC offset cancelling operation, in the case where it is determined that DC voltage of the non-inversion output terminal (positive output) is larger than DC voltage of the inversion output terminal (negative output) at the differential output terminal of the operational amplifier OP2 in a state where no DC offset cancellation signal is generated by control of the amplitude comparator 50, the switch SW101 is controlled to couple the analog output terminal of the digital-to-analog converter DAC1 to the non-inversion input terminal of the operational amplifier OP1. On the other hand, in the case where it is determined that DC voltage of the non-inversion output terminal (positive output) is smaller than DC voltage of the inversion output terminal (negative output) at the differential output terminal of the operational amplifier OP2 in a state where no DC offset cancellation signal is generated by control of the amplitude comparator 50, the switch SW101 is controlled to couple the analog output terminal of the digital-to-analog converter DAC1 to the inversion input terminal of the operational amplifier OP1.

As described above, in the semiconductor integrated circuit according to the eighth embodiment of the invention illustrated in FIG. 29, the digital-to-analog converter DAC1 of the type of extracting analog output current can be used for the Q-factor compensating operation and the DC offset cancelling operation. In other words, analog output current of the pull type can generate only voltage which changes in the negative direction. As described above, even the digital-analog converter which can generate only the analog voltage which changes in a single direction is used, the Q-factor compensating operation and the DC offset cancelling operation can be performed. The digital-analog converter DAC1 of the type of taking analog output current has a circuit configuration simpler than that of a digital-analog converter of a type capable of passing and taking analog output current, so that the semiconductor chip area can be reduced. In the case of using only a digital-to-analog converter of a type of passing analog output current, it is sufficient to perform the control of the switch SW101 in the case of the digital-to-analog converter of the type of taking analog output current in an opposite way.

Although the present invention achieved by the inventors herein has been concretely described on the basis of various embodiments, obviously, the invention is not limited to the embodiments but can be variously changed without departing from the gist.

For example, the filter circuit as the channel selection filter of the present invention is not limited only to the active RC low-pass filter using the operational amplifiers OP1 and OP2, the resistors R1, R2, R3, and R4, and the capacitors C1 and C2 as illustrated in FIG. 2. The filter circuit 1 can be configured in a manner such that an imperfect integrator is used in the first stage, and a perfect integrator is used in the second stage. In this case as well, the electric characteristics from the equation (5) to the equation (13) can be realized.

A GmC filter using an operational transconductance amplifier (OTA) having the function of converting input voltage as a resistance component to output current can be also used. Since transconductance Gm of the operational transconductance amplifier (OTA) is given by output current Iout/input voltage Vin, it is the inverse of resistance. The transconductance Gm as a conversion factor of input voltage/output current of the operational transconductance amplifier (OTA) can be adjusted by changing the bias current of the operational transconductance amplifier (OTA). Therefore, the Q-factor compensating operation of the invention n the GmC filter can be executed by changing the bias current of the operational transconductance amplifier (OTA). Further, the cutoff compensating operation of the invention in the GmC filter can be adjusted by changing the capacitance value of a capacitor coupled between the output terminal and the ground terminal of the GmC filter. The GmC filter can be used in both of an operational transconductance amplifier (OTA) of a single-end input and single-end output type and an operational transconductance amplifier (OTA) of a complete differential type having a differential input terminal and a differential output terminal.

The present invention is not limited only to the channel selection filter of the multimode receiver compatible with the long term evolution (LTE) standard. Specifically, since a calibration signal, a correction signal, and the like closely related to a communication system are not used, the invention can be also applied to, for example, a channel selection filter for a dual-mode receiver compatible with GSM and the multimode system but also other wireless LANs. The present invention can be also applied to the channel selection filter in optical communications, TV communications, and the like.

What is claimed is:

1. A semiconductor integrated circuit comprising:
    a filter circuit;
    a cutoff frequency calibration circuit which gives a cutoff frequency adjustment result as a signal for adjusting cutoff frequency of the filter circuit to the filter circuit; and
    a Q-factor calibration circuit which gives a Q-factor adjustment signal as a signal for adjusting a Q factor of the filter circuit to the filter circuit on the basis of an output of the filter circuit,
    wherein the cutoff frequency calibration circuit can adjust the cutoff frequency of the filter circuit to a desired value by adjusting a capacitance component of the filter circuit, and
    wherein, after adjustment of the cutoff frequency of the filter circuit by the cutoff frequency calibration circuit, the Q-factor calibration circuit can adjust the Q factor of the filter circuit to a desired value by adjusting, a resistance component of the filter circuit,
    wherein the filter circuit is a low-pass filter which outputs a signal of a result of cutting off a component of a frequency higher than a predetermined frequency from an input signal, and
    wherein the cutoff frequency calibration circuit detects an error of the capacitance component by time integration using at least any one of charging and discharging of the capacitance component of the low-pass filter and, on the basis of a detection result of the error, can compensate the error of the capacitance component.

2. The semiconductor integrated circuit according to claim 1,
    wherein the Q-factor calibration circuit includes a reference voltage generator, an amplitude comparator, and a control register,
    wherein the reference voltage generator generates a reference voltage for determining amplitude of an output signal of an output terminal of the low-pass filter,
    wherein the amplitude comparator compares the reference voltage generated by the reference voltage generator and the amplitude of the output signal of the low-pass filter,
    wherein the control register stores Q-factor control information which adjusts the resistance component of the low-pass filter,
    wherein, in the case where the amplitude comparator determines that the amplitude of the output signal of the low-pass filter is larger than the reference voltage generated by the reference voltage generator, the value of the Q-factor control information is changed to decrease the amplitude of the output signal of the low-pass filter, and
    wherein, in the case where the amplitude comparator determines that the amplitude of the output signal of the low-pass filter is smaller than the reference voltage generated by the reference voltage generator, the value of the Q-factor control information is changed to increase the amplitude of the output signal of the low-pass filter.

3. The semiconductor integrated circuit according to claim 2,
    wherein the Q-factor calibration circuit generates an adjustment input signal which is set to a predetermined voltage level in a period sufficiently longer than a cycle of cutoff frequency of the low-pass filter of the desired value and supplies the adjustment input signal to an input terminal of the low-pass filter, and
    wherein the low-pass filter substantially DC-responds to the adjustment input signal, and the Q-factor calibration circuit can cancel off a fluctuation in a direct-current gain of the low-pass filter by a voltage change in the adjustment input signal so that the voltage of a DC-response output signal generated at the output terminal of the low-pass filter matches a predetermined reference level.

4. The semiconductor integrated circuit according to claim 2,
    wherein the low-pass filter is a Sallen-key low-pass filter.

5. The semiconductor integrated circuit according to claim 2,
    wherein the low-pass filter is an active low-pass filter including a plurality of operational amplifiers which are cascade coupled.

6. The semiconductor integrated circuit according to claim 2,
    wherein the low-pass filter includes a plurality of low-pass filters which are cascade coupled.

7. The semiconductor integrated circuit according to claim 2, further comprising:
    a direct downconversion receiver including a low-noise amplifier;
    a reception mixer;
    an RF oscillator; and
    a channel selection filter,
    wherein the channel selection filter is the low-pass filter,
    wherein the cutoff frequency calibration circuit can adjust the cutoff frequency of the low-pass filter to the desired value by adjusting the capacitance component of the low-pass filter configured as the channel selection filter, and wherein the Q-factor calibration circuit can adjust the Q factor of the low-pass filter to the desired value by adjusting the resistance component of the low-pass filter after the adjustment of the cutoff frequency of the low-pass filter by the cutoff frequency calibration circuit.

8. The semiconductor integrated circuit according to claim 7, wherein the direct downconversion receiver is compatible with a long term evolution standard.

9. The semiconductor integrated circuit according to claim 7, wherein the direct downconversion receiver is compatible with a multi-input multi-output communication system and diversity reception.

10. An operation method of a semiconductor integrated circuit comprising:

a filter circuit;

a cutoff frequency calibration circuit which gives a cutoff frequency adjustment result as a signal for adjusting cutoff frequency of the filter circuit to the filter circuit; and a Q-factor calibration circuit which gives a Q-factor adjustment signal as a signal for adjusting a Q factor of the filter circuit to the filter circuit on the basis of an output of the filter circuit, the method comprising the steps of:

adjusting the cutoff frequency of the filter circuit to a desired value by adjusting a capacitance component of the filter circuit by using the cutoff frequency calibration circuit; and after the step of adjusting the cutoff frequency of the filter circuit by using the cutoff frequency calibration circuit, adjusting the Q factor of the filter circuit to a desired value by adjusting a resistance component of the filter circuit by using the Q-factor calibration circuit, wherein the filter circuit is a low-pass filter which outputs a signal of a result of cutting off a component of a frequency higher than a predetermined frequency from an input signal, and wherein the cutoff frequency calibration circuit detects an error of the capacitance component by time integration using at least one of charging and discharging of the capacitance component of the low-pass filter and, on the basis of a result of detection of the error, can compensate the error of the capacitance component.

11. The operation method of the semiconductor integrated circuit according to claim 10, wherein the Q-factor calibration circuit includes a reference voltage generator, an amplitude comparator, and a control register, wherein the reference voltage generator generates a reference voltage for determining amplitude of an output signal of an output terminal of the low-pass filter, wherein the amplitude comparator compares the reference voltage generated by the reference voltage generator and the amplitude of the output signal of the low-pass filter, wherein the control register stores Q-factor control information which adjusts the resistance component of the low-pass filter, wherein, in the case where the amplitude comparator determines that the amplitude of the output signal of the low-pass filter is larger than the reference voltage generated by the reference voltage generator, the value of the Q-factor control information is changed to decrease the amplitude of the output signal of the low-pass filter, and wherein, in the case where the amplitude comparator determines that the amplitude of the output signal of the low-pass filter is smaller than the reference voltage generated by the reference voltage generator, the value of the Q-factor control information is changed to increase the amplitude of the output signal of the low-pass filter.

12. The operation method of the semiconductor integrated circuit according to claim 11, wherein the Q-factor calibration circuit generates an adjustment input signal which is set to a predetermined voltage level in a period sufficiently longer than a cycle of cutoff frequency of the low-pass filter of the desired value and supplies the adjustment input signal to an input terminal of the low-pass filter, and wherein the low-pass filter substantially DC-responds to the adjustment input signal, and the Q-factor calibration circuit can cancel off a fluctuation in a direct-current gain of the low-pass filter by a voltage change in the adjustment input signal so that the voltage of a DC-response output signal generated at the output terminal of the low-pass filter matches a predetermined reference level.

13. The operation method of the semiconductor integrated circuit according to claim 11, wherein the low-pass filter is a Sallen-key low-pass filter.

14. The operation method of the semiconductor integrated circuit according to claim 11, wherein the low-pass filter is an active low-pass filter including a plurality of operational amplifiers which are cascade coupled.

15. The operation method of the semiconductor integrated circuit according to claim 11, wherein the low-pass filter includes a plurality of low-pass filters which are cascade coupled.

16. The operation method of the semiconductor integrated circuit according to claim 11, the semiconductor integrated circuit further comprising:

a direct downconversion receiver including a low-noise amplifier;

a reception mixer;

an RF oscillator; and a channel selection filter, wherein the channel selection filter is the low-pass filter, wherein the cutoff frequency calibration circuit can adjust the cutoff frequency of the low-pass filter to the desired value by adjusting the capacitance component of the low-pass filter configured as the channel selection filter, and wherein the Q-factor calibration circuit can adjust the Q factor of the low-pass filter to the desired value by adjusting the resistance component of the low-pass filter after the adjustment of the cutoff frequency of the low-pass filter by the cutoff frequency calibration circuit.

17. The operation method of the semiconductor integrated circuit according to claim 16, wherein the direct downconversion receiver is compatible with a long term evolution standard.

18. The operation method of the semiconductor integrated circuit according to claim 16, wherein the direct downconversion receiver is compatible with a multi-input multi-output communication system and diversity reception.

* * * * *